(12) United States Patent
Kim et al.

(10) Patent No.: US 12,004,364 B2
(45) Date of Patent: Jun. 4, 2024

(54) LIGHT-EMITTING DEVICE AND APPARATUS INCLUDING SAME

(71) Applicant: Samsung Display Co., LTD., Yongin-si (KR)

(72) Inventors: Dongchan Kim, Yongin-si (KR); Jiyoung Moon, Yongin-si (KR); Heechang Yoon, Yongin-si (KR); Jihye Lee, Yongin-si (KR); Hakchoong Lee, Yongin-si (KR); Haemyeong Lee, Yongin-si (KR); Myungsuk Han, Yongin-si (KR); Jihwan Yoon, Yongin-si (KR); Jonghyuk Lee, Yongin-si (KR); Yoonhyeung Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/218,563

(22) Filed: Jul. 5, 2023

(65) Prior Publication Data

US 2023/0354635 A1     Nov. 2, 2023

Related U.S. Application Data

(63) Continuation of application No. 17/226,231, filed on Apr. 9, 2021, now Pat. No. 11,744,100.

(30) Foreign Application Priority Data

Apr. 9, 2020  (KR) .................. 10-2020-0043603
Jan. 28, 2021 (KR) .................. 10-2021-0012657

(51) Int. Cl.
*H10K 50/17*     (2023.01)
*H10K 50/15*     (2023.01)
(Continued)

(52) U.S. Cl.
CPC .......... *H10K 50/171* (2023.02); *H10K 50/15* (2023.02); *H10K 50/16* (2023.02); *H10K 59/12* (2023.02); *H10K 59/40* (2023.02)

(58) Field of Classification Search
CPC .... H10K 50/171; H10K 50/16; H10K 50/165; H10K 50/19; H10K 50/17; H10K 50/15;
(Continued)

(56) References Cited

U.S. PATENT DOCUMENTS 6,893,744 B2     5/2005  Kim et al.
8,563,144 B2    10/2013  Kim et al.
(Continued)

FOREIGN PATENT DOCUMENTS

JP        5461787            4/2014
KR   10-2008-0056567         6/2008
(Continued)

OTHER PUBLICATIONS

Notice of Allowance issued May 9, 2023, in U.S. Appl. No. 17/226,231.

*Primary Examiner* — Anne M Hines
*Assistant Examiner* — Jose M Diaz
(74) *Attorney, Agent, or Firm* — H.C. Park & Associates, PLC

(57) ABSTRACT

A light-emitting device and an apparatus including the same include a first electrode, a second electrode facing the first electrode; and an organic layer between the first electrode and the second electrode, wherein the organic layer includes m emission units and (m-1) charge generating units, each of the charge generating units being between the emission units that are adjacent to each other, m is a natural number of 2 or greater, at least one of the (m-1) charge generating units includes an n-type charge generating layer, a p-type charge generating layer, and a p-type hole injection layer, wherein (Continued)

the n-type charge generating layer includes an n-type organic compound and a metal material, and wherein the p-type charge generating layer and the p-type hole injection layer each independently include an inorganic semiconductor material.

17 Claims, 4 Drawing Sheets

(51) Int. Cl.
*H10K 50/16* (2023.01)
*H10K 59/12* (2023.01)
*H10K 59/40* (2023.01)

(58) Field of Classification Search
CPC ...... H10K 59/12; H10K 59/40; H10K 59/123; H10K 59/58; H10K 85/631; H10K 85/654; H10K 85/6572; H10K 85/324; H10K 85/342; H10K 85/326; H10K 85/615; H10K 85/622; H10K 85/623; H10K 85/624; H10K 85/657; H10K 85/6574; H10K 85/6576; H10K 85/626; H10K 50/131; H01L 51/5044

See application file for complete search history.

(56) References Cited

U.S. PATENT DOCUMENTS

| | | |
|---|---|---|
| 8,628,369 B2 | 1/2014 | Lee et al. |
| 10,396,296 B2 | 4/2019 | Ko |
| 2009/0001878 A1 | 1/2009 | Qiu et al. |
| 2016/0308135 A1 | 10/2016 | Forrest et al. |
| 2019/0198797 A1 | 6/2019 | Seo et al. |
| 2019/0288212 A1 | 9/2019 | Cho et al. |
| 2020/0259045 A1* | 8/2020 | Kim ................. H01L 33/06 |
| 2020/0295292 A1 | 9/2020 | Kim et al. |

FOREIGN PATENT DOCUMENTS

| | | |
|---|---|---|
| KR | 10-2010-0011597 | 2/2010 |
| KR | 10-2010-0011598 | 2/2010 |
| KR | 10-2017-0106564 | 9/2017 |
| KR | 10-2018-0007735 | 1/2018 |
| KR | 10-2019-0003677 | 1/2019 |
| KR | 10-2019-0053563 | 5/2019 |
| KR | 10-2019-0076088 | 7/2019 |
| KR | 10-2019-0108217 | 9/2019 |

* cited by examiner

LIGHT-EMITTING DEVICE AND APPARATUS INCLUDING SAME

CROSS-REFERENCE TO RELATED APPLICATIONS

This application is a Continuation of U.S. patent application Ser. No. 17/226,231, filed Apr. 9, 2021, which claims priority from and the benefit of Korean Patent Application No. 10-2020-0043603, filed on Apr. 9, 2020 and Korean Patent Application No. 10-2021-0012657, filed on Jan. 28, 2021, each of which are hereby incorporated by reference for all purposes as if fully set forth herein.

BACKGROUND

Field

One or more embodiments relate to a light-emitting device and a device including the light-emitting device.

Discussion of the Background

Light-emitting devices are devices that convert electrical energy into light energy. Examples of such light-emitting devices include organic light-emitting devices using organic materials for an emission layer, quantum dot light-emitting devices using quantum dots for an emission layer, and the like.

Light-emitting devices may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit from an excited state to a ground state to thereby generate light.

The above information disclosed in this Background section is only for understanding of the background of the inventive concepts, and, therefore, it may contain information that does not constitute prior art.

SUMMARY

One or more embodiments relate to a tandem light-emitting device having a low driving voltage and excellent efficiency and lifespan characteristics by balance optimization of holes and electrons and an apparatus including the tandem light-emitting device.

Additional aspects will be set forth in part in the description which follows and, in part, will be apparent from the description, or may be learned by practice of the presented embodiments of the disclosure.

According to one or more embodiments, a light-emitting device may include a first electrode, a second electrode facing the first electrode, and an organic layer between the first electrode and the second electrode, wherein the organic layer may include m emission units and (m−1) charge generating units, each of the charge generating units being between the emission units that are adjacent to each other, m may be a natural number of 2 or greater, at least one of the (m−1) charge generating units may include an n-type charge generating layer, a p-type charge generating layer, and a p-type hole injection layer, the n-type charge generating layer may include an n-type organic compound and a metal material, and the p-type charge generating layer and the p-type hole injection layer may each independently include an inorganic semiconductor material.

According to one or more embodiments, an apparatus may include a thin-film transistor including a source electrode, a drain electrode, and an active layer, and the light-emitting device, wherein a first electrode of the light-emitting device may be electrically connected to any one of the source electrode and the drain electrode of the thin-film transistor.

It is to be understood that both the foregoing general description and the following detailed description are exemplary illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary illustrative embodiments of the invention, and together with the description serve to explain the inventive concepts.

DETAILED DESCRIPTION

Figure 1:
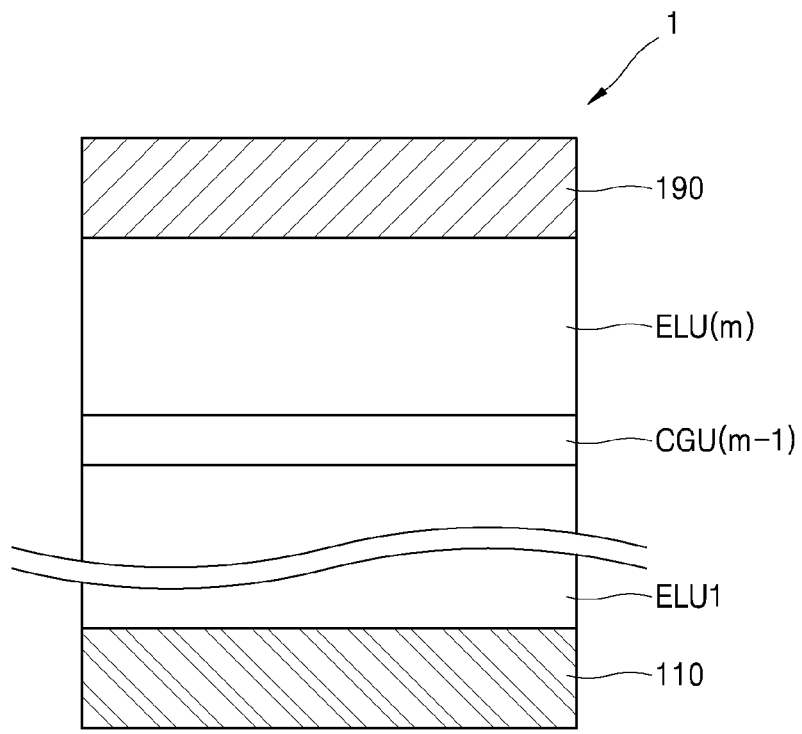
FIG. 1 is a schematic cross-sectional view illustrating a light-emitting device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are illustrated in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Reference will be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the inventive concept allows for various changes and numerous embodiments, particular embodiments will be illustrated in the drawings and described in detail in the written description. Effects, features, and a method of achieving the inventive concept will be obvious by referring to example embodiments of the inventive concept with reference to the attached drawings. The inventive concept may, however, be embodied in many different forms and should not be construed as being limited to the embodiments set forth herein.

Hereinafter, the inventive concept will be described in detail by explaining example embodiments of the inventive concept with reference to the attached drawings. Like reference numerals in the drawings denote like elements, and thus their description will be omitted.

It will be understood that, although the terms first, second, etc. may be used herein to describe various elements, these elements should not be limited by these terms. These terms are only used to distinguish one element from another.

In the embodiments described in the present specification, an expression used in the singular encompasses the expression of the plural, unless it has a different meaning in the context.

In the present specification, it is to be understood that the terms such as "including," "having," and "comprising" are intended to indicate the existence of the features or components disclosed in the specification, and are not intended to preclude the possibility that one or more other features or components may exist or may be added.

It will be understood that when a layer, region, or component is referred to as being "on" or "onto" another layer, region, or component, it may be directly or indirectly formed over the other layer, region, or component. That is, for example, intervening layers, regions, or components may be present.

Sizes of components in the drawings may be exaggerated for convenience of explanation. In other words, because sizes and thicknesses of components in the drawings are arbitrarily illustrated for convenience of explanation, the following embodiments are not limited thereto.

It will be understood that when a layer, region, or component is referred to as being "connected to" another layer, region, or component, the layer, region, or component may be directly connected to the another layer, region, or component, or indirectly connected to the another layer, region, or component as intervening layer, region, or component is present. For example, it will be understood that when a layer, region, or component is referred to as being "electrically connected to" another layer, region, or component, the layer, region, or component may be directly electrically connected to the another layer, region, or component, or indirectly electrically connected to the another layer, region, or component as interventing layer, region, or component is present.

As used herein, the expression the "(organic layer) includes a compound represented by Formula 1" may be construed as meaning the "(organic layer) may include one compound that is represented by Formula 1 or two different compounds that are represented by Formula 1".

In the present specification, the term "Group" refers to a group on the IUPAC Periodic Table of Elements.

In the present specification, the term "alkali metal" refers to a Group 1 element. In detail, an alkali metal may be lithium (Li), sodium (Na), potassium (K), rubidium (Rb), or cesium (Cs).

In the present specification, the term "alkali earth metal" refers to a Group 2 element. In detail, an alkaline earth metal may be magnesium (Mg), calcium (Ca), strontium (Sr), or barium (Ba).

In the present specification, the term "lanthanide metal" refers to the lanthanide or a lanthanoid series of elements. In detail, a lanthanide metal may be lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu).

In the present specification, the term "transition metal" refers to an element belonging to Periods 4 to 7 and Groups 3 to 12. In detail, a transition metal may be titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), zinc (Zn), or cadmium (Cd).

In the present specification, the term "post-transition metal" refers to an element belonging to Periods 3 to 7 and Groups 13 to 17. In detail, a post-transition metal may be aluminum (Al), gallium (Ga), indium (In), thallium (Tl), tin (Sn), lead (Pb), bismuth (Bi), or polonium (Po).

In the present specification, the term "halogen" refers to a Group 17 element. In detail, halogen may be fluorine (F), chlorine (Cl), bromine (Br), or iodine (I).

In the present specification, the term "inorganic semiconductor material" refers to a material that is an inorganic material and has a band gap less than 4 electron volts (eV). In detail, the inorganic semiconductor material may include a post-transition metal, a halide of a lanthanide metal, a halide of a transition metal, a halide of a post-transition metal, bismuth, tellurium, a telluride of a lanthanide metal, a telluride of a transition metal, a telluride of a post-transition metal, a sulfide of a lanthanide metal, a sulfide of a transition metal, a sulfide of a post-transition metal, a selenide of a lanthanide metal, a selenide of a transition metal, a selenide of a post-transition metal, or any combination thereof. In detail, the inorganic semiconductor material may be $EuI_2$, $YbI_2$, $SmI_2$, $TmI_2$, $AgI$, $CuI$, $NiI_2$, $CoI_2$, $BiF_3$, $BiCl_3$, $BiBr_3$, $BiI_3$, $PbI_2$, $SnI_2$, $Bi$, $Te$, $EuTe$, $YbTe$, $SmTe$, $TmTe$, $EuSe$, $YbSe$, $SmSe$, $TmSe$, $ZnTe$, $CoTe$, $Bi_2S_3$, $Bi_2Se_3$, $ZnSe$, $CoSe$, $Bi_2Te_3$, $Bi_2Se_3$, or any combination thereof.

In the present specification, the term "inorganic insulating material" refers to a compound that is an inorganic material and has a band gap of 4 eV or higher. In detail, the inorganic insulating material may include a halide of an alkali metal, a halide of an alkaline earth metal, a halide of a lanthanide metal, or any combination thereof. In detail, the inorganic insulating material may include NaI, KI, RbI, CsI, NaCl, KCl, RbCl, CsCl, NaF, KF, RbF, CsF, $MgI_2$, $CaI_2$, $SrI_2$, $BaI_2$, $MgCl_2$, $CaCl_2$, $SrCl_2$, $BaCl_2$, $MgF_2$, $CaF_2$, $SrF_2$, $BaF_2$, $EuI_3$, $YbI_3$, $SmI_3$, $TmI_3$, $EuCl_3$, $YbCl_3$, $SmCl_3$, $TmCl_3$, $EuF_3$, $YbF_3$, $SmF_3$, $TmF_3$, or any combination thereof.

In the present specification, the term "halide of an alkali metal" refers to a compound in which an alkali metal is ion-bonded to halogen. In detail, a halide of an alkali metal may include NaI, KI, RbI, CsI, NaCl, KCl, RbCl, CsCl, NaF, KF, RbF, CsF, or any combination thereof.

In the present specification, the term "halide of an alkaline earth metal" refers to a compound in which an alkaline earth metal is ion-bonded to halogen. In detail, a halide of an alkaline earth metal may include $MgI_2$, $CaI_2$, $SrI_2$, $BaI_2$, $MgCl_2$, $CaCl_2$, $SrCl_2$, $BaCl_2$, $MgF_2$, $CaF_2$, $SrF_2$, $BaF_2$, or any combination thereof.

In the present specification, the term "halide of a lanthanide metal" refers to a compound in which a lanthanide metal is ion-bonded and/or covalent-bonded to halogen. In detail, a halide of a lanthanide metal may include $EuI_2$, $YbI_2$, $SmI_2$, $TmI_2$, $EuI_3$, $YbI_3$, $SmI_3$, $TmI_3$, $EuCl_3$, $YbCl_3$, $SmCl_3$, $TmCl_3$, $EuF_3$, $YbF_3$, $SmF_3$, $TmF_3$, or any combination thereof.

In the present specification, the term "halide of a transition metal" refers to a compound in which a transition metal is ion-bonded and/or covalent-bonded to halogen. In detail, a halide of a transition metal may include AgI, CuI, $NiI_2$, $CoI_2$, or any combination thereof.

In the present specification, the term "halide of a post-transition metal" refers to a compound in which a post-transition metal is ion-bonded and/or covalent-bonded to halogen. In detail, a halide of a post-transition metal may include $BiI_3$, $PbI_2$, $SnI_2$, or any combination thereof.

In the present specification, the term "telluride of a lanthanide metal" refers to a compound in which a lanthanide metal is ion-bonded, covalent-bonded, and/or metal-bonded to tellurium (Te). In detail, a telluride of a lanthanide metal may include EuTe, YbTe, SmTe, TmTe, or any combination thereof.

In the present specification, the term "telluride of a transition metal" refers to a compound in which a transition metal is ion-bonded, covalent-bonded, and/or metal-bonded to tellurium (Te). In detail, a telluride of a transition metal may include ZnTe, CoTe, or any combination thereof.

In the present specification, the term "telluride of a post-transition metal" refers to a compound in which a post-transition metal is ion-bonded, covalent-bonded, and/or metal-bonded to tellurium (Te). In detail, a telluride of a post-transition metal may include $Bi_2Te_3$.

In the present specification, the term "sulfide of a lanthanide metal" refers to a compound in which a lanthanide metal is ion-bonded, covalent-bonded, and/or metal-bonded to sulfur (S). In detail, a sulfide of a lanthanide metal may include EuS, YbS, SmS, TmS, or any combination thereof.

In the present specification, the term "sulfide of a transition metal" refers to a compound in which a transition metal is ion-bonded, covalent-bonded, and/or metal-bonded to sulfur (S). In detail, a sulfide of a transition metal may include ZnS, CoS, or any combination thereof.

In the present specification, the term "sulfide of a post-transition metal" refers to a compound in which a post-transition metal is ion-bonded, covalent-bonded, and/or metal-bonded to sulfur (S). In detail, a sulfide of a post-transition metal may include $Bi_2S_3$.

In the present specification, the term "selenide of a lanthanide metal" refers to a compound in which a lanthanide metal is ion-bonded, covalent-bonded, and/or metal-bonded to selenium (Se). In detail, a selenide of a lanthanide metal may include EuSe, YbSe, SmSe, TmSe, or any combination thereof.

In the present specification, the term "selenide of a transition metal" refers to a compound in which a transition metal is ion-bonded, covalent-bonded, and/or metal-bonded to selenium (Se). In detail, a selenide of a transition metal may include ZnSe, CoSe, or any combination thereof.

In the present specification, the term "selenide of a post-transition metal" refers to a compound in which a post-transition metal is ion-bonded, covalent-bonded, and/or metal-bonded to selenium (Se). In detail, a selenide of a post-transition metal may include $Bi_2Se_3$.

According to an embodiment, a light-emitting device may include a first electrode; a second electrode facing the first electrode; and an organic layer between the first electrode and the second electrode, wherein the organic layer may include m emission units and (m−1) charge generating units, each of the charge generating units being between the emission units that are adjacent to each other, m may be a natural number of 2 or greater, At least one of the (m−1) charge generating units may include an n-type charge generating layer, a p-type charge generating layer, and a p-type hole injection layer, The n-type charge generating layer may include an n-type organic compound and a metal material, and The p-type charge generating layer and the p-type hole injection layer may each independently include an inorganic semiconductor material.

In the light-emitting device, the p-type charge generating layer and the p-type hole injection layer included in the hole transporting unit may each independently include an inorganic semiconductor material. Accordingly, in the light-emitting device, charge generation and migration may be facilitated at an interface between the charge generating units, and deterioration of materials at an interface between layers may be prevented to thereby suppress an increase in driving voltage and provide improved lifespan and/or luminance.

Description of FIG. 1

FIG. 1 is a schematic cross-sectional view illustrating a light-emitting device according to an embodiment.

As illustrated in FIG. 1, a light-emitting device 1 according to an embodiment may include a first electrode 110; a second electrode 190 facing the first electrode 110; m emission units ELU(1) to ELU(m) between the first electrode 110 and the second electrode 190; and (m−1) charge generating units CGU(1) (not shown) to CGU(m−1), each of the charge generating units being between the emission units that are adjacent to each other, wherein m may be a natural number of 2 or greater, each of the emission units may include an emission layer, and at least one of the (m−1) charge generating units may include an n-type charge generating layer and a p-type charge generating layer.

Hereinafter, the light-emitting device 1 according to an embodiment will be described in connection with FIG. 1.

Features related to the first electrode are described herein.

In FIG. 1, a substrate may be additionally disposed under the first electrode 110 or above the second electrode 190. The substrate may be a glass substrate or a plastic substrate, each having excellent mechanical strength, thermal stability, transparency, surface smoothness, ease of handling, and water resistance.

The first electrode 110 may be formed by depositing or sputtering, onto the substrate, a material to form the first electrode 110. When the first electrode 110 is an anode, the material to form the first electrode 110 may be selected from materials with a high work function that facilitate hole injection.

The first electrode 110 may be a reflective electrode, a semi-transmissive electrode, or a transmissive electrode.

When the first electrode 110 is a transmissive electrode, a material to form the first electrode 110 may be selected from indium tin oxide (ITO), indium zinc oxide (IZO), tin oxide ($SnO_2$), zinc oxide (ZnO), and any combinations thereof, but embodiments are not limited thereto. In some embodiments, when the first electrode 110 is a semi-transmissive electrode or a reflective electrode, as a material to form the first electrode 110, at least one of magnesium (Mg), silver (Ag), aluminum (Al), aluminum-lithium (Al—Li), calcium (Ca), magnesium-indium (Mg—In), magnesium-silver (Mg—Ag), and any combination thereof may be used, but embodiments are not limited thereto.

The first electrode 110 may have a single-layered structure, or a multi-layered structure including two or more layers. In some embodiments, the first electrode 110 may have a triple-layered structure of ITO/Ag/ITO, but embodiments are not limited thereto.

Features related to the charge generating unit are described herein.

The light-emitting device may include (m−1) charge generating units, wherein each of the charge generating units may be between the emission units from among the m emission units that are adjacent to each other.

In some embodiments, a $(m-1)^{th}$ charge generating unit may be included between an $m^{th}$ emission unit and a $(m-1)^{th}$ emission unit.

For example, when m is 2, a first electrode, a first emission unit, a first charge generating unit, and a second emission unit may be sequentially stacked.

For example, when m is 3, a first electrode, a first emission unit, a first charge generating unit, a second emission unit, a second charge generating unit, and a third emission unit may be sequentially stacked.

For example, when m is 4, a first electrode, a first emission unit, a first charge generating unit, a second emission unit, a second charge generating unit, a third emission unit, a third charge generating unit, and a fourth emission unit may be sequentially stacked. At least one of the (m−1) charge generating units may include an n-type charge generating layer, a p-type charge generating layer, and a p-type hole injection layer.

In some embodiments, in the charge generating unit in the number of (m−1), a charge generating unit $(m-1)^{th}$ from a first electrode may be indicated as a $(m-1)^{th}$ charge generating unit.

Figure 2:
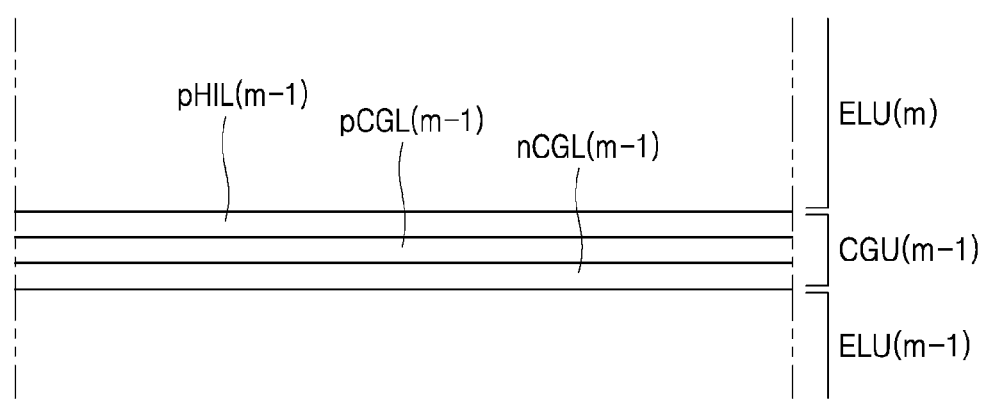
FIG. 2 is an enlarged cross-sectional view illustrating a charge generating unit shown in FIG. 1.

As illustrated in FIG. 2, a $(m-1)^{th}$ charge generating unit CGU(m−1) may include a $(m-1)^{th}$ n-type charge generating layer nCGL(m−1), a $(m-1)^{th}$ p-type charge generating layer pCGL(m−1), and a $(m-1)^{th}$ p-type hole injection layer pHIL(m−1).

In the $(m-1)^{th}$ charge generating unit CGU(m−1), the $(m-1)^{th}$ n-type charge generating layer nCGL(m−1), the $(m-1)^{th}$ p-type charge generating layer pCGL(m−1), and the $(m-1)^{th}$ p-type hole injection layer pHIL(m−1) may be stacked sequentially in this stated order.

In some embodiments, the $(m-1)^{th}$ p-type charge generating layer pCGL(m−1) may be in direct contact with the $(m-1)^{th}$ n-type charge transport layer nCGL(m−1) and the $(m-1)^{th}$ p-type hole injection layer pHIL(m−1).

In the present specification, each element included in the $(m-1)^{th}$ charge generating unit may be understood by referring to the description of each element included in the charge generating unit and not limited to the "$(m-1)^{th}$" charge generating unit. For example, description of the "$(m-1)^{th}$ n-type charge generating layer" may be understood by referring to the description of the "n-type charge generating layer".

Embodiments include an n-type charge generating layer as described herein.

The n-type charge generating layer may include an n-type organic compound and a metal material.

In some embodiments, the n-type organic compound may be a phenanthrene-based compound or a phosphine oxide-based compound.

In some embodiments, the n-type organic compound may be selected from Compounds N1, N2, and N3, and a similar phenanthroline-based compound:

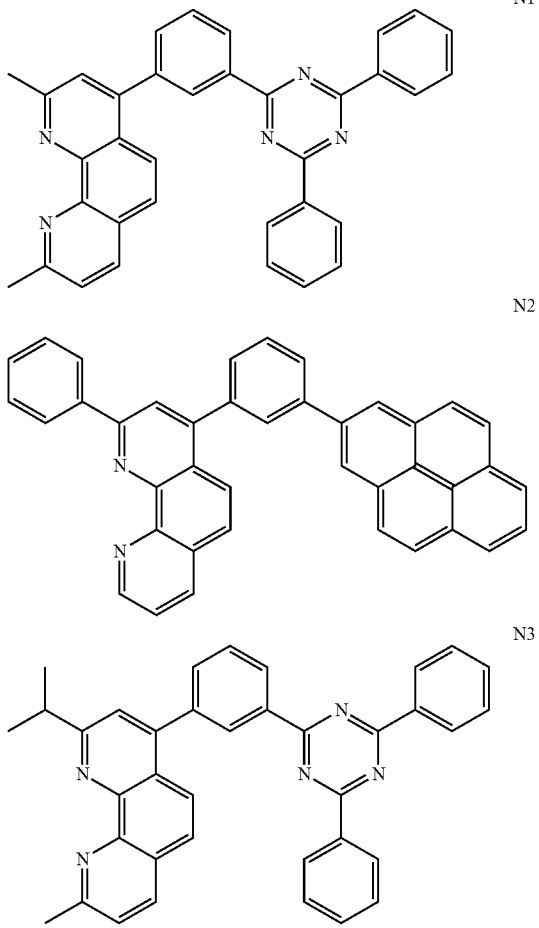

In one or more embodiments, the n-type organic compound may be understood by referring to the description of the electron transporting organic compound provided herein.

The metal material may include at least one selected from an alkali metal, an alloy of an alkali metal, an alkaline earth metal, an alloy of an alkaline earth metal, a lanthanide metal, and an alloy of a lanthanide metal.

In some embodiments, the metal material may include at least one selected from lithium (Li), sodium (Na), a Bi—Li alloy, a Bi—Na alloy, ytterbium (Yb), samarium (Sm), europium (Eu), terbium (Tb), holmium (Ho), and dysprosium (Dy).

In some embodiments, a binding energy between the n-type organic compound and the metal material included in the n-type charge generating layer may be 1.2 eV or higher, for example, 1.25 eV or higher. In some embodiments, a binding energy between the n-type organic compound and the metal material may be about 1.25 eV or higher and about 5 eV or less.

In some embodiments, a volume ratio of the n-type organic compound to the metal material included in the n-type charge generating layer may be in a range of about 99.9:0.1 to about 80:20.

The binding energy value may be obtained, for example, by simulation using Gaussian 0.9 B0.1.

As a binding energy between the n-type organic compound and the metal material in the n-type charge generating layer is high, in the light-emitting device, charge flow may be facilitated, and an increase in driving voltage over time may be prevented.

In some embodiments, the metal material may be an alkali metal or an alloy of an alkali metal, and the n-type charge generating layer may further include bismuth (Bi).

In some embodiments, the metal material may be an alloy of an alkali metal and bismuth (Bi).

In some embodiments, the metal material may be lithium (Li), sodium (Na), a Bi—Li alloy, or a Bi—Na alloy.

When the n-type charge-generating layer is configured to include an alkali metal, the alkali metal may be oxidized during a process, thereby increasing a melting point, and thus a process temperature may be increased. In this light, as described above, because an alloy of an alkali metal and bismuth (Bi) is used as the metal material, the n-type charge generating layer may be stable. In addition, the alloy of an alkali metal and bismuth (Bi) may have a lower melting point, and the efficiency of the process using it may be increased.

In some embodiments, the metal material may be ytterbium (Yb), samarium (Sm), europium (Eu), terbium (Tb), holmium (Ho), or dysprosium (Dy).

The thickness of the n-type charge-generating layer may be in a range of about 0.1 nanometers (nm) to about 20 nm.

In some embodiments, the n-type charge generating layer may be in direct contact with an electron transport region of the adjacent emission unit. In some embodiments, a $(m-1)^{th}$ n-type charge generating layer nCGL(m-1) included in a $(m-1)^{th}$ charge generating unit CGU(m-1) may be in direct contact with an electron injection layer or an electron transport layer included in a $(m-1)^{th}$ emission unit ELU(m-1).

Embodiments including the p-type charge generating layer and the p-type hole injection layer are described herein.

The p-type charge generating layer and the p-type hole injection layer may each independently include an inorganic semiconductor material.

In some embodiments, the inorganic semiconductor material may include a post-transition metal, a halide of a transition metal, a halide of a post-transition metal, bismuth, tellurium, a telluride of a transition metal, a telluride of a post-transition metal, a sulfide of a transition metal, a sulfide of a post-transition metal, a selenide of a transition metal, a selenide of a post-transition metal, or any combination thereof.

In a light-emitting device according to one or more embodiments, a charge generating unit may include a p-type charge generating layer and a p-type hole injection layer, and the p-type charge generating layer and the p-type hole injection layer may each independently include an inorganic semiconductor material. Accordingly, the p-type hole injection layer may serve to regulate the energy level at an interface between a charge generating unit and an emission unit such that charge generation and migration from the p-type charge generating layer to an adjacent emission unit may be facilitated, and in addition, deterioration of materials may be prevented at the interface, thereby preventing an increase in the driving voltage. Therefore, the light-emitting device may provide improved lifespan and/or luminance.

In some embodiments, the inorganic semiconductor material may include Bi, Te, AgI, CuI, $NiI_2$, $CoI_2$, $PbI_2$, $SnI_2$, $AlI_3$, $GaI_3$, $InI_3$, $TiI_3$, $BiF_3$, $BiCl_3$, $BiBr_3$, $BiI_3$, $Bi_2S_3$, $Bi_2Se_3$, $Bi_2Te_3$, or a combination thereof.

In some embodiments, an inorganic semiconductor material included in the p-type charge generating layer may be substantially identical to an inorganic semiconductor material included in the p-type hole injection layer.

In some embodiments, an inorganic semiconductor material included in the p-type charge generating layer may be different from an inorganic semiconductor material included in the p-type hole injection layer.

In some embodiments, the p-type charge generating layer may include, as an inorganic semiconductor material, a post-transition metal, tellurium, a halide of a post-transition metal, a sulfide of a post-transition metal, a selenide of a post-transition metal, a telluride of a post-transition metal, or a combination thereof.

In some embodiments, the p-type charge generating layer may include, as an inorganic semiconductor material, bismuth, tellurium, a halide of bismuth, a sulfide of bismuth, a selenide of bismuth, a telluride of bismuth, or a combination thereof.

In some embodiments, the p-type charge generating layer may include Bi, Te, $BiF_3$, $BiCl_3$, $BiBr_3$, $BiI_3$, $Bi_2S_3$, $Bi_2Se_3$, $Bi_2Te_3$, or a combination thereof.

In some embodiments, the p-type hole injection layer may include, as an inorganic semiconductor material, a halide of a transition metal, for example, an iodide of a transition metal.

In some embodiments, the p-type hole injection layer may include CuI.

In some embodiments, the p-type charge generating layer and the p-type hole injection layer may each independently further include a hole transporting organic compound. The hole transporting organic compound may be understood by referring to the description thereof provided herein.

A hole transporting organic compound included in the p-type charge generating layer may be substantially identical to a hole transporting organic compound included in the p-type hole injection layer. In some embodiments, a hole transporting organic compound included in the p-type charge generating layer may be different from a hole transporting organic compound included in the p-type hole injection layer.

In some embodiments, a volume of the hole transporting organic compound may be the same as or greater than that of the inorganic semiconductor material in the p-type charge generating layer and the inorganic semiconductor material in the p-type hole injection layer.

In some embodiments, in the p-type charge generating layer, a volume ratio of the hole transporting organic compound to the inorganic semiconductor material may be in a range of about 99.9:0.1 to about 70:30, for example, about 99:1 to about 80:20.

In some embodiments, in the p-type hole injection layer, a volume ratio of the hole transporting organic compound to the inorganic semiconductor material may be in a range of about 99.9:0.1 to about 70:30, for example, about 99:1 to about 80:20.

A volume ratio of the hole transporting organic compound to the inorganic semiconductor material may be determined according to a deposition rate of each material when manufacturing a light-emitting device. In addition, a volume ratio of the hole transporting organic compound to the inorganic semiconductor material in a light-emitting device may be obtained by measuring and calculating a weight of each element.

The thickness of the p-type charge generating layer and the p-type hole injection layer may be in a range of about 0.1 nm to about 20 nm.

Embodiments including an emission unit are described herein.

According to embodiments, m emission units may be disposed on the first electrode 110.

In some embodiments, among the m emission units, an emission unit $m^{th}$ closest to the first electrode may be indicated as an $m^{th}$ emission unit ELU(m).

In some embodiments, among the m emission units, an emission unit closest to the first electrode 110 may be indicated as a first emission unit ELU(1), an emission unit farthest from the first electrode 110 may be indicated as an $m^{th}$ emission unit ELU(m), and the first emission unit ELU(1) to the $m^{th}$ emission unit ELU(m) may be sequentially arranged. That is, an $(m-1)^{th}$ charge generating unit CGU(m-1) may be between the first emission unit ELU(1) and the $m^{th}$ emission unit ELU(m).

Figure 3:
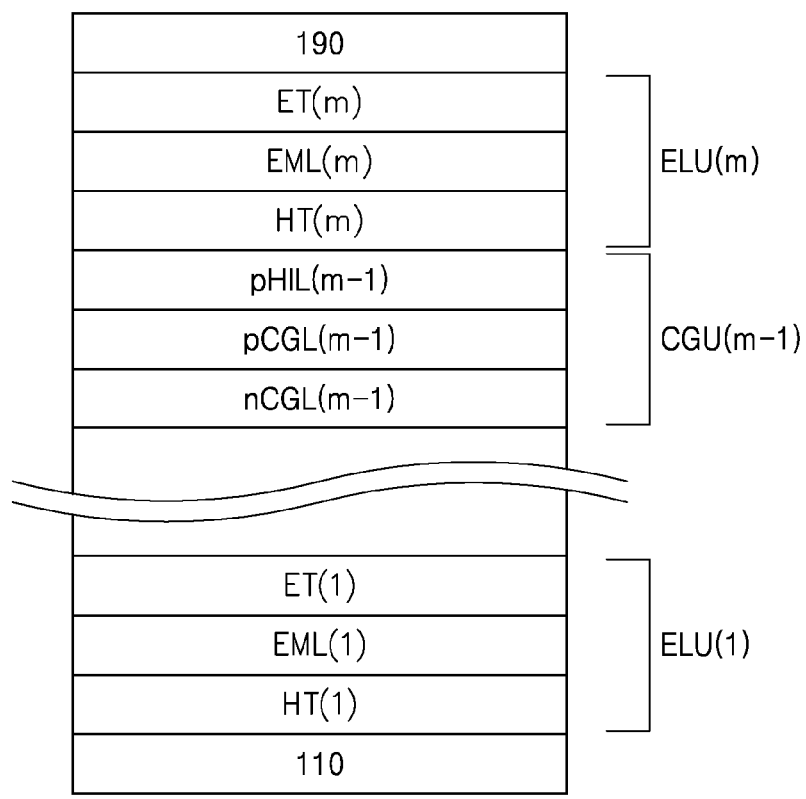
FIG. 3 and FIG. 4 are each a schematic cross-sectional view illustrating a light-emitting device according to an embodiment.
Figure 4:
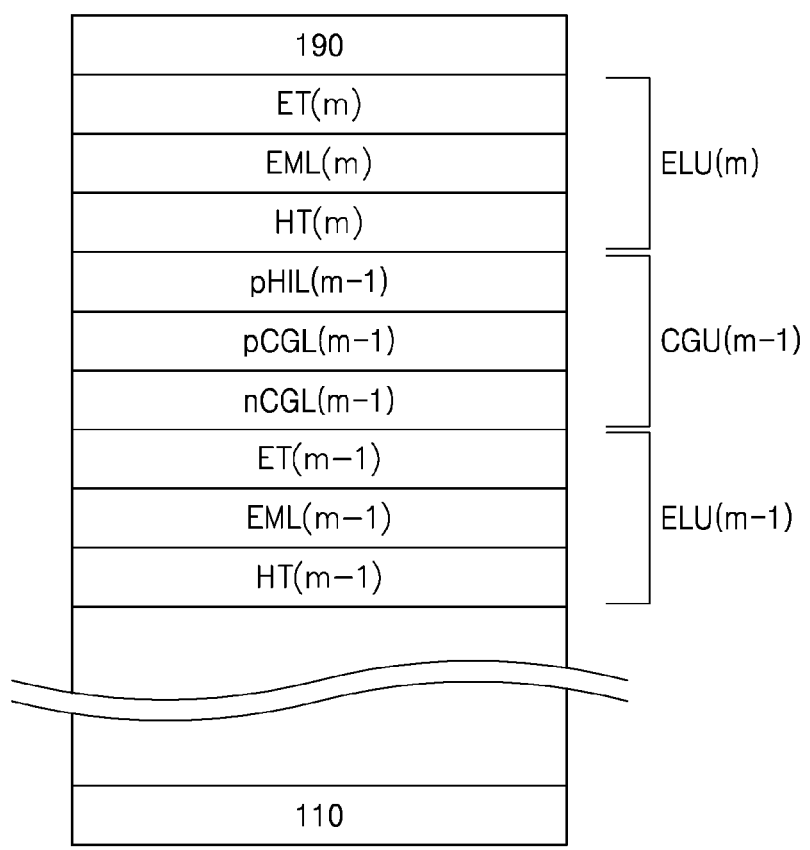

As illustrated in FIGS. 3 and 4, in a light-emitting device according to one or more embodiments, a $m^{th}$ emission unit ELU(m) that may be $m^{th}$ from the first electrode 110 among the m emission units may include a $m^{th}$ hole transport region HT(m), a $m^{th}$ emission layer EML(m), and a $m^{th}$ electron transport region ET(m).

In the present specification, description of the $m^{th}$ emission unit may be understood by referring to the description of the emission unit and not limited to the $m^{th}$ emission unit. For example, descriptions of the "$m^{th}$ emission layer" may be understood by referring to the description of the "emission layer" provided herein unless otherwise stated.

The hole transport region may include a hole injection layer, a hole transport layer, an electron blocking layer, or any combination thereof, and the electron transport region may include a hole blocking layer, an electron transport layer, an electron injection layer, or any combination thereof.

As illustrated in FIG. 4, in some embodiments, a light-emitting device may include: the first electrode 110 that may be an anode; the second electrode 190 that may be a cathode; an $m^{th}$ emission unit ELU(m) between the first electrode 110 and the second electrode 190; a $(m-1)^{th}$ emission unit ELU(m-1) between the first electrode 110 and the $m^{th}$ emission unit ELU(m); and a $(m-1)^{th}$ charge generating unit CGU(m-1) between the $m^{th}$ emission unit ELU(m) and the $(m-1)^{th}$ emission unit ELU(m-1), wherein the $m^{th}$ emission unit ELU(m) may include an $m^{th}$ emission layer EML(m), the $(m-1)^{th}$ emission unit ELU(m-1) may include a $(m-1)^{th}$ emission layer EML(m-1), the $(m-1)^{th}$ emission unit ELU(m-1) may further include a $(m-1)^{th}$ hole transport region HT(m-1) between the first electrode 110 and the $(m-1)^{th}$ emission layer EML(m-1); and a $(m-1)^{th}$ electron transport region ET(m-1) between the $m^{th}$ emission layer EML(m) and the $(m-1)^{th}$ charge generating unit CGU(m-1), and the $m^{th}$ emission unit ELU(m) may include an $m^{th}$ hole transport region HT(m) between the $(m-1)^{th}$ charge generating unit CGU(m-1) and the $m^{th}$ emission layer EML(m); and an $m^{th}$ electron transport region ET(m) between the $m^{th}$ emission layer EML(m) and the second electrode 190, wherein the hole transport regions HT(m-1) and HT(m) may each include a hole injection layer, a hole transport layer, an electron blocking layer, or any combination thereof, and the electron transport regions ET(m-1) and ET(m) may each include a hole blocking layer, an electron transport layer, an electron injection layer, or any combination thereof.

Embodiments including a hole transport region are described herein.

The light-emitting device may include a hole transport region in direct contact with the first electrode or the $(m-1)^{th}$ charge generating unit. The hole transport region may include a hole transporting organic compound.

In the present specification, the term "hole transporting organic compound" refers to any organic material having hole transportability.

In some embodiments, the hole transporting organic compound may include at least one selected from m-MTDATA, TDATA, 2-TNATA, NPB (NPD), β-NPB, TPD, a spiro-TPD, a spiro-NPB, methylated-NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

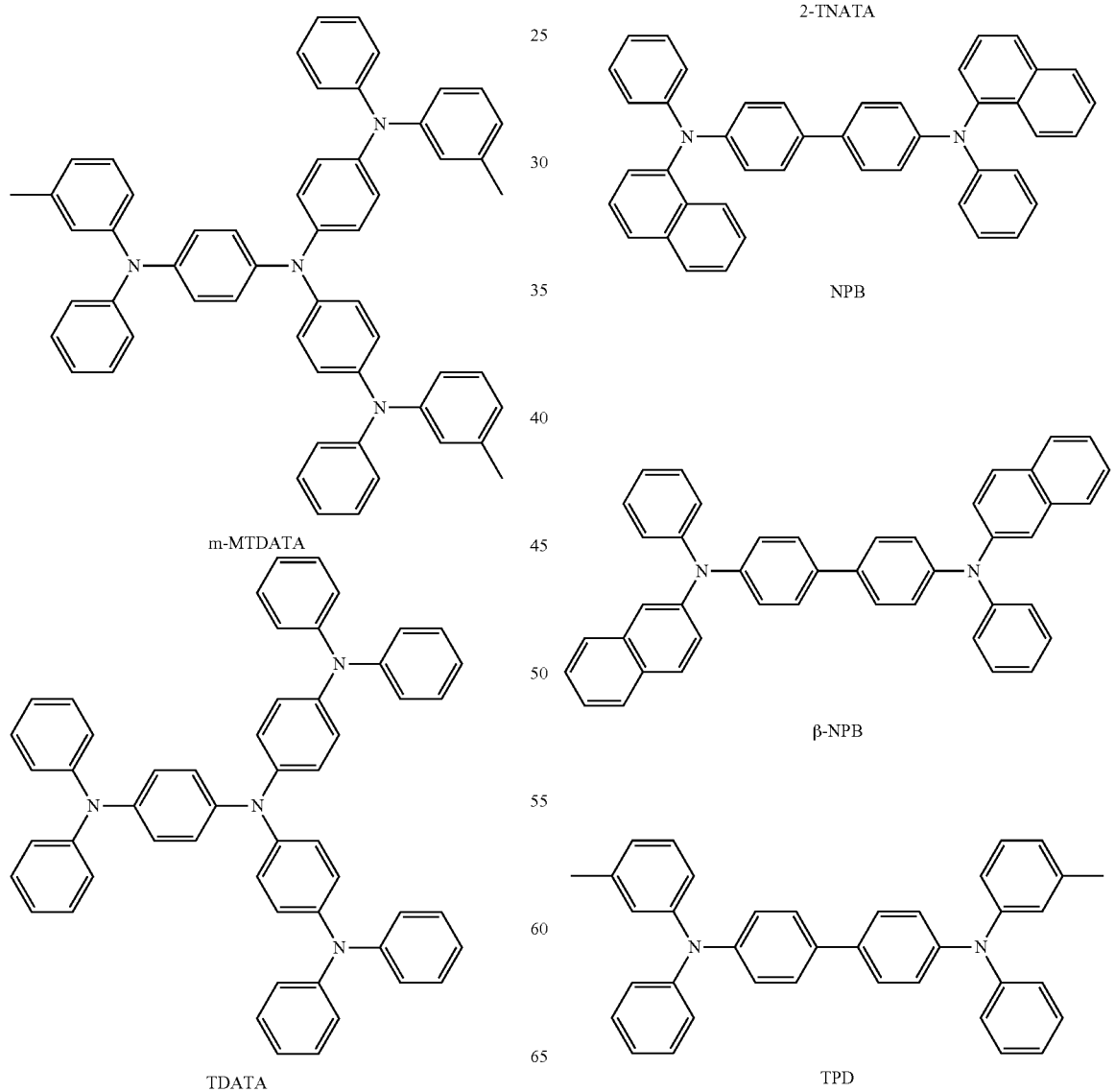

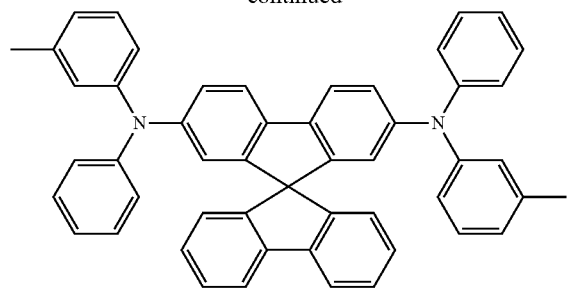

Spiro-TPD

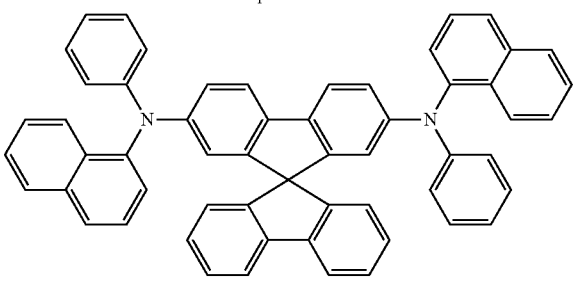

Spiro-NPB

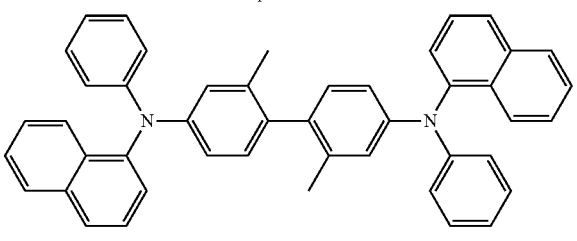

methylated NPB

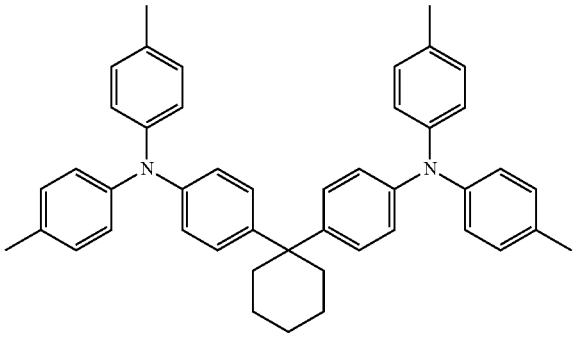

TAPC

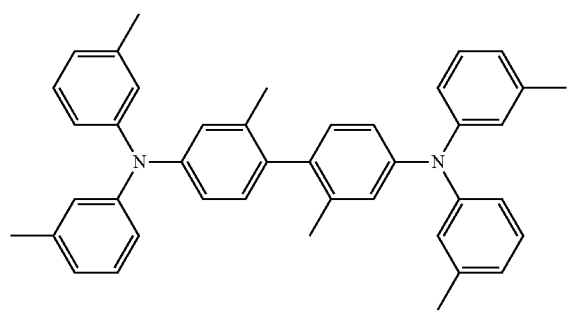

HMTPD

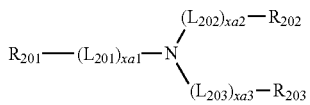

Formula 201

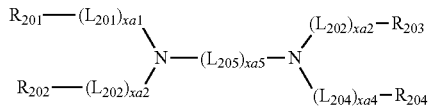

Formula 202 wherein, in Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formula 202, $R_{201}$ and $R_{202}$ may optionally be bound via a single bond, a dimethyl-methylene group, or a diphenyl-methylene group, and $R_{203}$ and $R_{204}$ may optionally be bound via a single bond, a dimethyl-methylene group, or a diphenyl-methylene group.

In some embodiments, in Formula 201 and 202, $L_{201}$ to $L_{205}$ may each independently be selected from: a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group.

$L_{201}$ to $L_{205}$ may also each independently be selected from a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$).

$Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In some embodiments, xa1 to xa4 may each independently be 0, 1, or 2.

In some embodiments, xa5 may be 1, 2, 3, or 4.

In some embodiments, $R_{201}$ to $R_{204}$ and $Q_{201}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and $R_{201}$ to $R_{204}$ and $Q_{201}$ may also each independently be a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$).

$Q_{31}$ to $Q_{33}$ may respectively be understood by referring to the descriptions of $Q_{31}$ to $Q_{33}$ provided herein.

In some embodiments, in Formula 201, at least one selected from $R_{201}$ to $R_{203}$ may each independently be selected from a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

In some embodiments, in Formula 202, i) $R_{201}$ and $R_{202}$ may be bound via a single bond, and/or ii) $R_{203}$ and $R_{204}$ may be bound via a single bond.

In some embodiments, in Formula 202, at least one selected from $R_{201}$ to $R_{204}$ may be selected from a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

The compound represented by Formula 201 may be represented by Formula 201A:

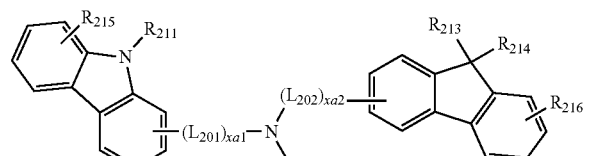

Formula 201A

In some embodiments, the compound represented by Formula 201 may be represented by Formula 201A(1), but embodiments are not limited thereto:

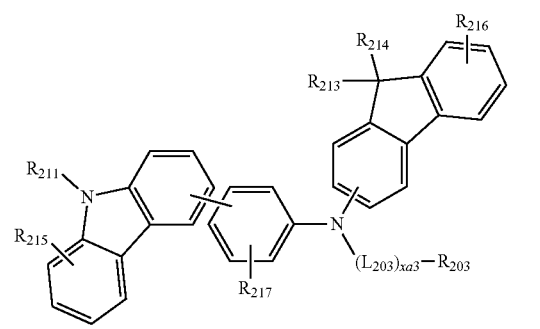

Formula 201A(1)

In some embodiments, the compound represented by Formula 201 may be represented by Formula 201A-1, but embodiments are not limited thereto:

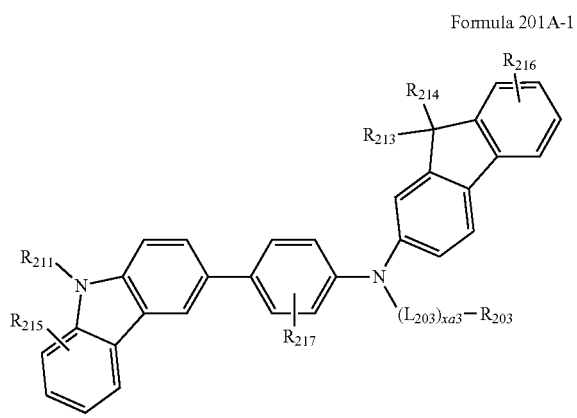

Formula 201A-1

In some embodiments, the compound represented by Formula 202 may be represented by Formula 202A:

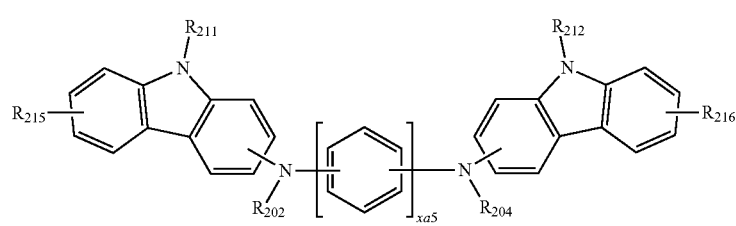

Formula 202A

In some embodiments, the compound represented by Formula 202 may be represented by Formula 202A-1:

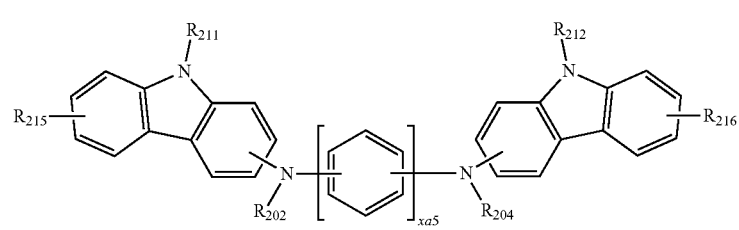

Formula 202A-1

In Formulae 201A, 201A(1), 201A-1, 202A, and 202A-1, $L_{201}$ to $L_{203}$, xa1 to xa3, xa5, and $R_{202}$ to $R_{204}$ may respectively be understood by referring to the descriptions of $L_{201}$ to $L_{203}$, xa1 to xa3, xa5, and $R_{202}$ to $R_{204}$ provided herein, $R_{211}$ and $R_{212}$ may each be understood by referring to the description of $R_{203}$ provided herein, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but embodiments are not limited thereto:

HT1

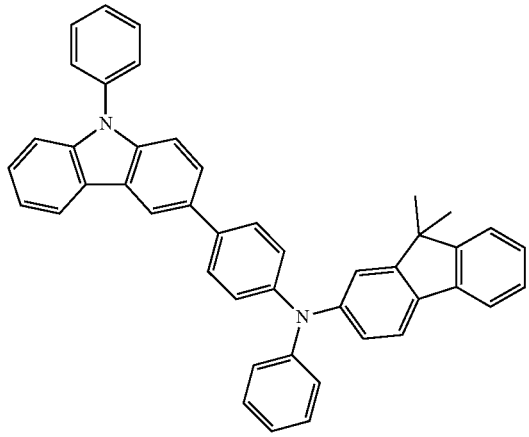

HT2

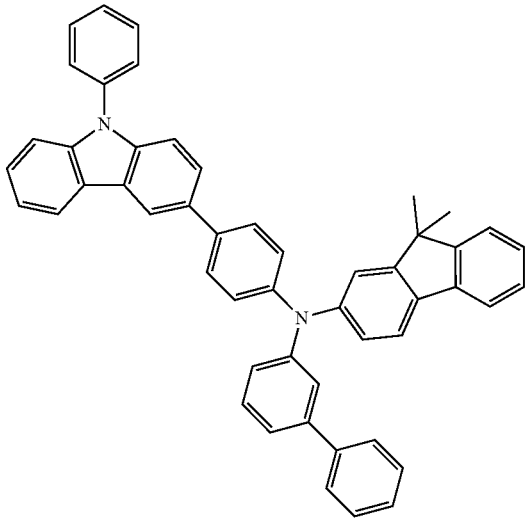

HT3

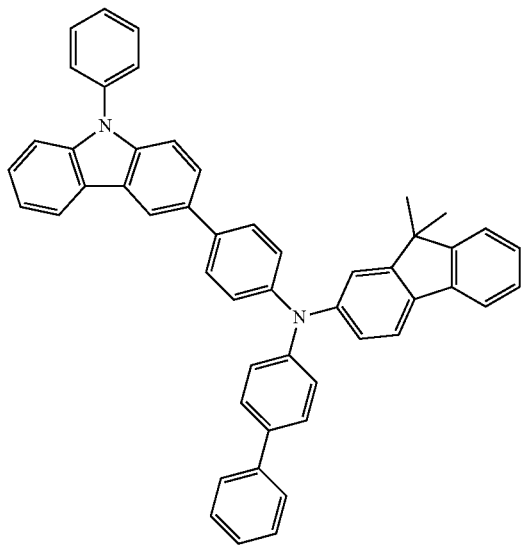

HT4

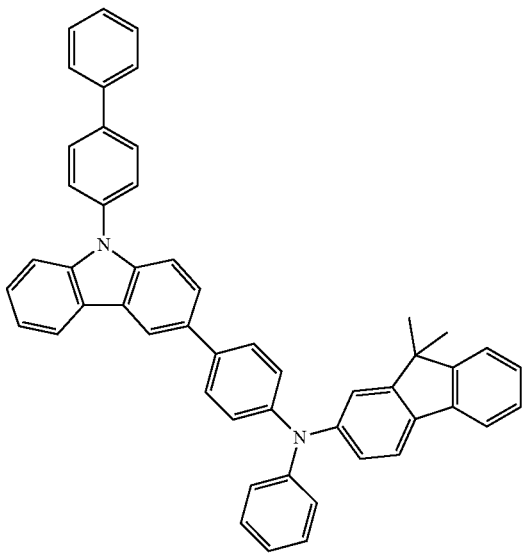

-continued
HT5
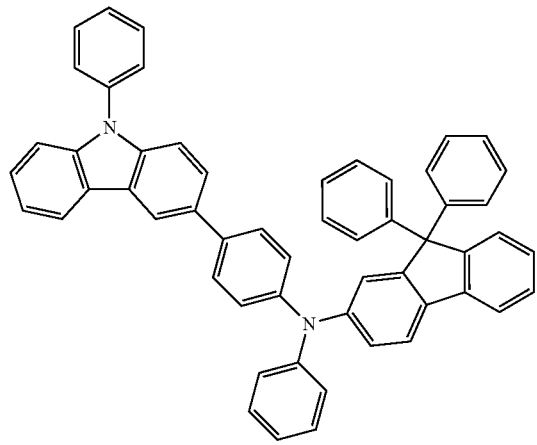
HT6
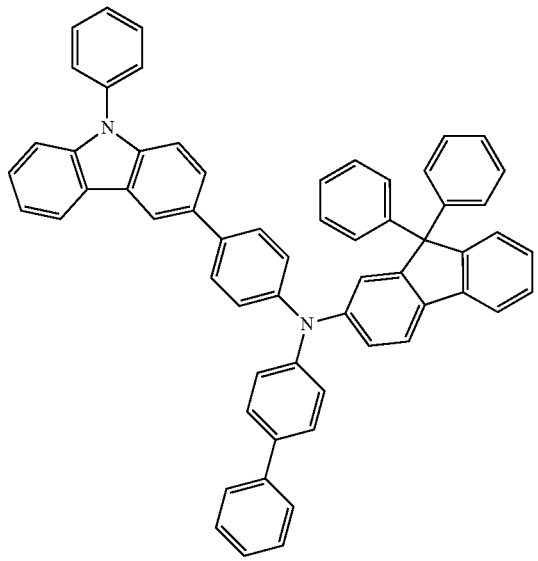
HT7
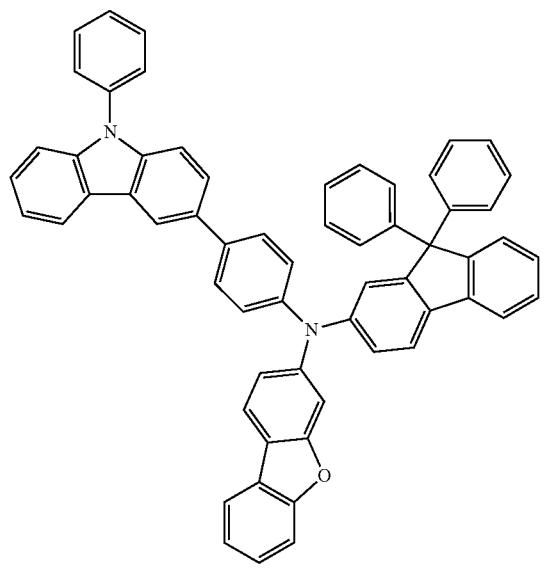
HT8
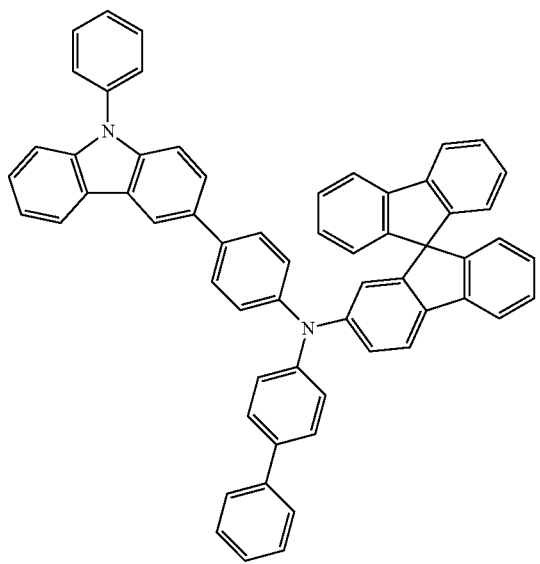

-continued
HT9
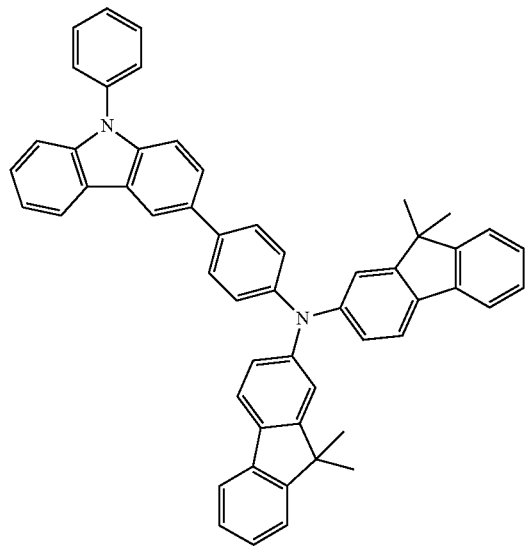
HT10
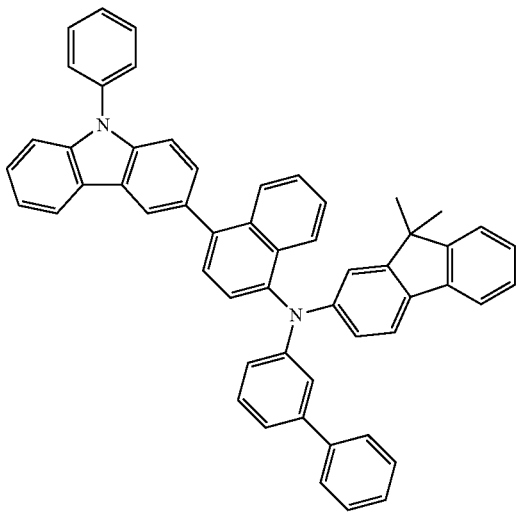
HT11
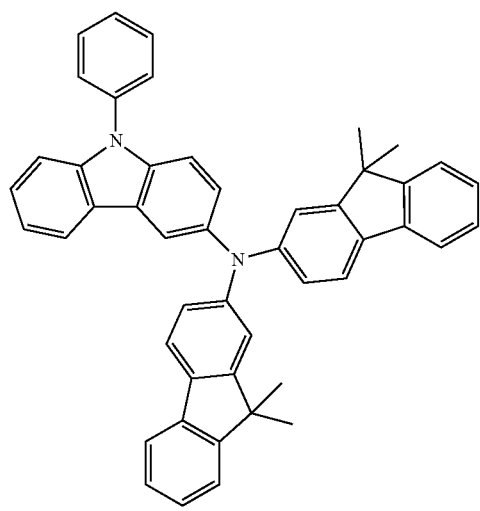
HT12
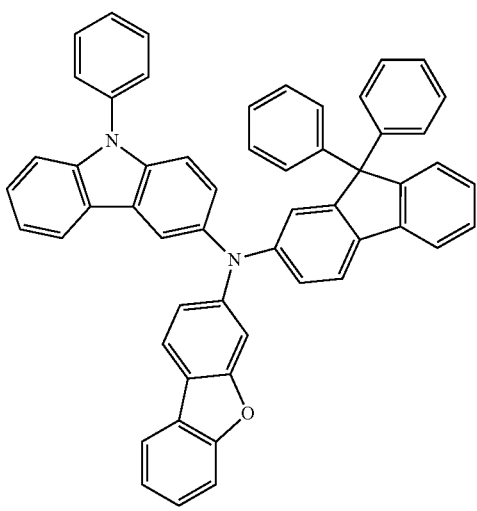
HT13
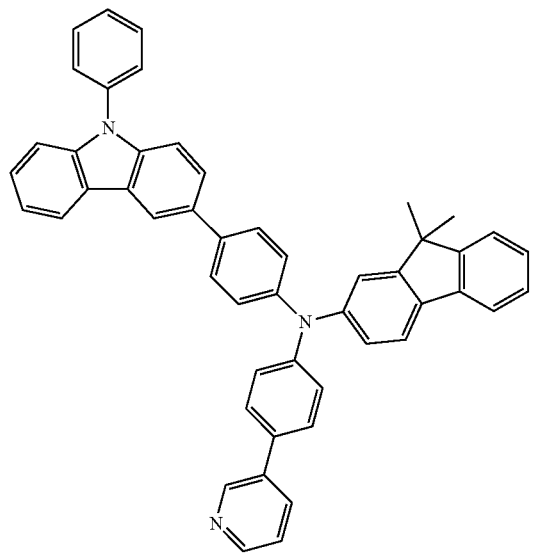
HT14
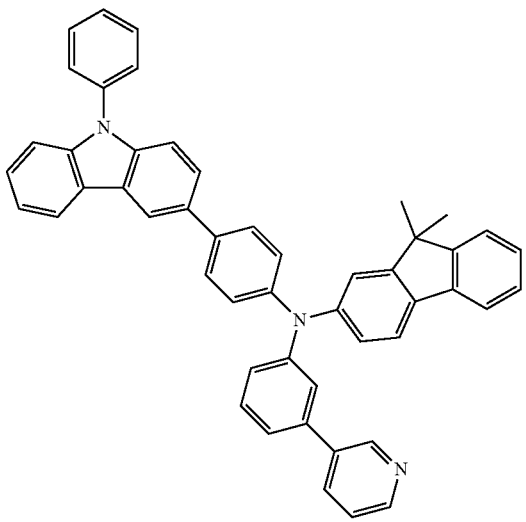

-continued
HT15
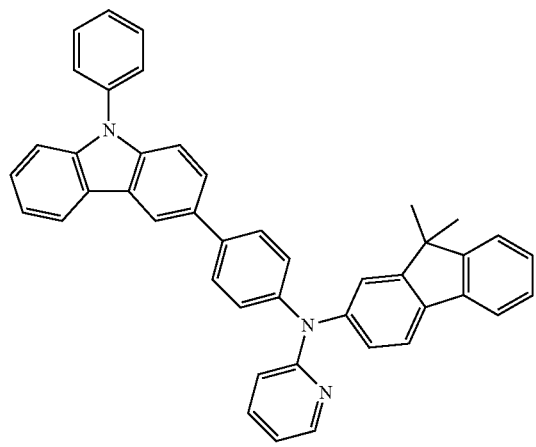
HT16
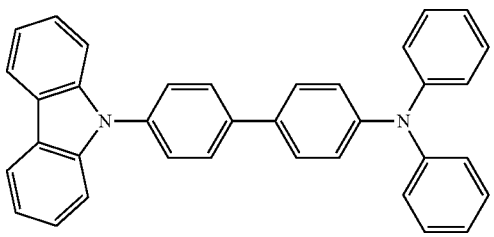
HT17
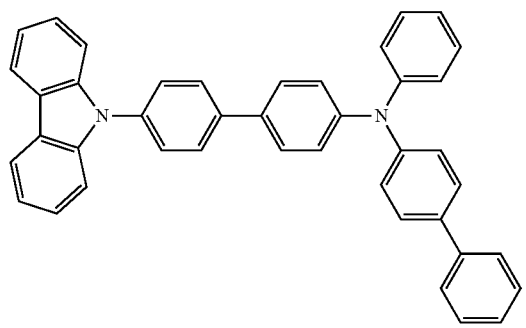
HT18
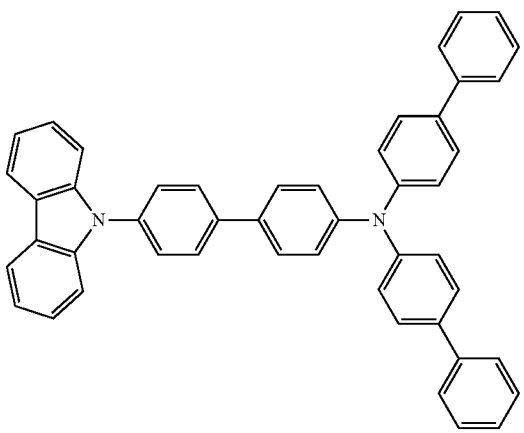
HT19
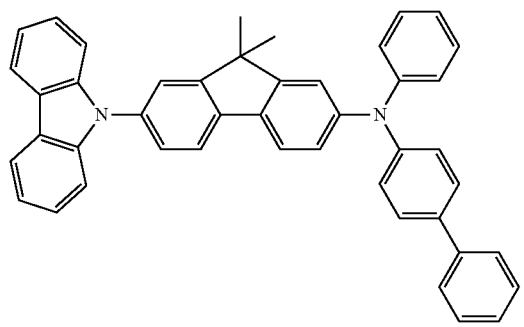
HT20
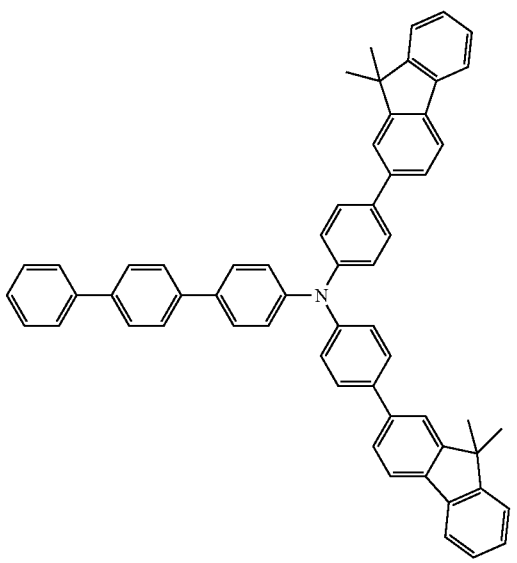

-continued
HT21
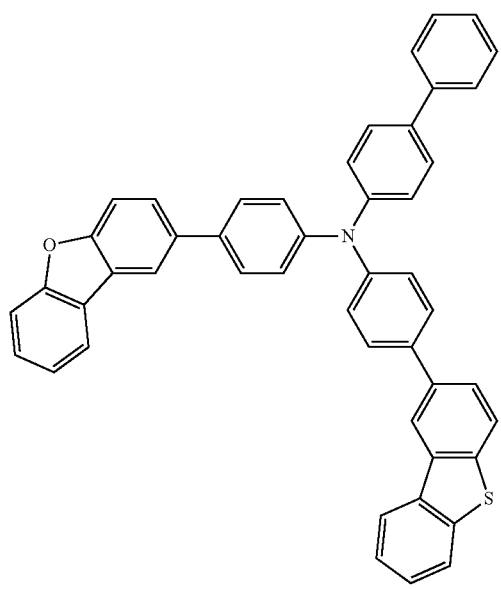
HT22
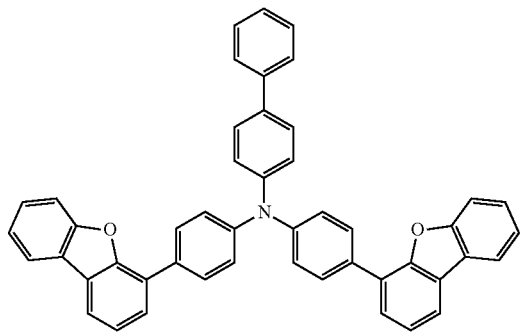
HT23
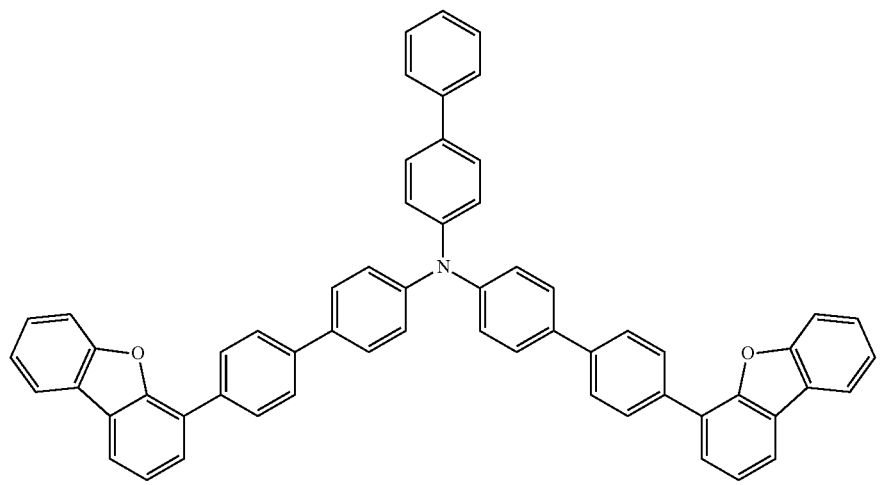
HT24
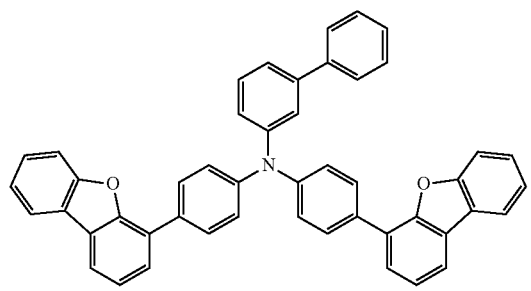
HT25
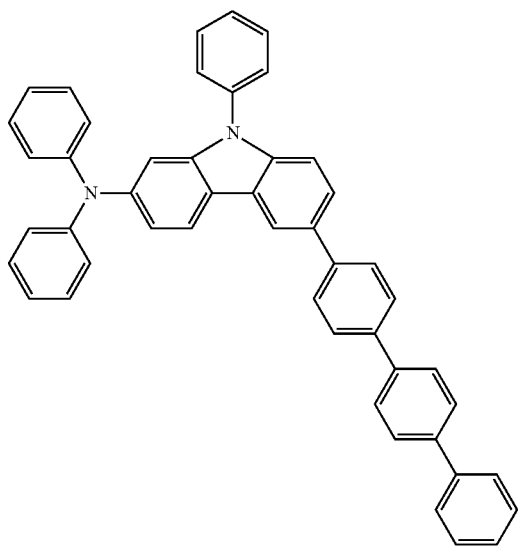

-continued
HT26
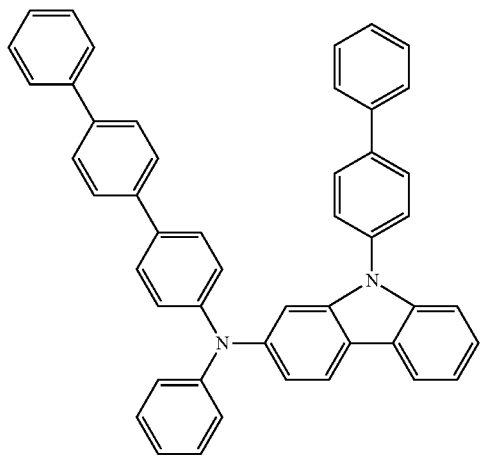
HT27
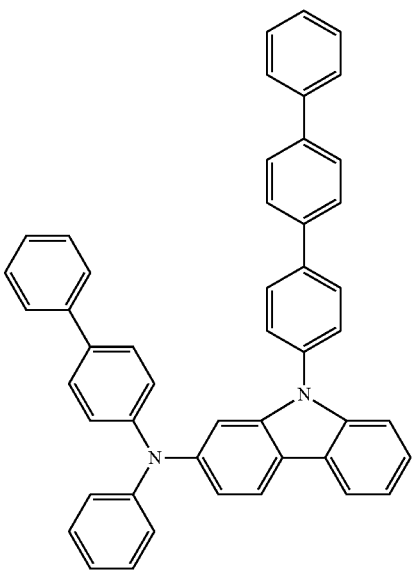
HT28
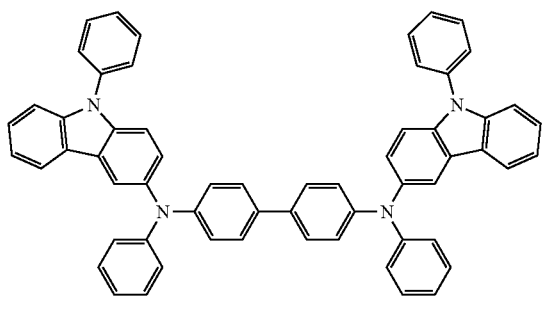
HT29
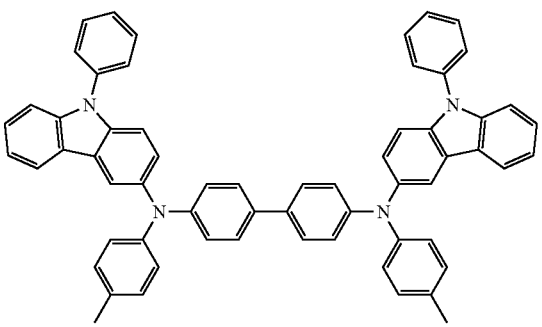
HT30
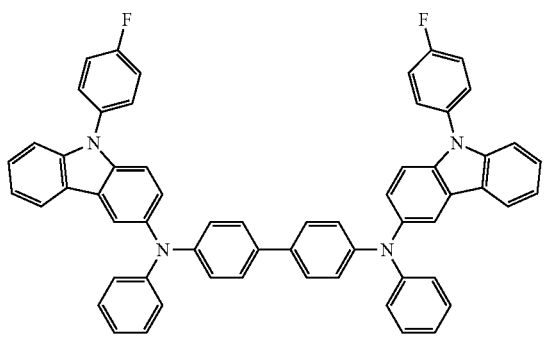
HT31
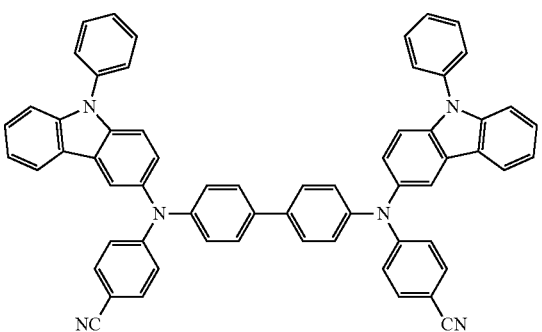

-continued
HT32
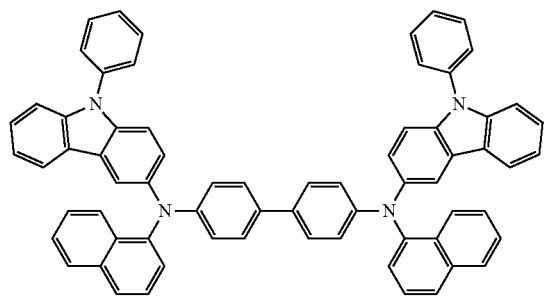
HT33
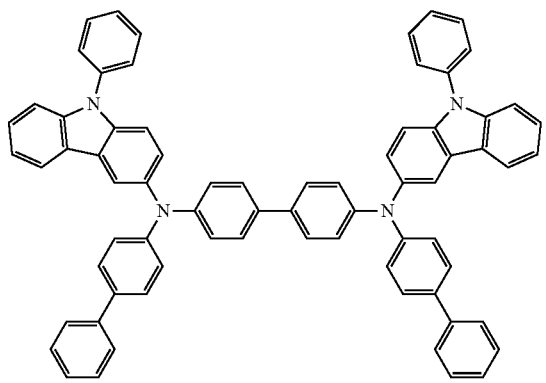
HT34
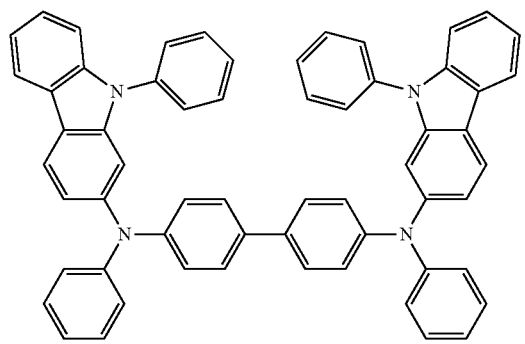
HT35
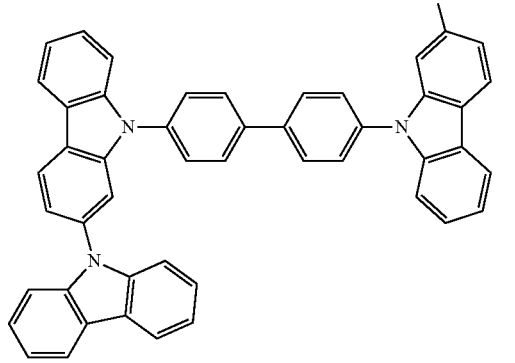
HT36
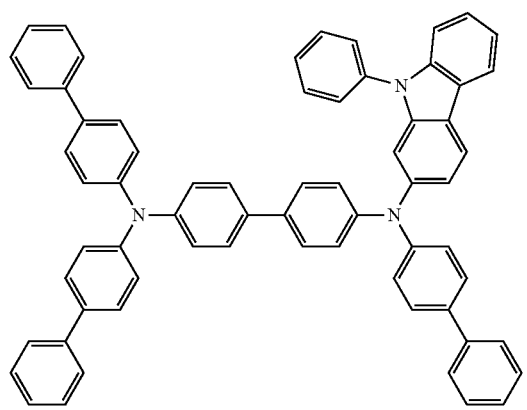
HT37
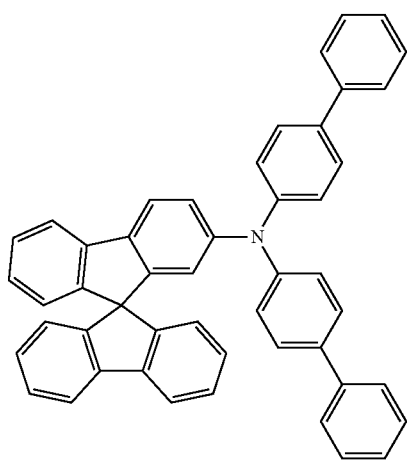

HT38

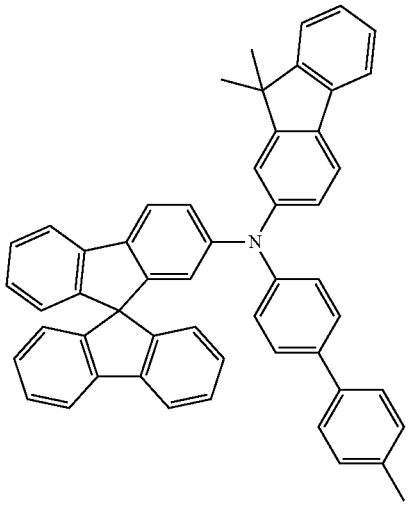

HT39

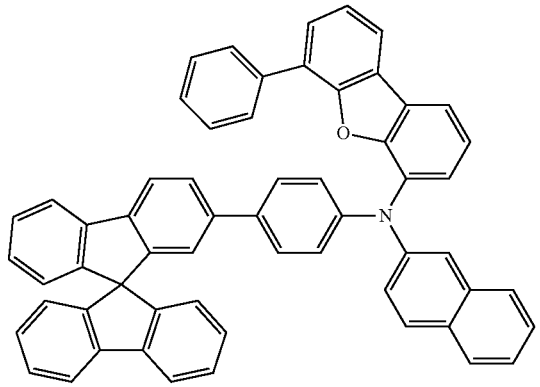

Hole Injection Layer in Hole Transport Region

In some embodiments, a hole transport region included in an emission unit of the light-emitting device may include a hole injection layer.

In some embodiments, the hole injection layer may be understood by referring to the description of the p-type hole injection layer. In some embodiments, the hole injection layer may include an inorganic semiconductor material. Description of the inorganic semiconductor material may be understood by referring to the description of the inorganic semiconductor material provided herein.

In some embodiments, the inorganic semiconductor material included in the hole injection layer may be substantially identical to the inorganic semiconductor material included in the p-type hole injection layer. In some embodiments, the inorganic semiconductor material included in the hole injection layer may be different from the inorganic semiconductor material included in the p-type hole injection layer.

In some embodiments, the hole injection layer may further include a hole transporting organic compound.

In some embodiments, the hole injection layer may consist of the inorganic semiconductor material and the hole transporting organic compound.

In some embodiments, the hole injection layer may include a material substantially the same as that included in the p-type hole injection layer. In some embodiments, the hole injection layer may include an inorganic semiconductor material and/or a hole transporting organic compound independently from the p-type hole injection layer.

As illustrated in FIGS. 3 and 4, the $(m-1)^{th}$ hole transport region HT(m-1) may include a $(m-1)^{th}$ hole injection layer, and the $(m-1)^{th}$ hole injection layer may be adjacent to at least one of the first electrode 110 and the $(m-1)^{th}$ charge generating unit CGU(m-1) and may include an inorganic semiconductor material.

In addition, in some embodiments, the $(m-1)^{th}$ hole injection layer may be in direct contact with the first electrode 110. For example, the first hole transport region HT(1) included in the first emission unit ELU(1) may include a first hole injection layer, wherein the first hole injection layer may be adjacent to the first electrode 110 and include an inorganic semiconductor material.

In a light-emitting device according to one or more embodiments, the hole injection layer may include a semiconductor material, thereby facilitating charge generation and migration at an interface with a first electrode or a charge generating unit and preventing deterioration of materials at interfaces between each of the layers and an increase in driving voltage. Therefore, the light-emitting device may provide improved lifespan and/or luminance.

The thickness of the hole injection layer may be in a range of about 0.1 nm to about 20 nm, for example, about 0.1 nm to about 10 nm. When the thickness of hole injection layer is within one of these ranges, satisfactory hole injection characteristics may be obtained without a substantial increase in the driving voltage.

Embodiments including a hole transport layer in hole transport region are described herein.

An emission unit in the light-emitting device may include a hole transport layer in direct contact with the emission layer.

The hole transport layer may include at least one selected from hole transporting organic compounds.

In some embodiments, the hole transport layer may include a halide of an alkali metal, a halide of an alkaline earth metal, a halide of a lanthanide metal, or any combination thereof.

As illustrated in FIGS. 3 and 4, the $m^{th}$ hole transport region HT(m) may include a $m^{th}$ hole transport layer adjacent to the $m^{th}$ emission layer EML(m), and the $m^{th}$ hole transport layer may include a hole transporting organic compound.

In some embodiments, the $m^{th}$ hole transport layer may include a halide of an alkali metal, a halide of an alkaline earth metal, a halide of a lanthanide metal, or any combination thereof.

The hole transporting organic compound may be 50 parts by volume or greater, based on 100 parts by volume of the hole transport layer. In some embodiments, the hole transporting organic compound in the hole transport layer may be included in a range of about 50 parts by volume to about 99.9 parts by volume.

The thickness of the hole transport layer may be in a range of about 0.1 nm to about 10 nm. When the thickness of hole injection layer is within any of these ranges, satisfactory hole transporting characteristics may be obtained without a substantial increase in the driving voltage.

Embodiments including a charge-generating material in a hole transport region are described herein.

The hole transport region may include a charge generating material as well as the aforementioned materials, to improve conductive properties of the hole transport region. The charge generating material may be substantially homogeneously or non-homogeneously dispersed in the hole transport region. In some embodiments, the charge-generating material may be included in a layer other than a hole injection layer in the hole transport region.

The charge generating material may include, for example, a p-dopant.

In an embodiment, a lowest unoccupied molecular orbital (LUMO) energy level of the p-dopant may be −3.5 eV or less.

The p-dopant may include at least one selected from a quinone derivative, a metal oxide, and a cyano group-containing compound, but embodiments are not limited thereto.

In some embodiments, the p-dopant may be selected from a quinone derivative, such as tetracyanoquinodimethane (TCNQ) or 2,3,5,6-tetrafluoro-7,7,8,8-tetracyanoquinodimethane (F4-TCNQ); a metal oxide, such as tungsten oxide or molybdenum oxide; 1,4,5,8,9,12-hexaazatriphenylene-hexacarbonitrile (HAT-CN); and a compound represented by Formula 221, but embodiments are not limited thereto:

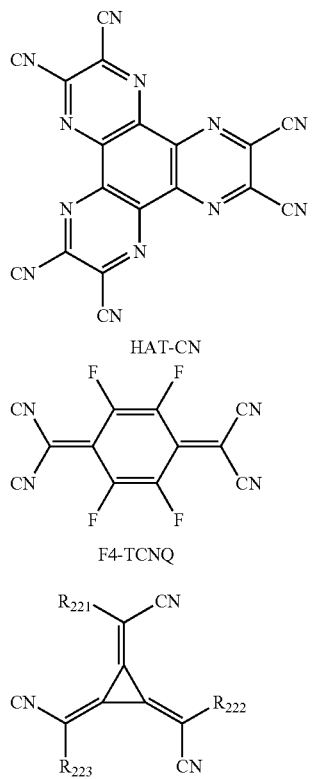

wherein, in Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may include at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Embodiments including an emission layer are described herein.

Although not illustrated in FIG. 1, the emission units may each include an emission layer. In some embodiments, each of the emission units may include one emission layer.

A plurality of emission layers may emit colors of light that are different from or substantially identical to each other. For example, each of the plurality of emission layers may emit blue light, but embodiments are not limited thereto.

The emission layer may include at least one selected from an organic compound and a semiconductor compound, but compounds to be included in the emission layer are not limited thereto. Particularly, when the emission layer includes an organic compound, the light-emitting device may be referred to as an organic light-emitting device.

In detail, the organic compound may include a host and a dopant.

In detail, the semiconductor compound may be a quantum dot, and in this embodiment, the light-emitting device may be a quantum dot light-emitting device.

In some embodiments, the semiconductor compound may be an organic perovskite and/or an inorganic perovskite.

The thickness of the emission layer may be in a range of about 0.1 nm to about 100 nm. In detail, the thickness of the emission layer may be in a range of about 15 nm to about 50 nm. In detail, when the emission layer emits blue light, the thickness of the blue emission layer may be in a range of about 15 nm to about 20 nm, when the emission layer emits green light, the thickness of the green emission layer may be in a range of about 20 nm to about 40 nm, and when the emission layer emits red light, the thickness of the red emission layer may be in a range of about 40 nm to about 50 nm. When the thickness of the emission layer is within any of these ranges, the light-emitting device may have excellent luminescence characteristics without a substantial increase in driving voltage.

The emission layer in the organic light-emitting device may include a host and a dopant. The dopant may be a phosphorescent dopant, a fluorescent dopant, a delayed fluorescent dopant, or any combination thereof.

The amount of the dopant in the emission layer may be, in general, in a range of about 0.01 parts to about 15 parts by weight based on 100 parts by weight of the host, but embodiments are not limited thereto.

The host may include a compound represented by Formula 301:

Formula 301 reads:

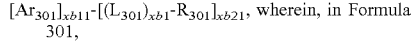

$[Ar_{301}]_{xb11}$-$[(L_{301})_{xb1}$-$R_{301}]_{xb21}$, wherein, in Formula 301, $Ar_{301}$ may be selected from a substituted or unsubstituted $C_5$-$C_{60}$ carbocyclic group and a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$), and xb21 may be an integer from 1 to 5, wherein $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments are not limited thereto.

In some embodiments, in Formula 301, $Ar_{301}$ may be selected from:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments are not limited thereto.

When xb11 in Formula 301 is 2 or greater, at least two $Ar_{301}$(s) may be bound via a single bond.

In one or more embodiments, the compound represented by Formula 301 may be represented by Formula 301-1 or 301-2:

Formula 301-1

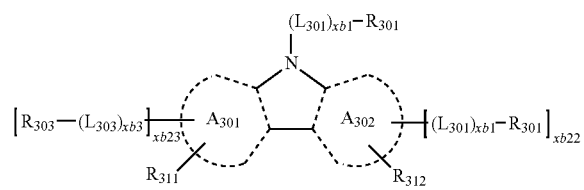

Formula 301-2

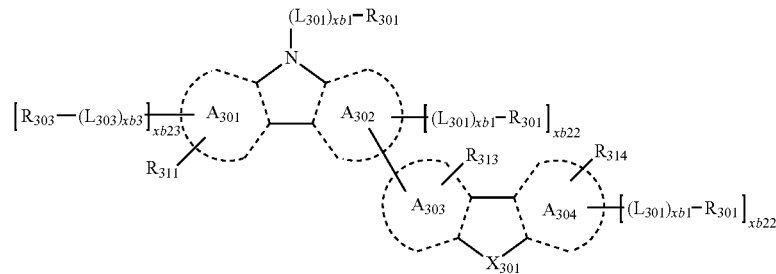

wherein, in Formulae 301-1 and 301-2, $A_{301}$ to $A_{304}$ may each independently be selected from a benzene group, a naphthalene group, a phenanthrene group, a fluoranthene group, a triphenylene group, a pyrene group, a chrysene group, a pyridine group, a pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a benzothiophene group, a dibenzothiophene group, a naphthothiophene group, a benzonapthothiophene group, and a dinaphthothiophene group, $X_{301}$ may be O, S, or N-[($L_{304}$)$_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), xb22 and xb23 may each independently be 0, 1, or 2, $L_{301}$, xb1, $R_{301}$, and $Q_{31}$ to $Q_{33}$ may respectively be understood by referring to the descriptions of $L_{301}$, xb1, $R_{301}$, and $Q_{31}$ to $Q_{33}$ provided herein, $L_{302}$ to $L_{304}$ may each be understood by referring to the description of $L_{301}$ provided herein, xb2 to xb4 may each be understood by referring to the descriptions of xb1 provided herein, and $R_{302}$ to $R_{304}$ may each be understood by referring to the description of $R_{301}$ provided herein.

In some embodiments, in Formulae 301, 301-1, and 301-2, $L_{301}$ to $L_{304}$ may each independently be selected from: a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group.

$L_{301}$ to $L_{304}$ may also be selected from: a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may respectively be understood by referring to the descriptions of $Q_{31}$ to $Q_{33}$ provided herein.

In some embodiments, in Formulae 301, 301-1, and 301-2, $R_{301}$ to $R_{304}$ may each independently be selected from: a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, and an imidazopyrimidinyl group, and an azacarbazolyl group.

$R_{301}$ to $R_{304}$ may also be selected from a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may respectively be understood by referring to the descriptions of $Q_{31}$ to $Q_{33}$ provided herein.

In some embodiments, the host may include an alkaline earth metal complex. For example, the host may include a beryllium (Be) complex, e.g., Compound H55, a magnesium (Mg) complex, or a zinc (Zn) complex.

The host may include at least one selected from 9,10-di(2-naphthyl)anthracene (ADN), 2-methyl-9,10-bis(naphthalen-2-yl)anthracene (MADN), 9,10-di(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), and Compounds H1 to H55, but embodiments are not limited thereto:

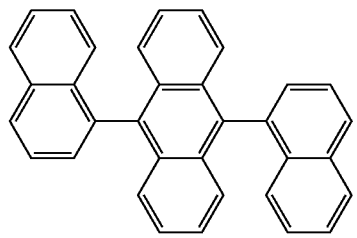

H1

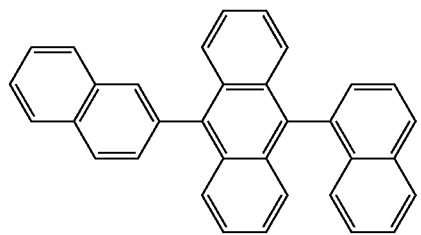

H2

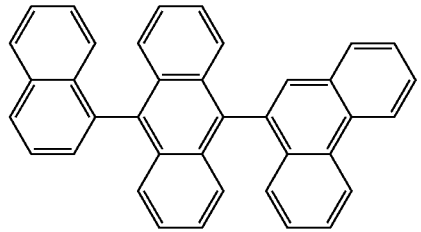

H3

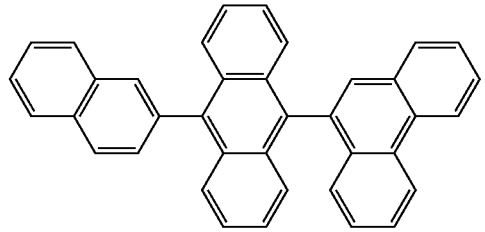

H4

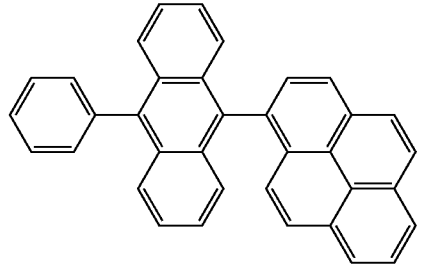

H5

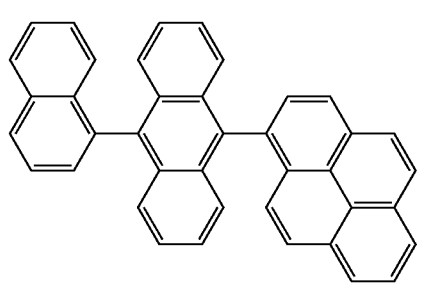

H6

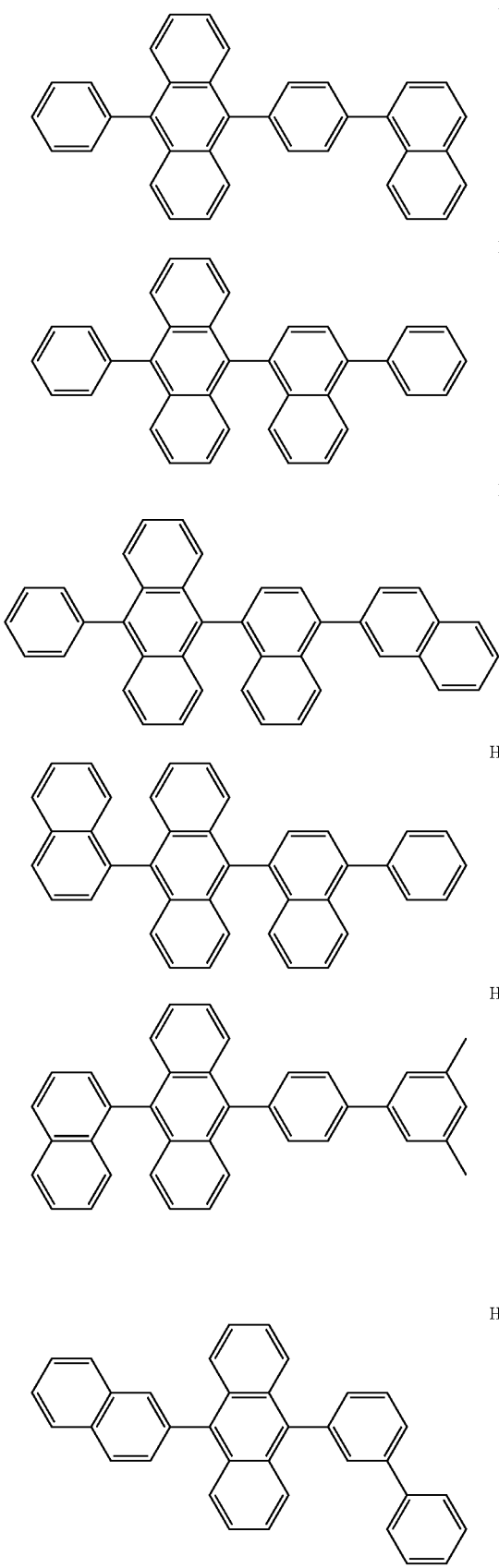
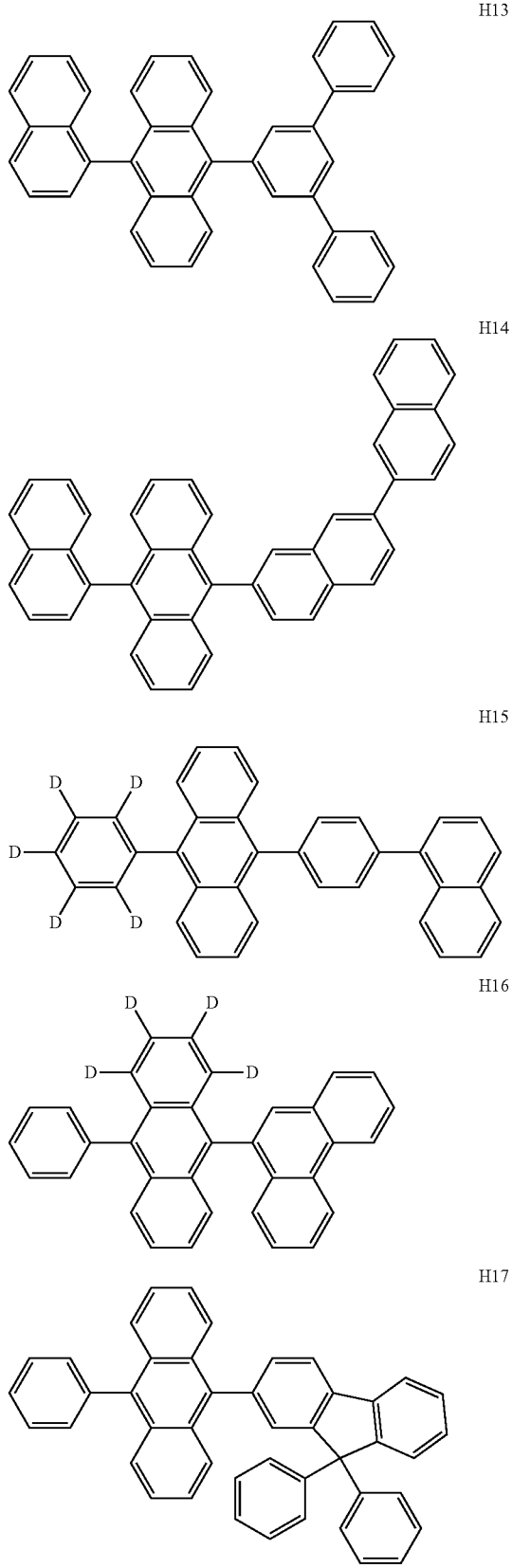

H18
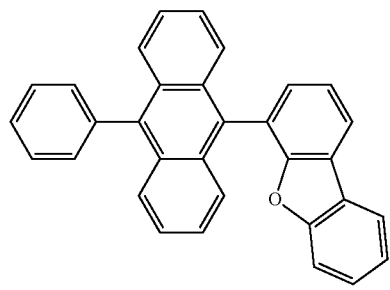
H19
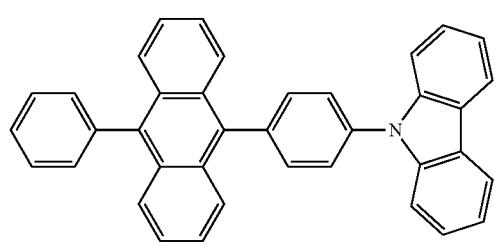
H20
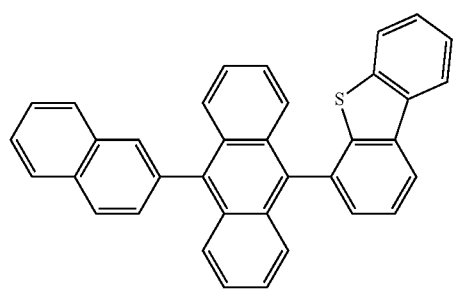
H21
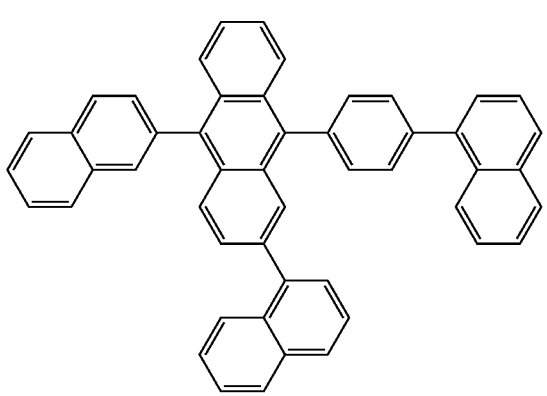
H22
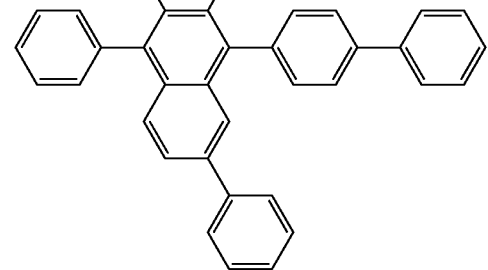
H23
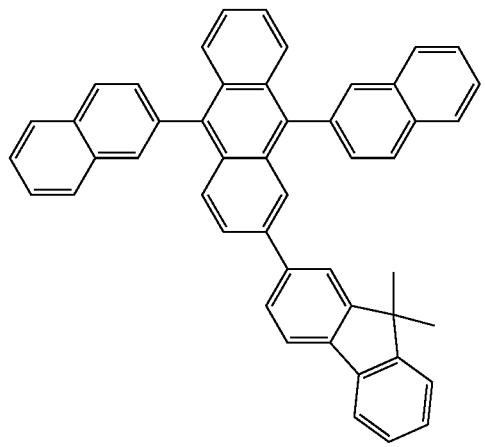
H24
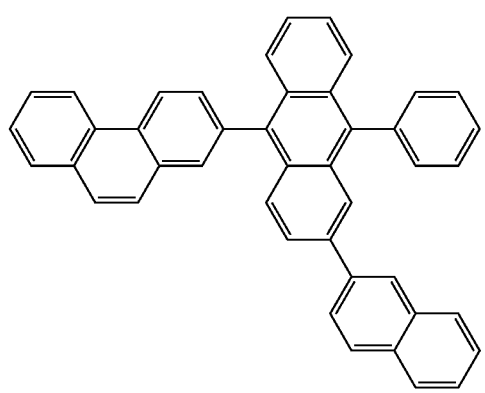
H25
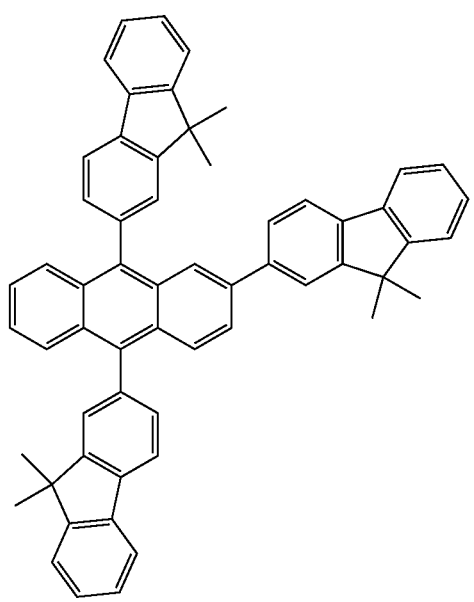

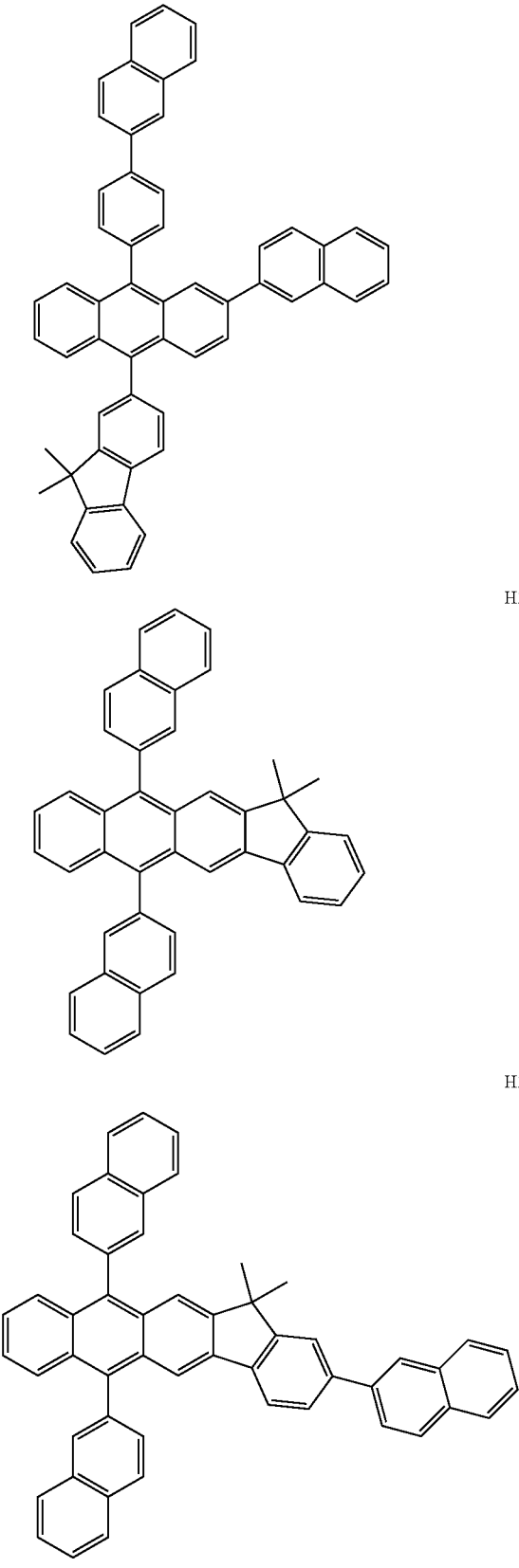
H26
H27
H28
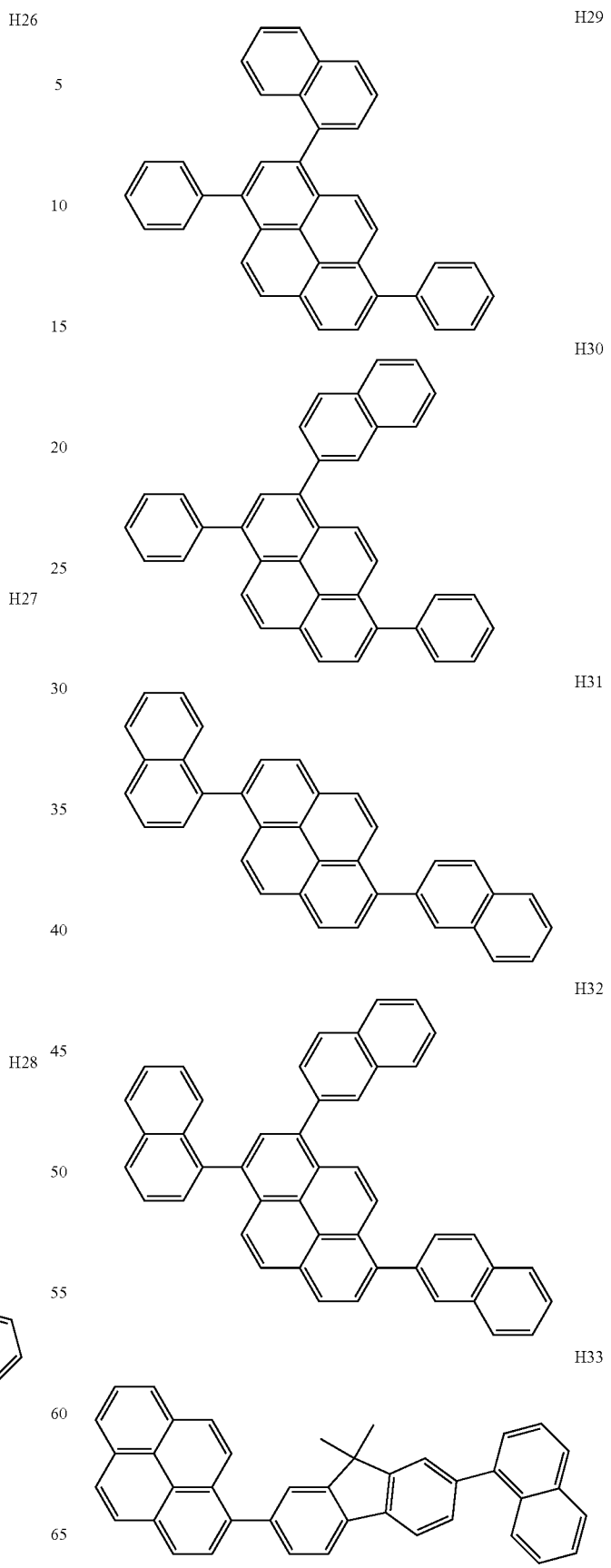
H29
H30
H31
H32
H33

-continued
H34
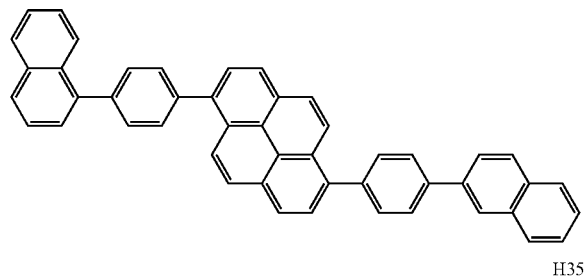
H35
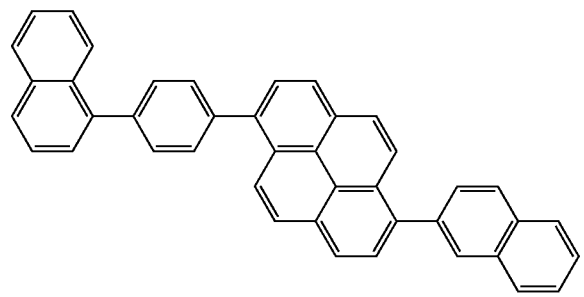
H36
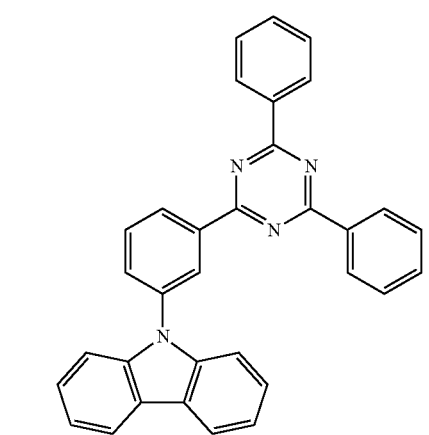
H37
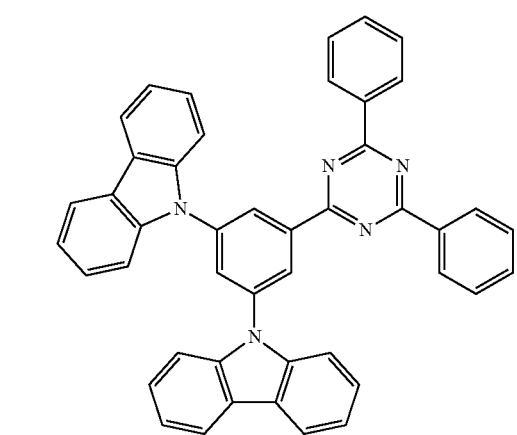
-continued
H38
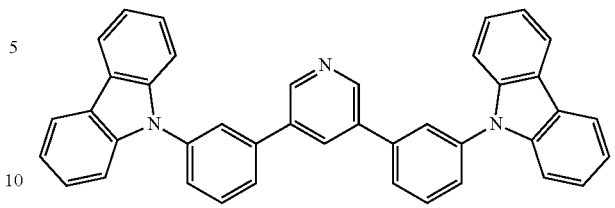
H39
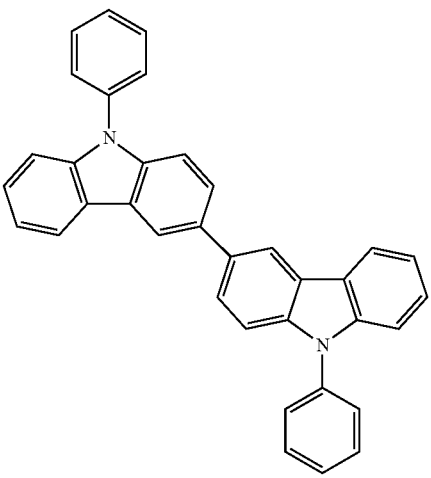
H40
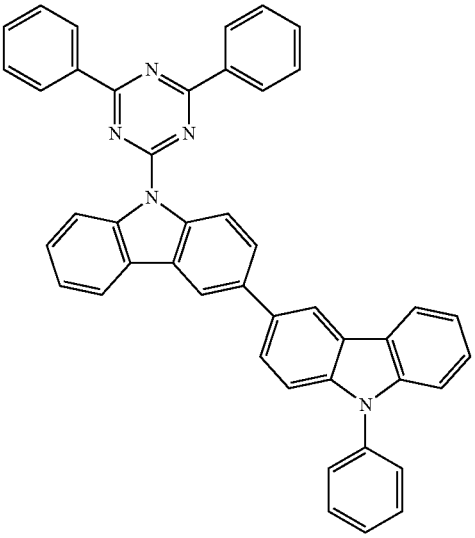

H41 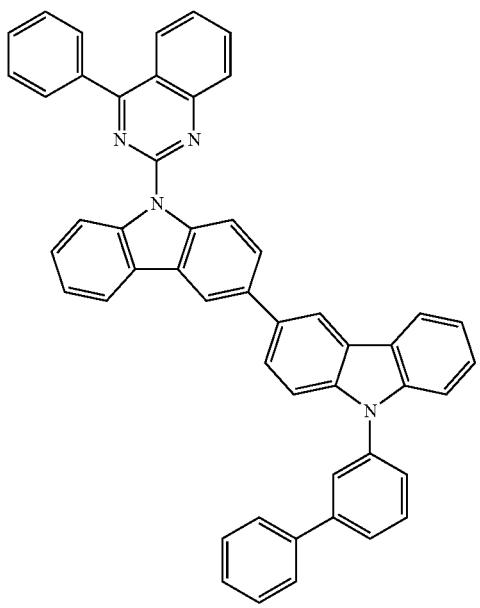
H42 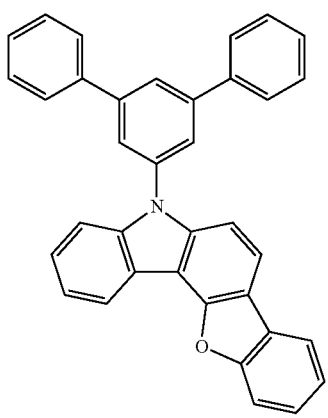
H43 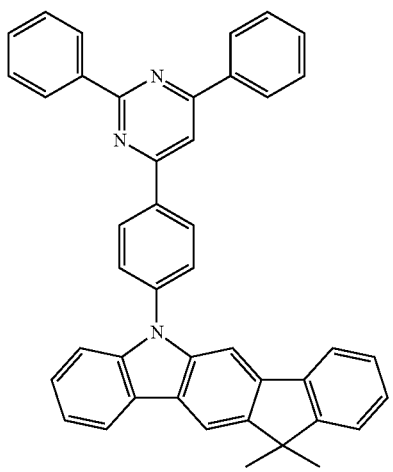
H44 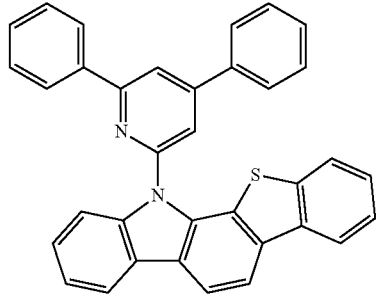
H45 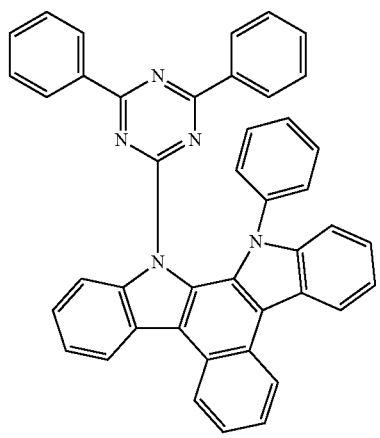
H46 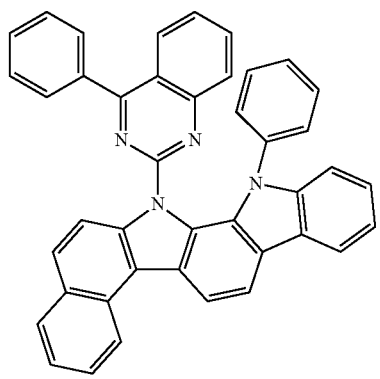
H47 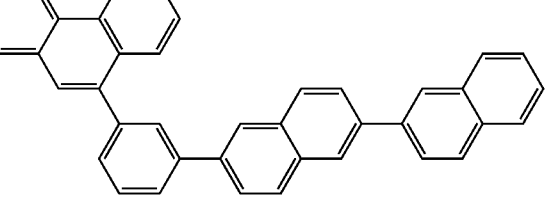
H48 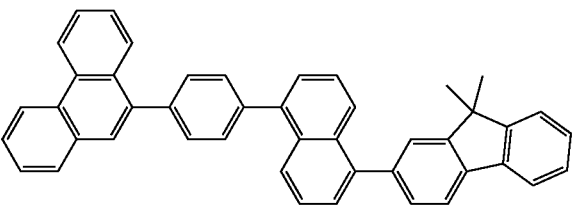

H49

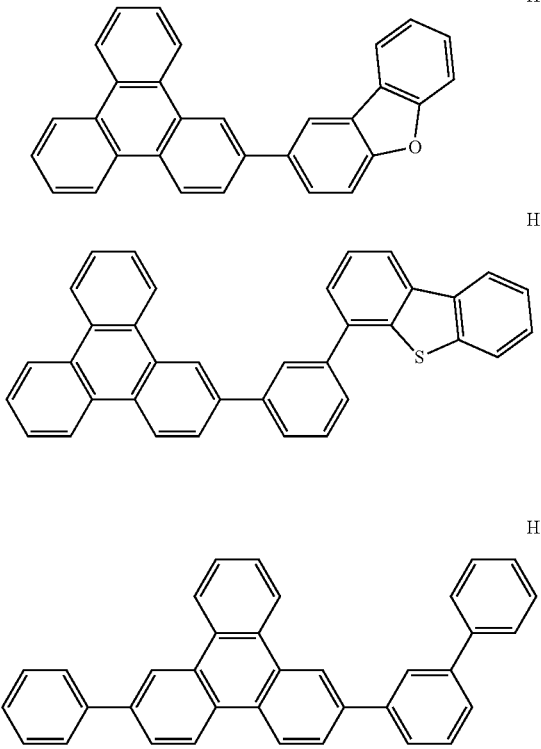

H50

H51

H52

H53

H54

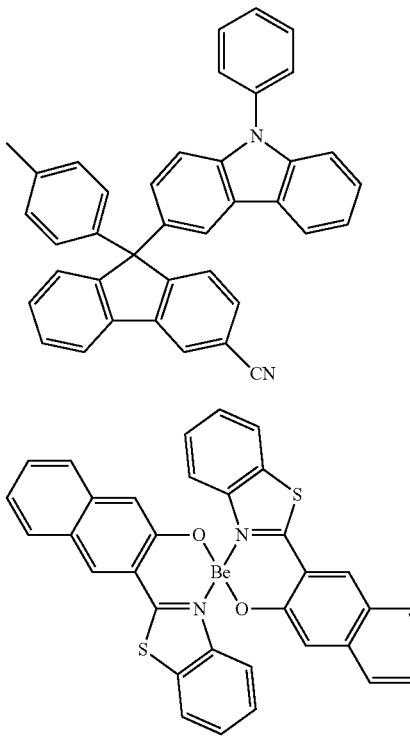

H55

In some embodiments, the host may include at least one selected from a silicon-containing compound (e.g., BCPDS or the like) and a phosphine oxide-containing compound (e.g., POPCPA or the like).

The host may include one type of compounds only or two or more different types of compounds (for example, BCPDS and POPCPA). As such, embodiments may be modified in various ways.

The phosphorescent dopant may include an organometallic complex represented by Formula 401:

$$M(L_{401})_{xc1}(L_{402})_{xc2}$$ Formula 401

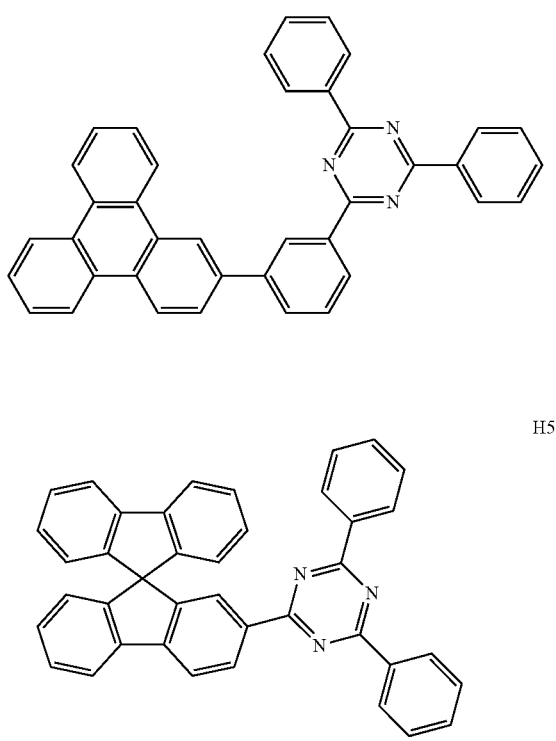

Formula 402 wherein, in Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, and xc1 may be 1, 2, or 3, and when xc1 is 2 or greater, at least two $L_{401}$(s) may be substantially identical to or different from each other, $L_{402}$ may be an organic ligand, and xc2 may be an integer selected from 0 to 4, and when xc2 is 2 or greater, at least two $L_{402}$(s) may be substantially identical to or different from each other, $X_{401}$ to $X_{404}$ may each independently be a nitrogen or a carbon, $X_{401}$ and $X_{403}$ may be bound to each other via a single bond or a double bond, $X_{402}$ and $X_{404}$ may be bound to each other via a single bond or a double bond, $A_{401}$ and $A_{402}$ may each independently be a $C_5$-$C_{60}$ carbocyclic group or a $C_1$-$C_{60}$ heterocyclic group, $X_{405}$ may be selected from a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', and *=C=*', wherein $Q_{411}$ and $Q_{412}$ may be selected from hydrogen, deuterium, a $C_1$-$C_{20}$ alkyl group, a $C_1$-$C_{20}$ alkoxy group, a phenyl group, a biphenyl group, a terphenyl group, and a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer from 0 to 10, and

* and *' in Formula 402 each indicate a binding site to M in Formula 401.

In an embodiment, in Formula 402, $A_{401}$ and $A_{402}$ may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In one or more embodiments, in Formula 402, i) $X_{401}$ may be nitrogen, and $X_{402}$ may be carbon, or ii) $X_{401}$ and $X_{402}$ may both be nitrogen.

In some embodiments, in Formula 402, $R_{401}$ and $R_{402}$ may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantyl group, a norbornanyl group, and a norbornenyl group;

a cyclopentyl group, a cyclohexyl group, an adamantyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but embodiments are not limited thereto.

In one or more embodiments, when xc1 in Formula 401 is 2 or greater, two $A_{401}$(s) of at least two $L_{401}$(s) may optionally be bound via $X_{407}$ as a linking group, or two $A_{402}$(s) may optionally be bound via $X_{408}$ as a linking group (see Compounds PD1 to PD4 and PD7). $X_{407}$ and $X_{408}$ may each independently be selected from a single bond, *—O—*', *—S—*', *—C(=O)—*', *—N($Q_{413}$)-*', *—C($Q_{413}$)($Q_{414}$)-*', and *—C($Q_{413}$)=C($Q_{414}$)-*', wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group, but embodiments are not limited thereto.

$L_{402}$ in Formula 401 may be any suitable monovalent, divalent, or trivalent organic ligand. For example, $L_{402}$ may be selected from halogen, diketone (e.g., acetylacetonate), a carboxylic acid (e.g., picolinate), —C(=O), isonitrile, —CN, and phosphorus-containing substance (e.g., phosphine or phosphite), but embodiments are not limited thereto.
In some embodiments, the phosphorescent dopant compound may include, for example, at least one selected from Compounds PD1 to PD25, but embodiments are not limited thereto:
PD1
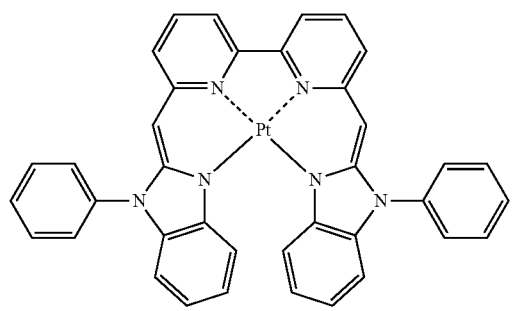
PD2
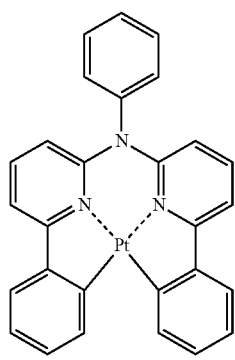
PD3
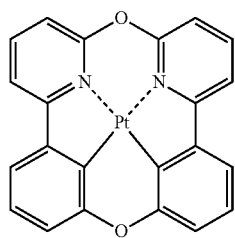
PD4
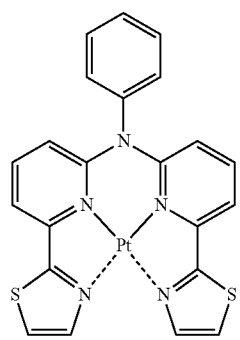
PD5
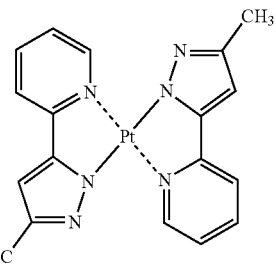
PD6
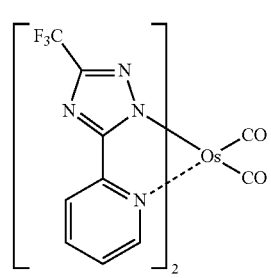
PD7
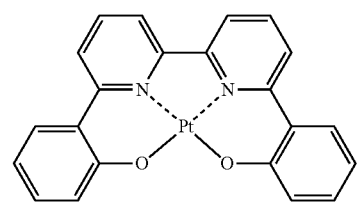
PD8
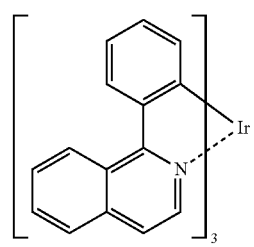
PD9
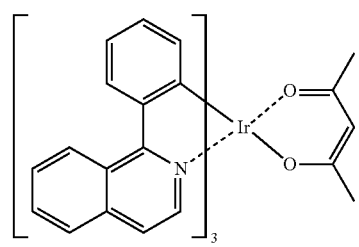
PD10
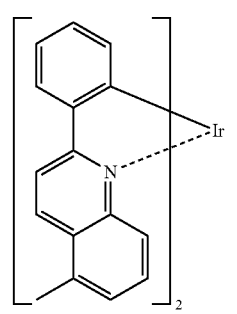

PD11
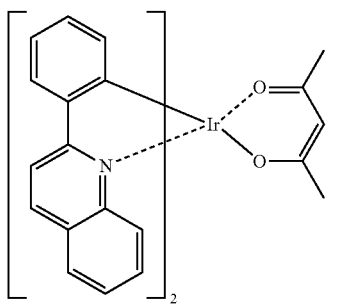
PD12
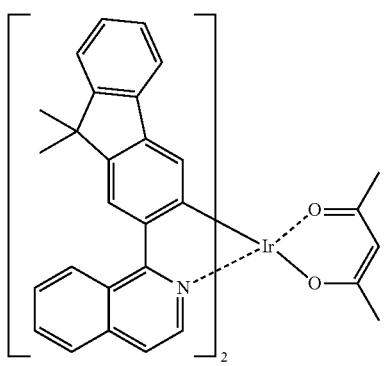
PD13
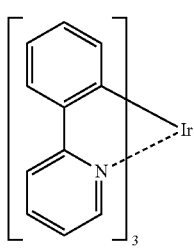
PD14
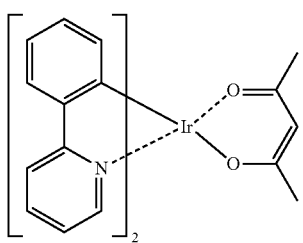
PD15
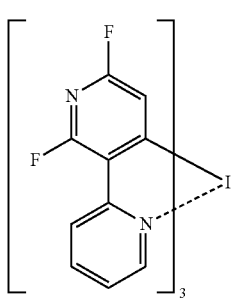
PD16
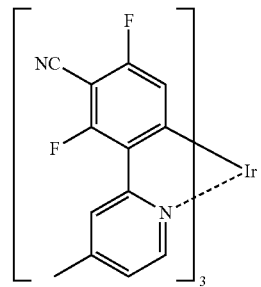
PD17
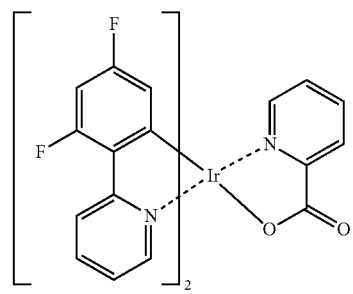
PD18
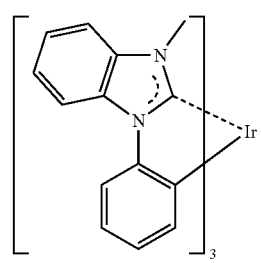
PD19
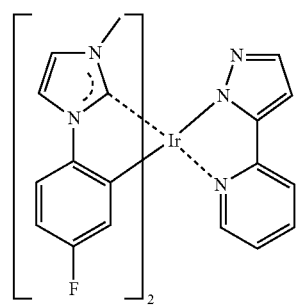
PD20
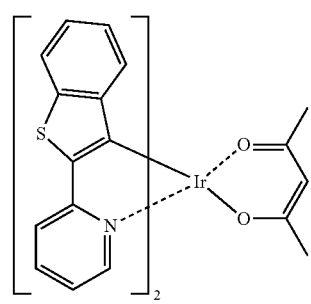

PD21 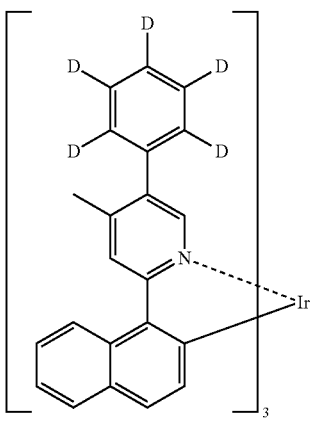

PD22 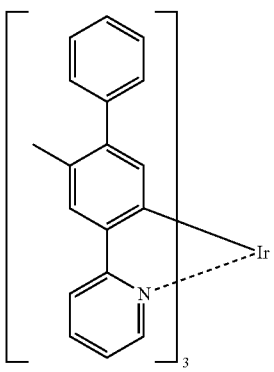

PD23 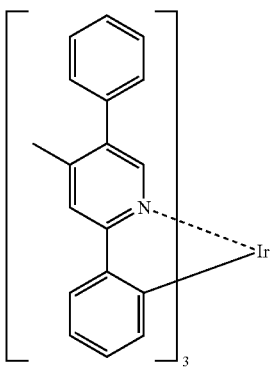

PD24 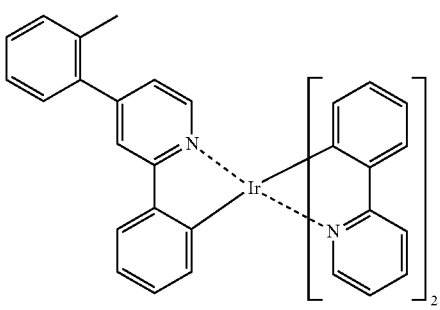

PD25 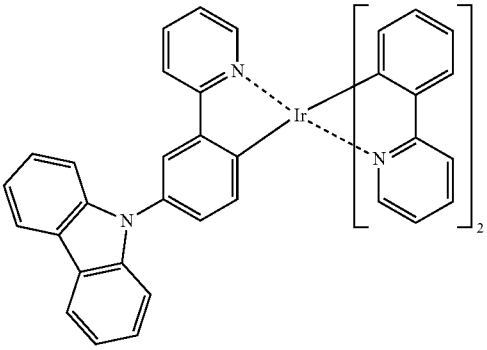

The fluorescent dopant may include an arylamine compound or a styrylamine compound.

In some embodiments, the fluorescent dopant may include a compound represented by Formula 501:

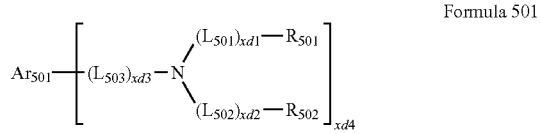

Formula 501 wherein, in Formula 501, $Ar_{501}$ may be selected from a substituted or unsubstituted $C_5$-$C_{60}$ carbocyclic group and a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

xd1 to xd3 may each independently be an integer from 0 to 3.

$R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer from 1 to 6.

In some embodiments, in Formula 501, $Ar_{501}$ may be selected from: a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, in Formula 501, $L_{501}$ to $L_{503}$ may each independently be selected from: a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In some embodiments, in Formula 501, $R_{501}$ and $R_{502}$ may each independently be selected from: a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), wherein $Q_{31}$ to $Q_{33}$ may be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xd4 in Formula 501 may be 2, but embodiments are not limited thereto.

In some embodiments, the fluorescent dopant may be selected from Compounds FD1 to FD22:

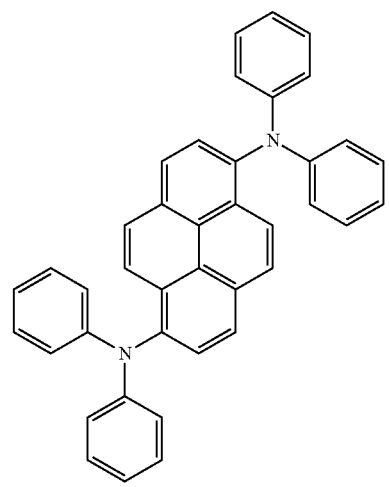

FD1

FD2
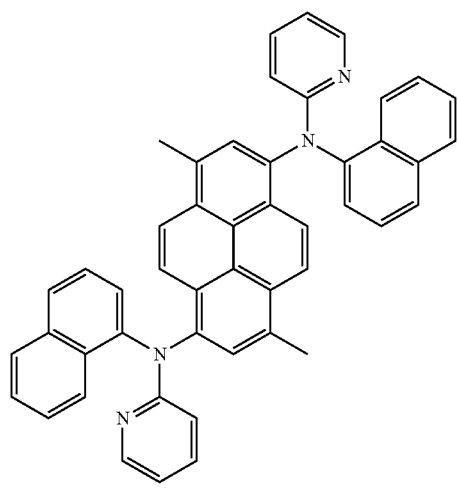
FD3
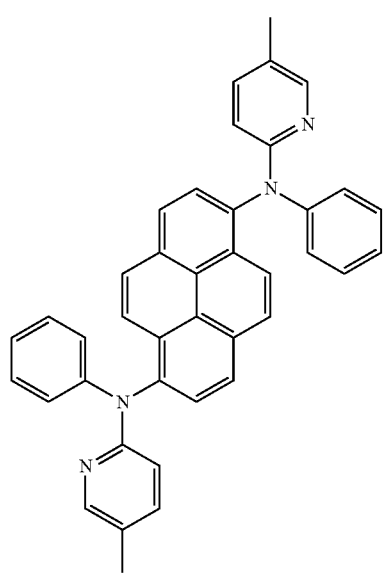
FD4
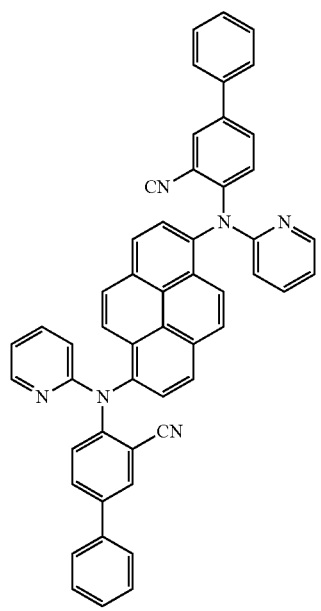
FD5
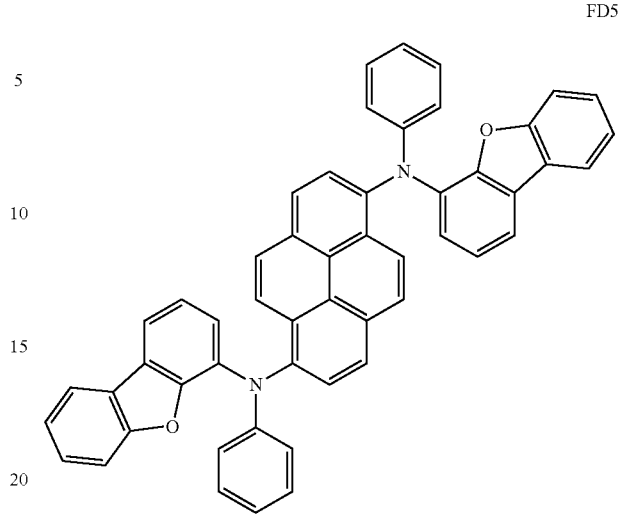
FD6
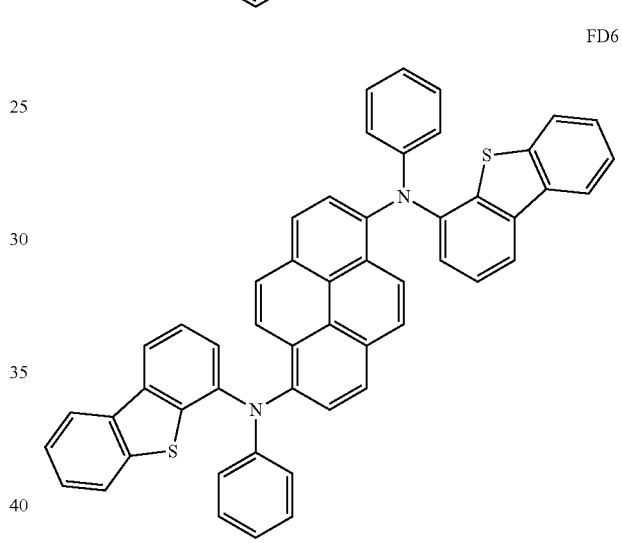
FD7
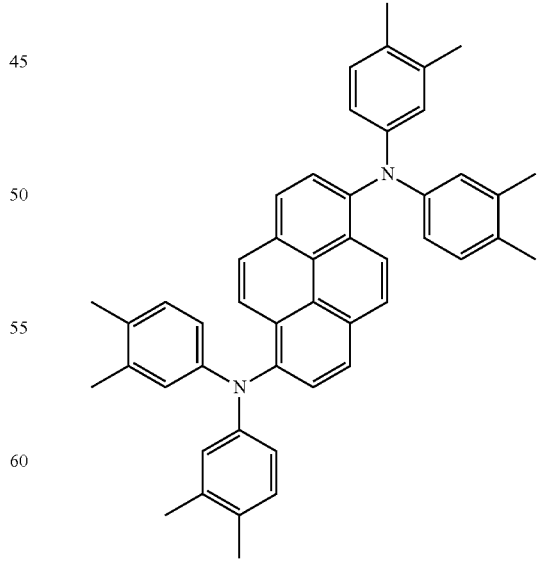

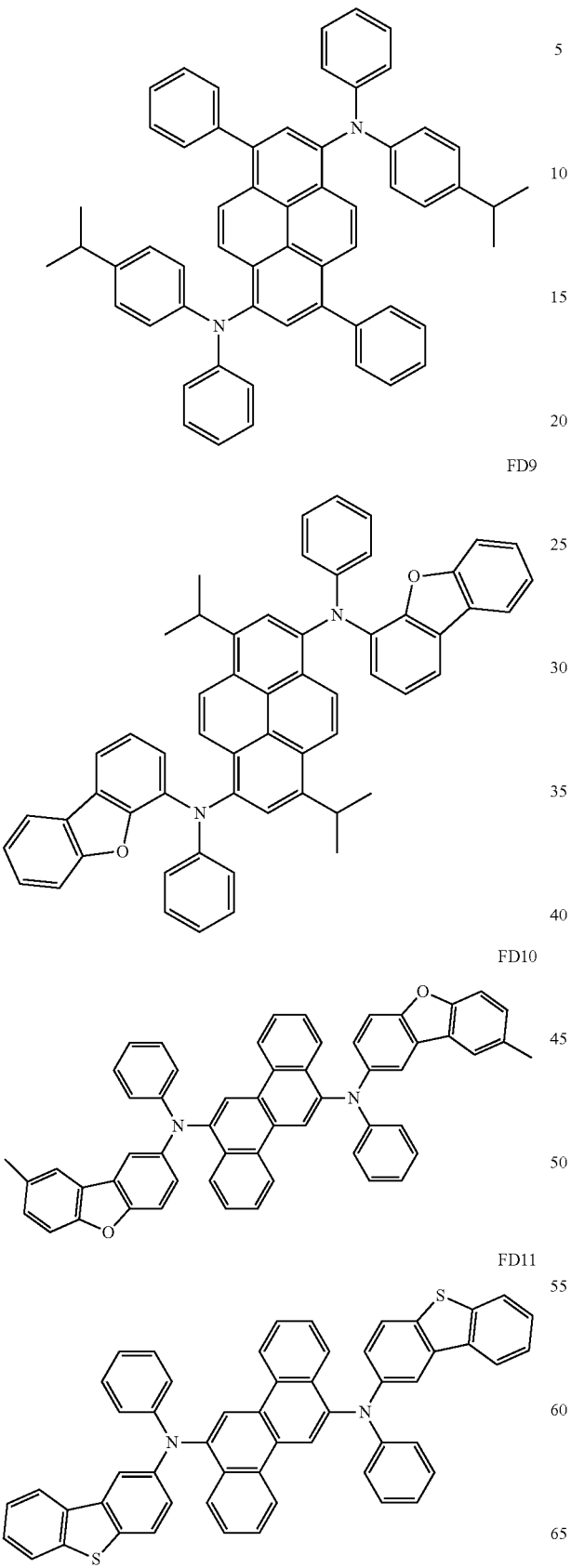
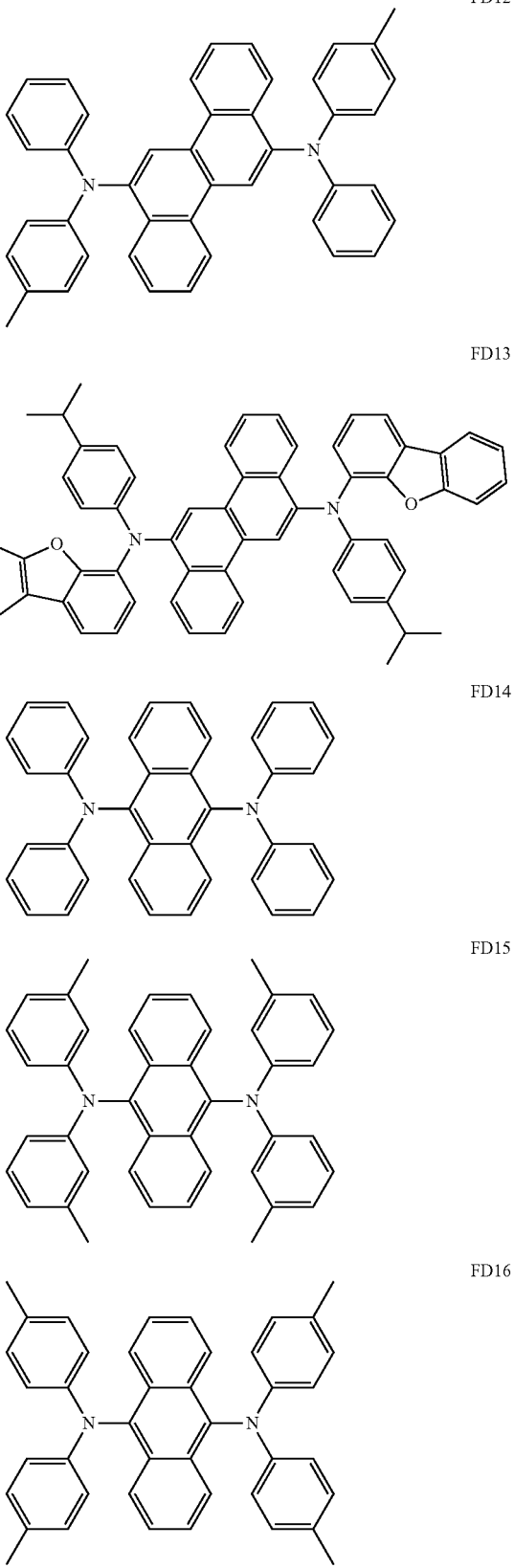

FD17
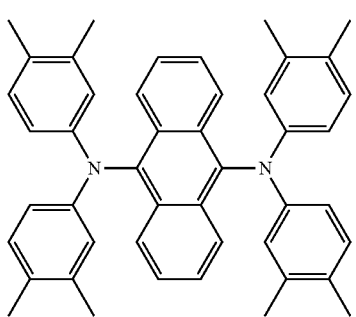
FD18
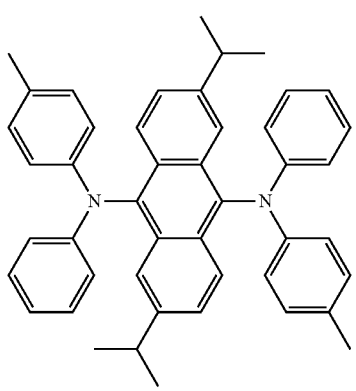
FD19
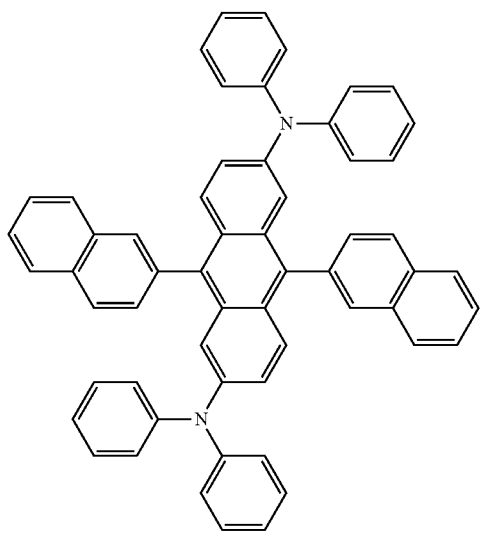
FD20
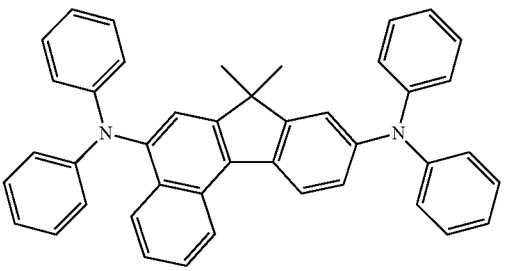
FD21
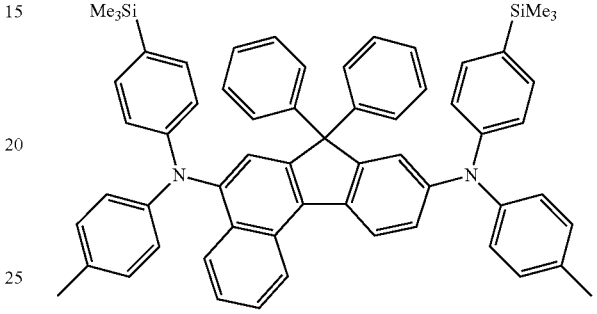
FD22
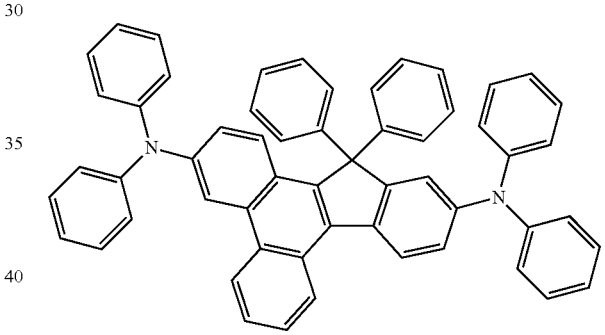
In some embodiments, the fluorescent dopant may be selected from the following compounds, but embodiments are not limited thereto:
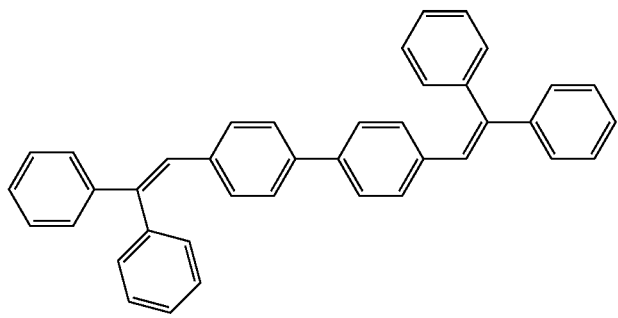
DPVBi

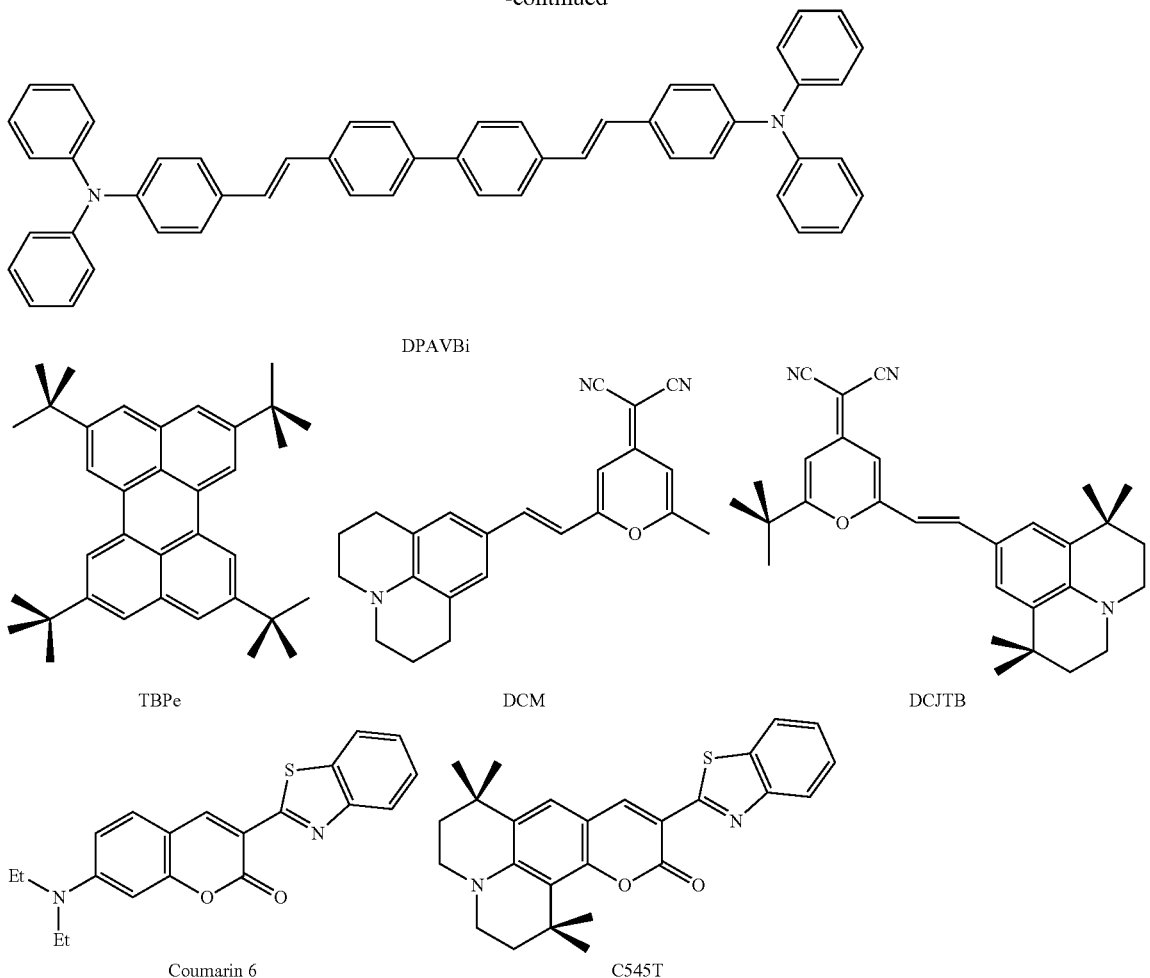

DPAVBi

TBPe

DCM

DCJTB

Coumarin 6

C545T

In some embodiments, the delayed fluorescent dopant may include a compound represented by Formula 502:

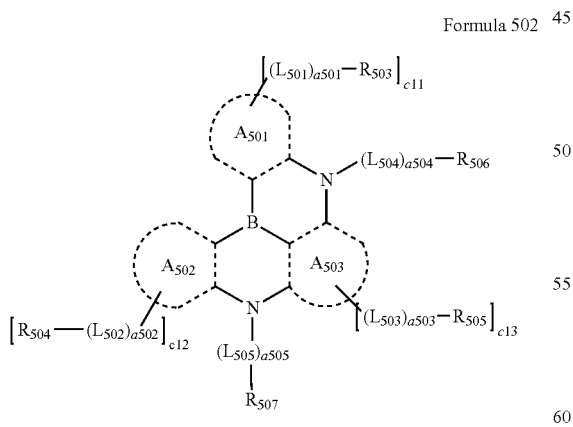

Formula 502 wherein, in Formula 502, $A_{501}$ to $A_{503}$ may each independently be selected from a $C_5$-$C_{60}$ carbocyclic group and a $C_1$-$C_{60}$ heterocyclic group, $L_{501}$ to $L_{505}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a501 to a505 may each independently be an integer from 0 to 3, $R_{503}$ to $R_{507}$ may each independently be selected from a substituted or unsubstituted $C_3$-$C_{10}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and c11 to c13 may each be an integer from 0 to 6.

In some embodiments, in Formula 502, $A_{501}$ to $A_{505}$ may each independently be selected from a benzene group, a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, an indenophenanthrene group, and a group represented by Formula 503:

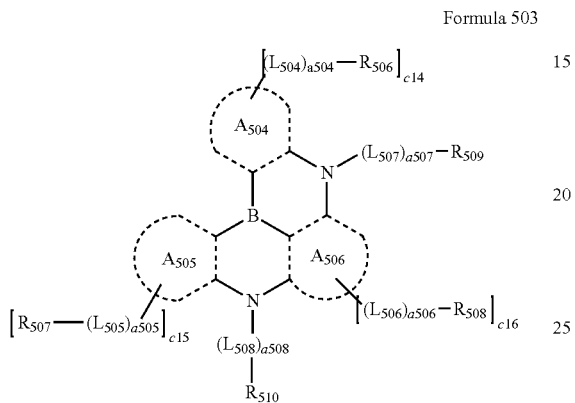

Formula 503 wherein, in Formula 503, $A_{504}$ to $A_{506}$ may each be understood by referring to the description of $A_{501}$ in Formula 502, $L_{504}$ to $L_{505}$ may each be understood by referring to the description of $L_{501}$ in Formula 502, a504 to a508 may each be understood by referring to the description of a501 in Formula 502, $R_{506}$ to $R_{510}$ may each be understood by referring to the description of $R_{503}$ in Formula 502, and c14 to c16 may each be understood by referring to the description of c11 in Formula 502.

In some embodiments, in Formula 502, $L_{501}$ to $L_{505}$ may respectively be understood by referring to the descriptions of $L_{501}$ to $L_{505}$ provided herein.

In some embodiments, in Formula 502, $R_{503}$ to $R_{507}$ may each independently be selected from:

a methyl group, an ethyl group, an n-propyl group, an iso-propyl group, an n-butyl group, iso-butyl group, a sec-butyl group, a tert-butyl group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a methyl group, an ethyl group, an n-propyl group, an iso-propyl group, an n-butyl group, iso-butyl group, a sec-butyl group, a tert-butyl group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), wherein $Q_{31}$ to $Q_{33}$ may be selected from a $C_1$-$C_{10}$ alkyl group, a $C_1$-$C_{10}$ alkoxy group, a phenyl group, a biphenyl group, a terphenyl group, and a naphthyl group.

In one or more embodiments, in Formula 502, c11 to c13 may each be 0 or 1, but embodiments are not limited thereto.

In some embodiments, the delayed fluorescent dopant compound may be selected from Compounds FD24 to FD26:

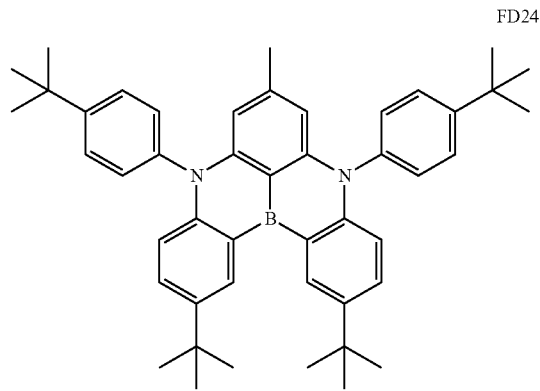

FD24

-continued

FD25

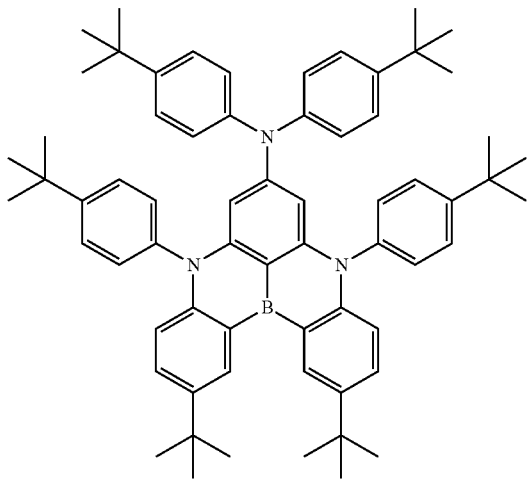

FD26

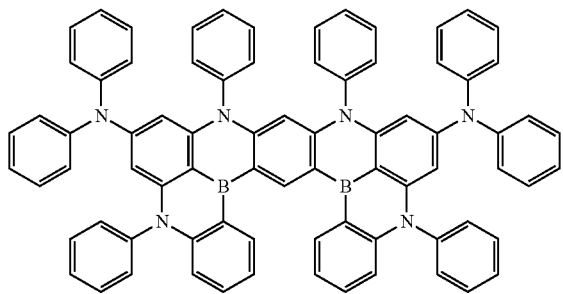

An emission layer of the quantum dot light-emitting device may include a quantum dot. That is, the quantum dot light-emitting device may include a quantum dot emission layer. The quantum dot emission layer may include a plurality of quantum dots (inorganic nanoparticles) arranged in a single layer or a plurality of layers.

The term "quantum dot" as used herein refers to a crystal of a semiconductor compound and may include any material emitting light of emission wavelengths of different lengths according to the size of the crystal. Accordingly, types of compounds constituting the quantum dot are not particularly limited.

In some embodiments, the quantum dot may include a semiconductor material selected from the group consisting of: a group III-VI semiconductor compound; a group I-III-VI semiconductor compound; a group II-VI semiconductor compound; a group III-V semiconductor compound; a group IV-VI semiconductor compound; a group IV element or compound; and any combination thereof.

In some embodiments, the group III-VI semiconductor compound may be selected from a binary compound such as $In_2S_3$. The group I-III-VI semiconductor compound may be selected from a ternary compound such as the group consisting of $AgInS$, $AgInS_2$, $CuInS$, or $CuInS_2$, and any compound thereof, but embodiments are not limited thereto.

The II-VI semiconductor compound may be selected from the group consisting of: a binary compound selected from the group consisting of CdSe, CdTe, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of CdZnSeS, CdZnSeTe, CdZnSTe, CdHgSeS, CdHgSeTe, CdHgSTe, HgZnSeS, HgZnSeTe, HgZnSTe, and a mixture thereof, but embodiments are not limited thereto.

In some embodiments, the III-V semiconductor compound may be selected from the group consisting of: a binary compound selected from the group consisting of GaN, GaP, GaAs, GaSb, AlN, AlP, AlAs, AlSb, InN, InP, InAs, InSb and a mixture thereof; a ternary compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, and a mixture thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof, but embodiments are not limited thereto.

In some embodiments, the IV-VI semiconductor compound may be selected from the group consisting of: a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof, but embodiments are not limited thereto.

For example, the Group IV element or compound may be selected from the group consisting of: a single element compound selected from Si, Ge, and any mixture thereof; and a binary compound selected from SiC, SiGe, and any mixture thereof, but embodiments are not limited thereto.

In this embodiment, the binary compound, the ternary compound, or the quaternary compound may be present in particles at a uniform concentration or in the same particle by being partially divided into different concentrations.

The quantum dot may have uniform single structure or a core-shell double structure. In some embodiments, the core-shell may include different materials. For example, materials constituting each of the core and the shell may include different semiconductor compounds.

The shell of the quantum dot may serve as a protective layer configured to prevent chemical denaturation of the core to maintain semiconductor characteristics and/or as a charging layer configured to impart electrophoretic characteristics to the quantum dot. The shell may be monolayer or multilayer. An interface between a core and a shell may have a concentration gradient where a concentration of elements present in the shell decreases toward the center.

Examples of the shell of the quantum dot include metal or nonmetal oxide, a semiconductor compound, or a combination thereof. In some embodiments, the metal or nonmetal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO or a ternary compound such as $MgAl_2O_4$, $CoFe_2O_4$, $NiFe_2O_4$, or $CoMn_2O_4$, but embodiments are not limited thereto. In some embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, but embodiments are not limited thereto.

The diameter of the quantum dot is not particularly limited. The diameter may be, for example, in a range of about 1 nm to about 10 nm. By adjusting the size of the quantum dot, the energy band gap may also be adjusted, thereby obtaining light of various wavelengths in the quantum dot emission layer. By using quantum dots of various sizes, a display that may emit light of various wavelengths may be realized.

In some embodiments, the size of the quantum dot may be selected such that the quantum dot may emit red, green, and/or blue light to enable color display. In addition, the size of the quantum dot may be selected such that the quantum dot may emit white light by combining various light of colors.

In addition, the quantum dot may be specifically, a spherical, pyramidal, multi-arm, or cubic nanoparticle, nanotube, nanowire, nanofiber, or nanoplate particle, but embodiments are not limited thereto.

The quantum dot may have a full width of half maximum (FWHM) of a spectrum of an emission wavelength of about 45 nm or less, about 40 nm or less, or about 30 nm or less. When the FWHM of the quantum dot is within this range, color purity or color reproducibility may be improved. In addition, because light emitted through the quantum dot is emitted in all directions, an optical viewing angle may be improved.

Quantum dots may be synthesized by a wet chemical process, a metal metal chemical vapor deposition process, a molecular beam epitaxy process, or any similar process.

The wet chemical process is a method of growing a particle crystal by adding a precursor material in an organic solvent. When the crystal grows, the organic solvent may naturally serve as a dispersant coordinated on the surface of the quantum dot crystal and control the growth of the crystal. Thus, the wet chemical method may be easier than the vapor deposition process such as the metal organic chemical vapor deposition (MOCVD) or the molecular beam epitaxy (MBE) process. Further, the growth of inorganic nanoparticles may be controlled with a lower manufacturing cost.

Electron Transport Region

The light-emitting device may include an electron transport region in direct contact with the second electrode or the charge generating unit.

In some embodiments, the electron transport region may include an inorganic insulating material.

In an embodiment, the inorganic insulating material may include a halide of an alkali metal, a halide of an alkaline earth metal, or any combination thereof.

In some embodiments, the inorganic insulating material may be a compound having a wide band gap of about 7 eV or greater. Accordingly, the inorganic insulating material may not substantially absorb light.

In addition, in some embodiments, the electron transport region may further include a metal dopant to be doped in the inorganic insulating material. The metal dopant, for example, may include at least one selected from an alkali metal, an alloy of an alkali metal, an alkaline earth metal, an alloy of an alkaline earth metal, a lanthanide metal, and an alloy of a lanthanide metal.

In some embodiments, the inorganic insulating material may be represented by Formula X, and the metal dopant may be represented by Formula Y:

$$A_{n1}B_{m1} \qquad \text{Formula X}$$

$$C \qquad \text{Formula Y}$$

wherein, in Formulae X and Y,

A and C may each independently include an alkali metal, an alkaline earth metal, a lanthanide metal, or any combination thereof, B may be halogen, n1 and m1 may each independently be an integer of 1 or greater such that a material of Formula X may be electrically neutral, and A and C may be different from each other.

For example, in Formulae X and Y, A may include Li, Na, K, Rb, Cs, or any combination thereof, B may include F, Cl, Br, I, or any combination thereof, n1 and m1 may each be 1, and C may be La, Ce, Pr, Nd, Pm, Sm, Eu, Gd, Tb, Dy, Ho, Er, Tm, Yb, Lu, or any combination thereof.

In some embodiments, the inorganic insulating material may include NaI, KI, RbI, CsI, NaCl, KCl, RbCl, CsCl, NaF, KF, RbF, CsF, or any combination thereof, and the metal dopant may include Mg, La, Ce, Pr, Nd, Pm, Sm, Eu, Gd, Tb, Dy, Ho, Er, Tm, Yb, Lu or any combination thereof.

In some embodiments, the metal dopant may be a compound having a low work function of about 2.6 eV or lower.

In some embodiments, the inorganic insulating material may be a compound having a wide band gap of about 7 eV or greater. Accordingly, the inorganic insulating material may not substantially absorb light.

Electron Injection Layer in Electron Transport Region

In some embodiments, an electron transport region included in an emission unit of the light-emitting device may include an electron injection layer. For example, the electron injection layer may be an n-type electron injection layer.

In some embodiments, the $m^{th}$ electron transport region may include an n-type electron injection layer, and the n-type electron injection layer may include the inorganic insulating material.

In some embodiments, the n-type electron injection layer may consist of the inorganic insulating material. In this embodiment, the electron injection layer may not include a material other than the inorganic insulating material.

In some embodiments, the n-type electron injection layer may further include a metal dopant.

In some embodiments, for example, the n-type electron injection layer may consist of the inorganic insulating material and the metal dopant.

In some embodiments, the n-type electron injection layer may be in direct contact with the second electrode. For example, as illustrated in FIGS. 3 and 4, the $m^{th}$ electron transport region ET(m) may include an n-type electron injection layer, wherein the n-type electron injection layer may be adjacent to the second electrode 190 and may include an inorganic insulating material.

In some embodiments, the n-type electron injection layer may be in direct contact with the charge generating unit. For example, as illustrated in FIG. 4, the $(m-1)^{th}$ electron transport region ET(m−1) may include an n-type electron injection layer, wherein the n-type electron injection layer may be in direct contact with the $(m-1)^{th}$ charge generating unit CGU(m−1) and may include an inorganic insulating material.

In a light-emitting device according to one or more embodiments, the n-type electron injection layer may consist of an inorganic compound and not include an organic material, thereby facilitating charge generation and migration at an interface with a second electrode or a charge generating unit and preventing deterioration of materials at interfaces between each of the layers and an increase in driving voltage. Therefore, the light-emitting device may provide improved lifespan and/or luminance.

The volume of the inorganic insulating material in the electron transport region may be equal to or greater than the volume of the metal dopant. In some embodiments, the volume of the metal dopant may be in a range of about 0 parts by volume to about 40 parts by volume, based on 100 parts by volume of the electron injection layer.

In some embodiments, a volume ratio of the inorganic insulating material to the metal dopant may be in a range of about 100:0 to about 70:30. When the volume ratio is within this range, optical absorption by a narrow band gap of the inorganic insulating material may be complemented by the metal dopant.

The thickness of the n-type electron injection layer may be in a range of about 0.1 nm to about 5 nm. When the thickness of n-type electron injection layer is within this range, satisfactory electron injection characteristics may be obtained without a substantial increase in the driving voltage.

Electron Transport Layer in Electron Transport Region

The light-emitting device may further include an electron transport layer in an electron transport region of the emission unit. In some embodiments, the light-emitting device may include an electron transport layer that is in direct contact with the emission layer.

The electron transport layer may include at least one selected from electron transporting organic compounds.

In some embodiments, the electron transport layer may include a halide of an alkali metal, a halide of an alkaline earth metal, a halide of a lanthanide metal, or any combination thereof.

In some embodiments, as illustrated in FIGS. 3 and 4, the $m^{th}$ electron transport region ET(m) may include a $m^{th}$ electron transport layer adjacent to the $m^{th}$ emission layer EML(m), and the $m^{th}$ electron transport layer may include an electron transporting organic compound.

In some embodiments, the electron transport layer may further include a halide of an alkali metal, a halide of an alkaline earth metal, a halide of a lanthanide metal, an organic complex of an alkali metal, an organic complex of an alkaline earth metal, an organic complex of a lanthanide metal, or any combination thereof.

In the present specification, the "electron transporting organic compound" refers to a metal-free compound including at least one π electron-depleted nitrogen-containing ring.

The term "π electron-depleted nitrogen-containing ring" as used herein refers to a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which at least two 5-membered to 7-membered heteromonocyclic groups, each having at least one *—N=*' moiety, are condensed, or iii) a heteropolycyclic group in which at least one of a 5-membered to 7-membered heteromonocyclic group, each having at least one *—N=*' moiety, is condensed with at least one $C_5$-$C_{60}$ carbocyclic group.

Examples of the π electron-depleted nitrogen-containing ring may include imidazole, pyrazole, thiazole, isothiazole, oxazole, isoxazole, pyridine, pyrazine, pyrimidine, pyridazine, indazole, purine, quinoline, isoquinoline, benzoquinoline, phthalazine, naphthyridine, quinoxaline, quinazoline, cinnoline, phenanthridine, acridine, phenanthroline, phenazine, benzimidazole, isobenzothiazole, benzoxazole, isobenzoxazole, triazole, tetrazole, oxadiazole, triazine, thiadiazole, imidazopyridine, imidazopyrimidine, and azacarbazole, but embodiments are not limited thereto.

In the present specification, in detail, the "electron transporting organic compound" may include a compound represented by Formula 601:

$$[Ar_{601}]_{xe11}\text{-}[(L_{601})_{xe1}\text{-}R_{601}]_{xe21} \quad \text{Formula 601}$$

wherein, in Formula 601, $Ar_{601}$ may be selected from a substituted or unsubstituted $C_5$-$C_{60}$ carbocyclic group and a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_{601})(Q_{602})(Q_{603})$, —$C(=O)(Q_{601})$, —$S(=O)_2(Q_{601})$, and —$P(=O)(Q_{601})(Q_{602})$, wherein $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one selected from $Ar_{601}$(s) in the number of xe11 and $R_{601}$(s) in the number of xe21 may include the π electron-depleted nitrogen-containing ring.

In some embodiments, in Formula 601, $Ar_{601}$ may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or greater, at least two Ar$_{601}$(s) may be bound via a single bond.

In one or more embodiments, Ar$_{601}$ in Formula 601 may be an anthracene group.

In one or more embodiments, a compound represented by Formula 601 may be represented by Formula 601-1:

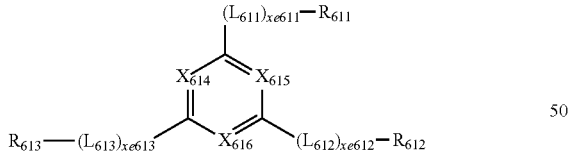

Formula 601-1 wherein, in Formula 601-1,
X$_{614}$ may be N or C(R$_{614}$), X$_{615}$ may be N or C(R$_{615}$), X$_{616}$ may be N or C(R$_{616}$), at least one selected from X$_{614}$ to X$_{616}$ may be N,
L$_{611}$ to L$_{613}$ may each independently be understood by referring to the description of L$_{601}$ provided herein,
xe611 to xe613 may each independently be understood by referring to the description of xe1 provided herein,
R$_{611}$ to R$_{613}$ may each independently be understood by referring to the description of R$_{601}$ provided herein, and
R$_{614}$ to R$_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In an embodiment, in Formulae 601 and 601-1, L$_{601}$ and Lon to L$_{613}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments are not limited thereto.

In one or more embodiments, xe1 and xe611 to xc613 in Formulae 601 and 601-1 may each independently be 0, 1, or 2.

In one embodiment, in Formulae 601 and 601-1, $R_{601}$ and $R_{611}$ to $R_{613}$ may each independently be selected from: a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{601}$)(Q$_{602}$), wherein Q$_{601}$ and Q$_{602}$ may respectively be understood by referring to the descriptions of Q$_{601}$ and Q$_{602}$ provided herein.

The electron transport region may include at least one compound selected from Compounds ET1 to ET36, but embodiments are not limited thereto:

ET1 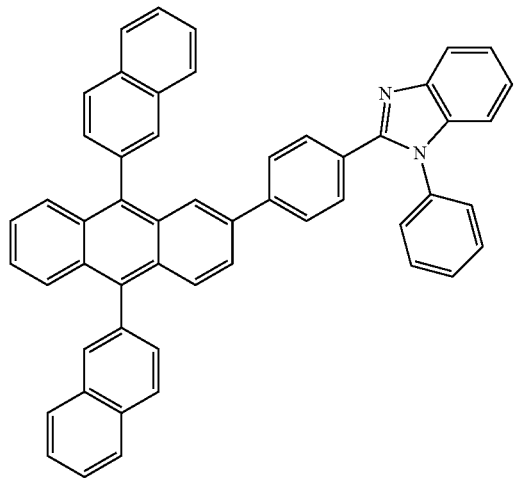
ET2 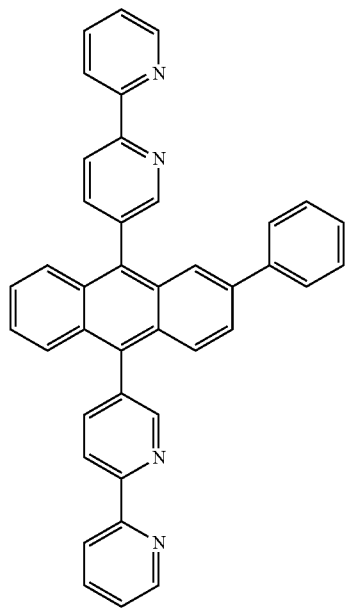
ET3 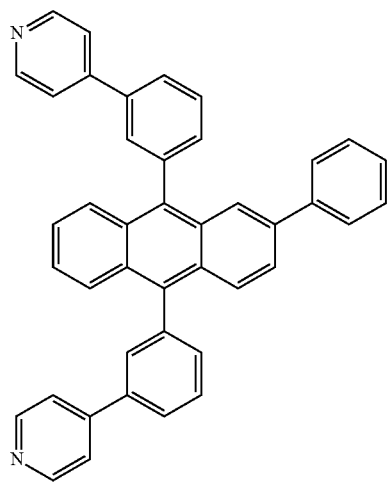
ET4 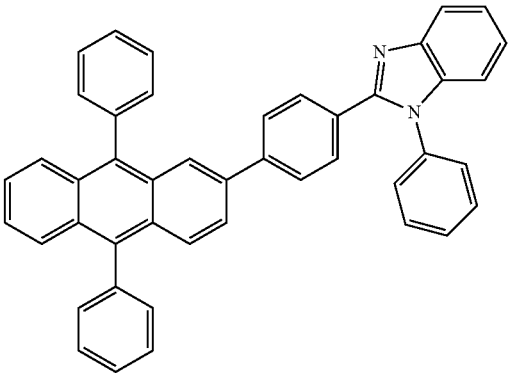
ET5 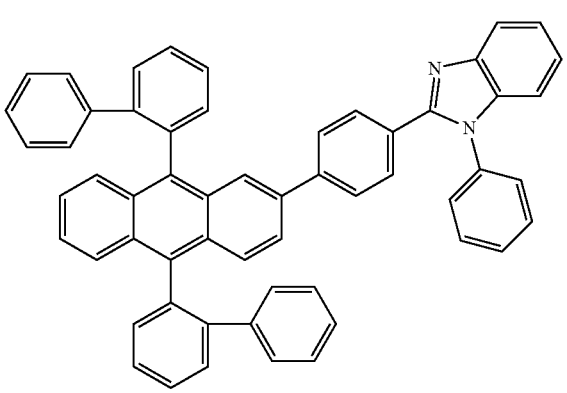
ET6 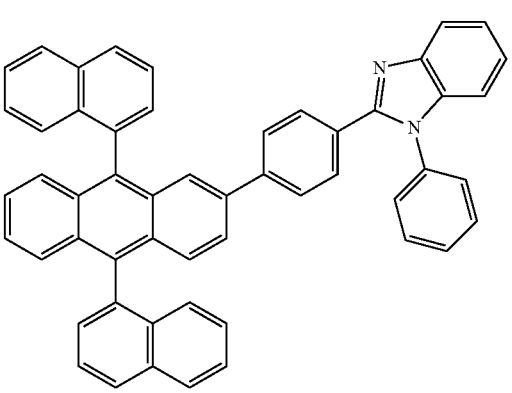

ET7
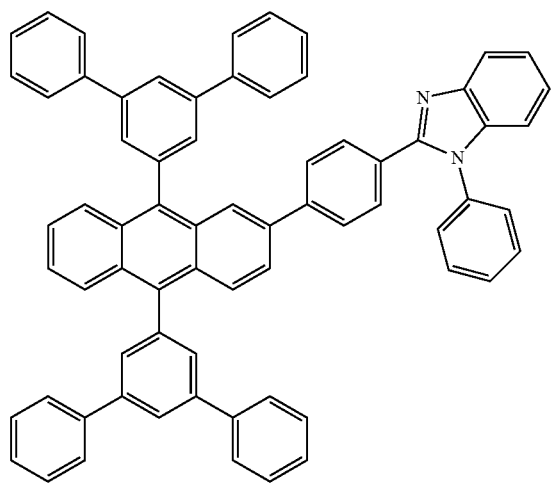
ET8
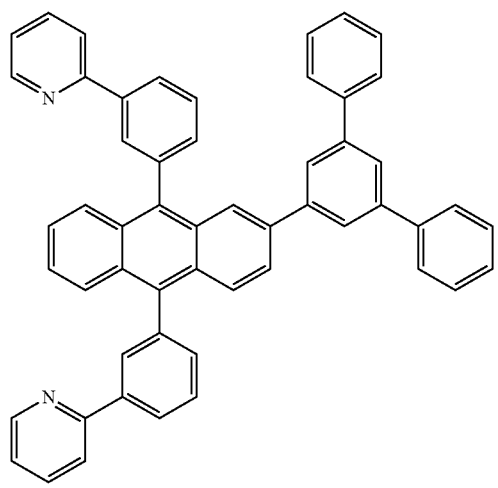
ET9
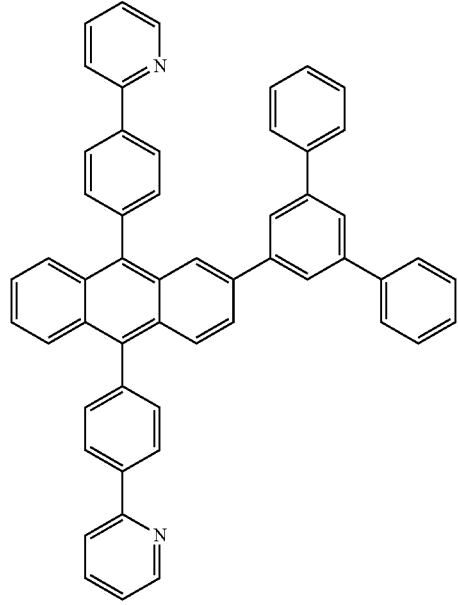
ET10
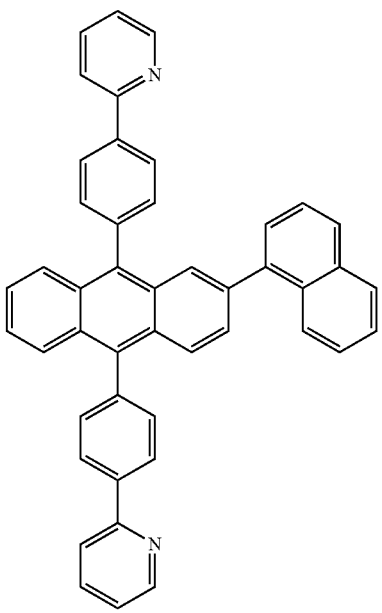
ET11
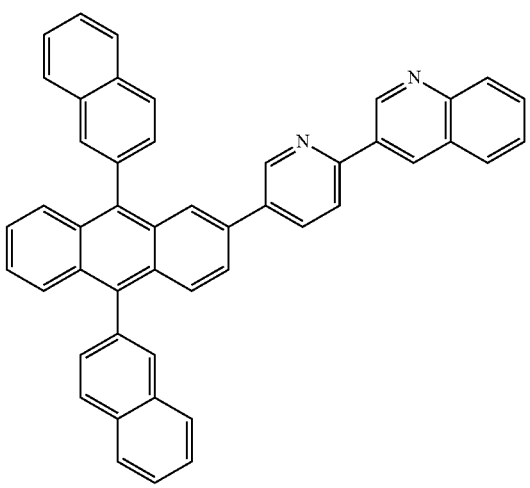
ET12
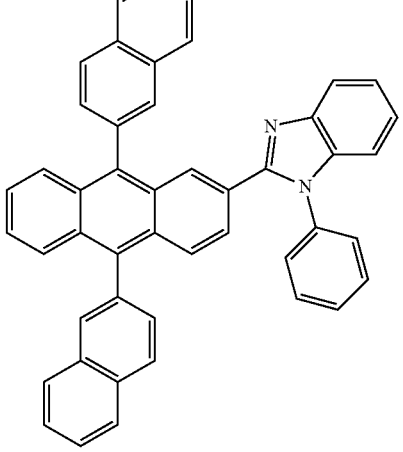

ET13
ET14
ET15
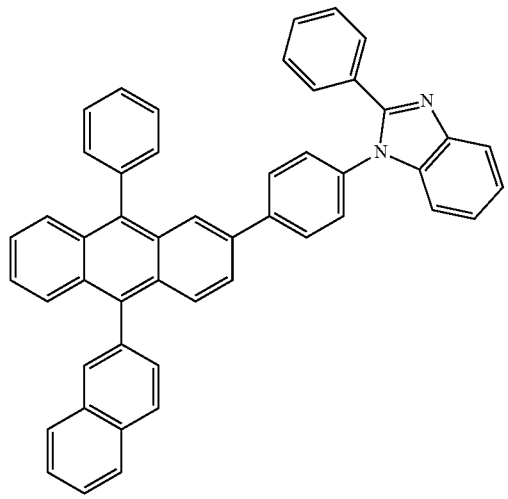
ET16
ET17
ET18
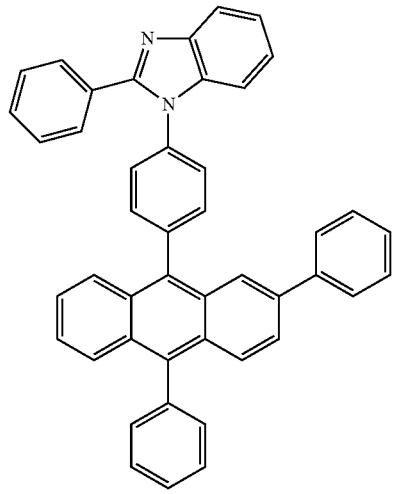
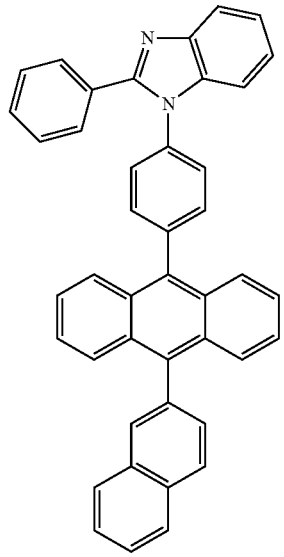
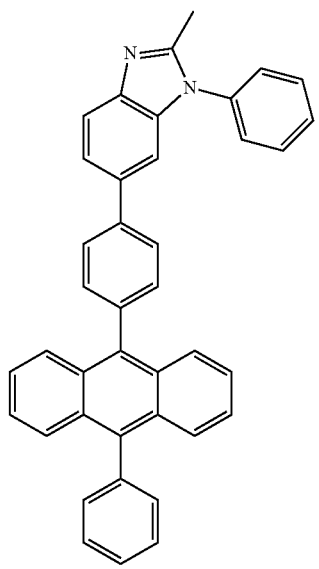

ET19
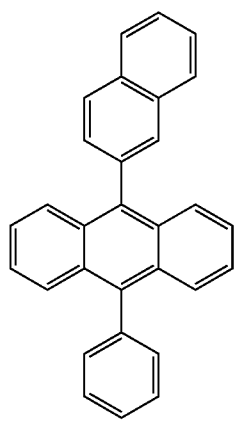
ET20
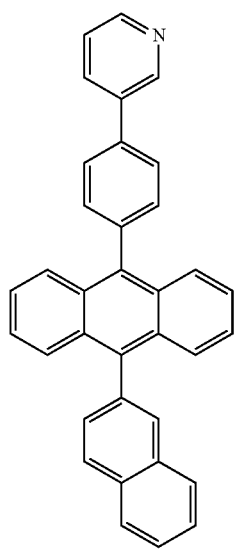
ET21
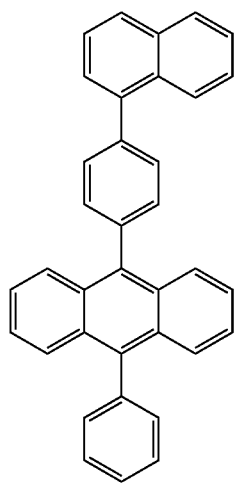
ET22
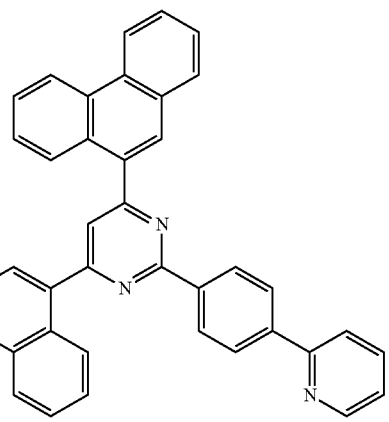
ET23
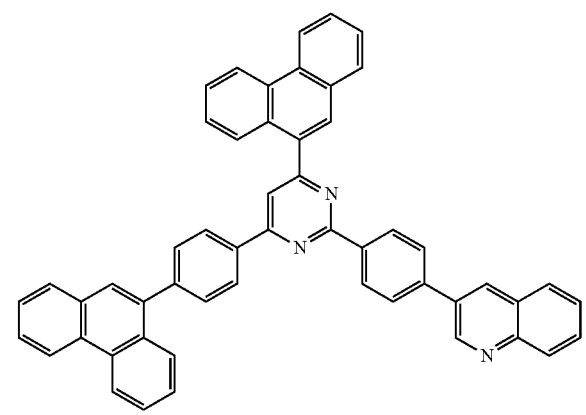
ET24
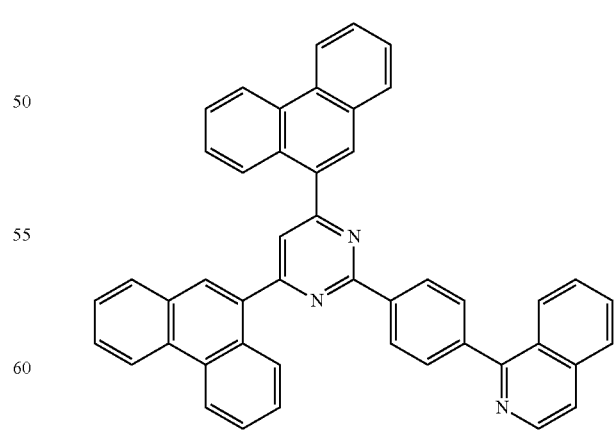

ET25
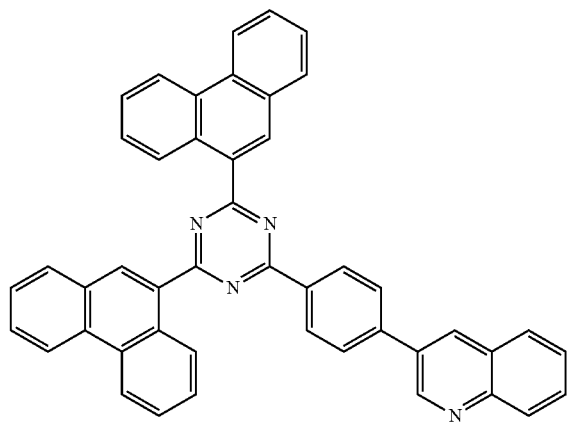
ET26
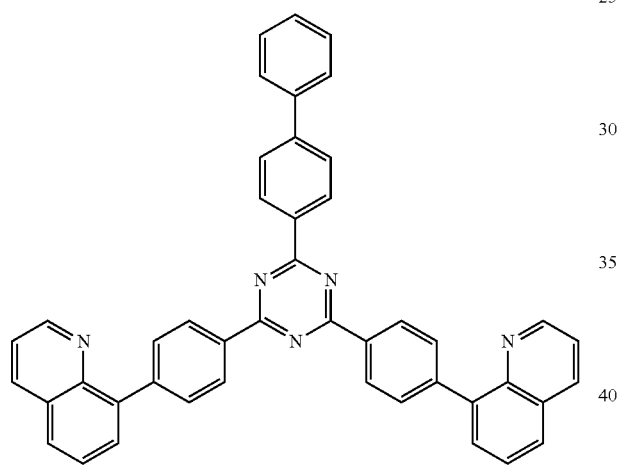
ET27
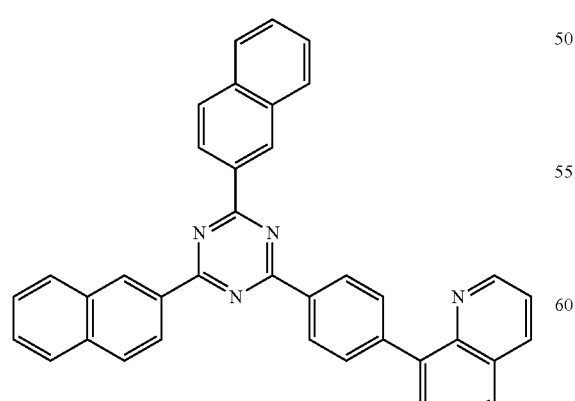
ET28
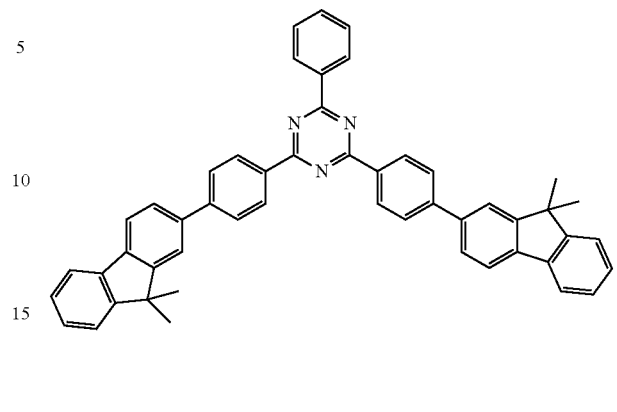
ET29
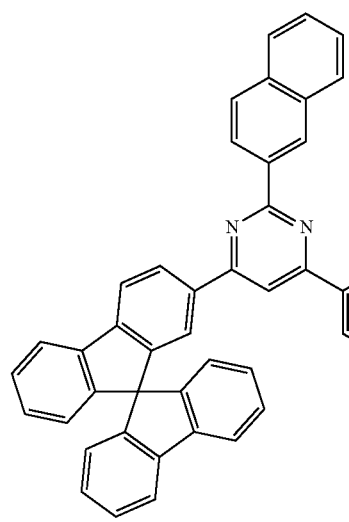
ET30
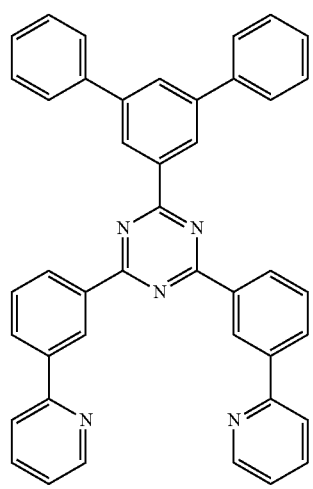

ET31
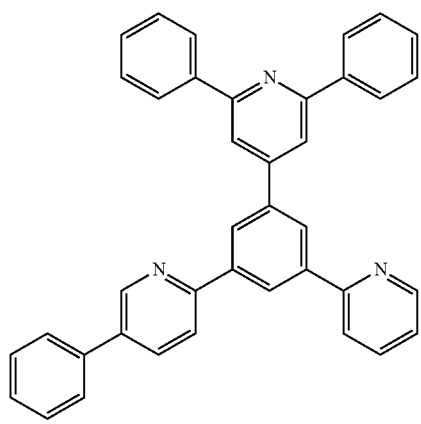
ET32
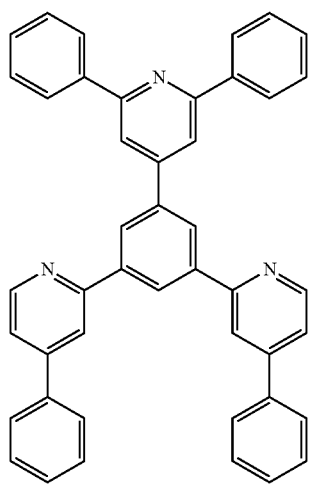
ET33
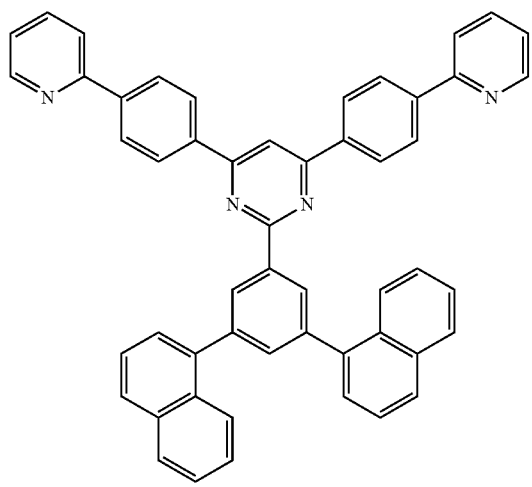
ET34
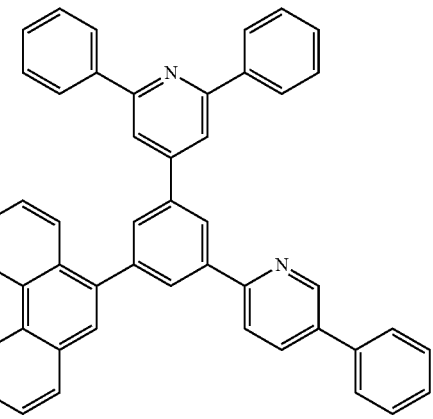
ET35
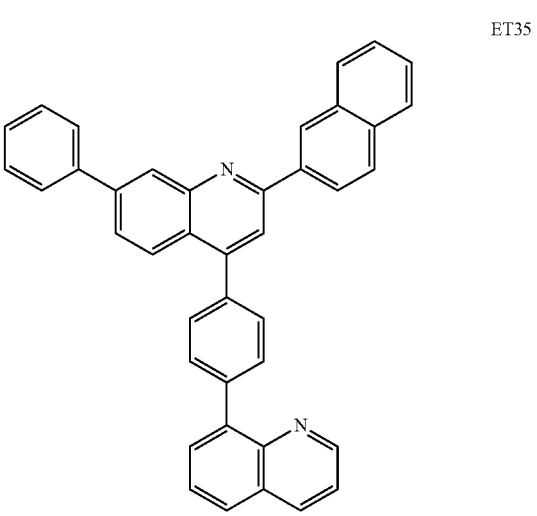
ET36
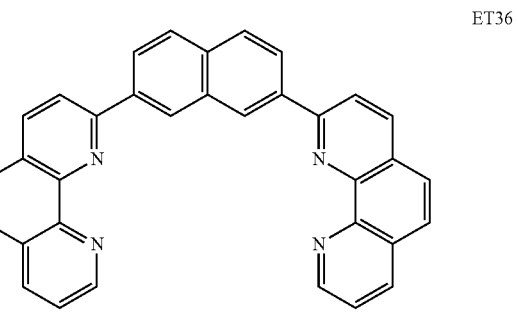
In some embodiments, the electron transport region may include at least one compound selected from 2,9-dimethyl-4,7-diphenyl-1,10-phenanthroline (BCP), 4,7-diphenyl-1,10-phenanthroline (Bphen), Alq$_3$, BAlq, 3-(biphenyl-4-yl)-5-(4-tert-butylphenyl)-4-phenyl-4H-1,2,4-triazole (TAZ), and NTAZ:

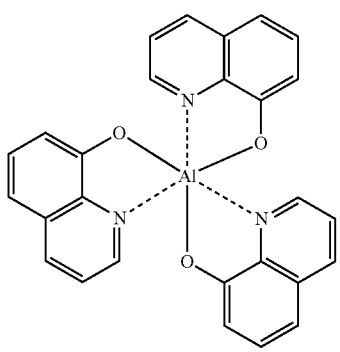
Alq₃

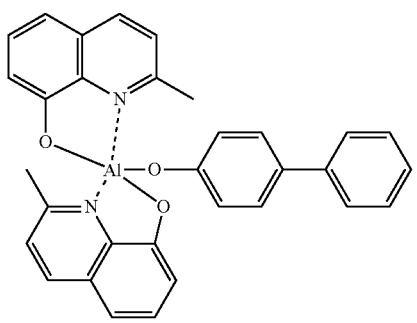
BAlq

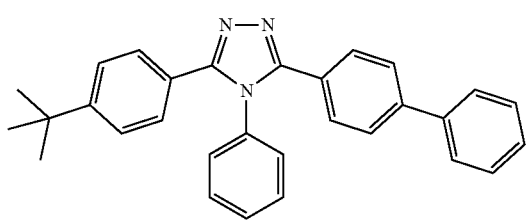
TAZ

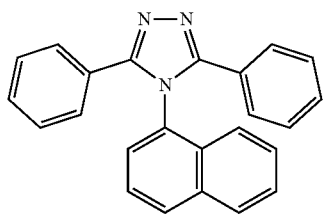
NTAZ

In some embodiments, the electron transport layer may further include a metal-containing material.

In some embodiments, the electron transport layer may include the electron transporting organic compound and the metal-containing material, and the electron transporting organic compound may be included in an amount of 50 parts by volume or greater, or about 50 parts by volume to about 99 parts by volume, based on 100 parts by volume of the electron transport layer.

The thickness of the electron transport layer may be in a range of about 0.1 nm to about 10 nm. When the thickness of electron transport layer is within this range, satisfactory electron transporting characteristics may be obtained without a substantial increase in the driving voltage.

Metal-Containing Material in Electron Transport Region

The electron transport region may further include a material containing metal, in addition to the materials described above. In some embodiments, the electron transport region may further include a metal-containing material, and the metal-containing material may include at least one selected from an alkali metal complex and an alkaline earth metal complex.

Each ligand coordinated with the metal ion of the alkali metal complex and the alkaline earth metal complex may independently be selected from hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, and cyclopentadiene, but embodiments are not limited thereto.

For example, the metal-containing material may include a Li complex. The Li complex may include, e.g., Compound ET-D1 (LiQ) or Compound ET-D2:

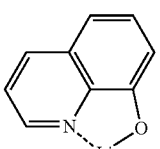
ET-D1

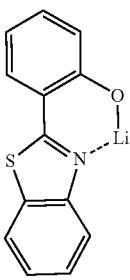
ET-D2

Embodiments include a second electrode 190 as described herein.

The second electrode 190 may be on the $m^{th}$ emission unit described above. In an embodiment, the second electrode 190 may be a cathode that is an electron injection electrode. In this embodiment, a material configured to form the second electrode 190 may be a material having a low work function, for example, a metal, an alloy, an electrically conductive compound, or a combination thereof.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments are not limited thereto. The second electrode 190 may be a transmissive electrode, a semi-transmissive electrode, or a reflective electrode.

The second electrode 190 may have a single-layered structure, or a multi-layered structure including two or more layers.

The thickness of the second electrode 190 may be in a range of about 5 nm to about 20 nm. When the thickness of second electrode 190 is within this range, optical absorption in the second electrode 190 may be minimized, and satisfactory electron injection characteristics may be obtained without a substantial increase in the driving voltage.

Various apparatuses may be formed from the materials discussed herein. The light-emitting device described above may be applicable to various devices. According to one or more embodiments, a device may include the light-emitting device.

For example, the apparatus may be a light-emitting apparatus, an authentication apparatus, or an electronic apparatus, but embodiments are not limited thereto.

Embodiments include an emission apparatus as described herein.

Figure 5:
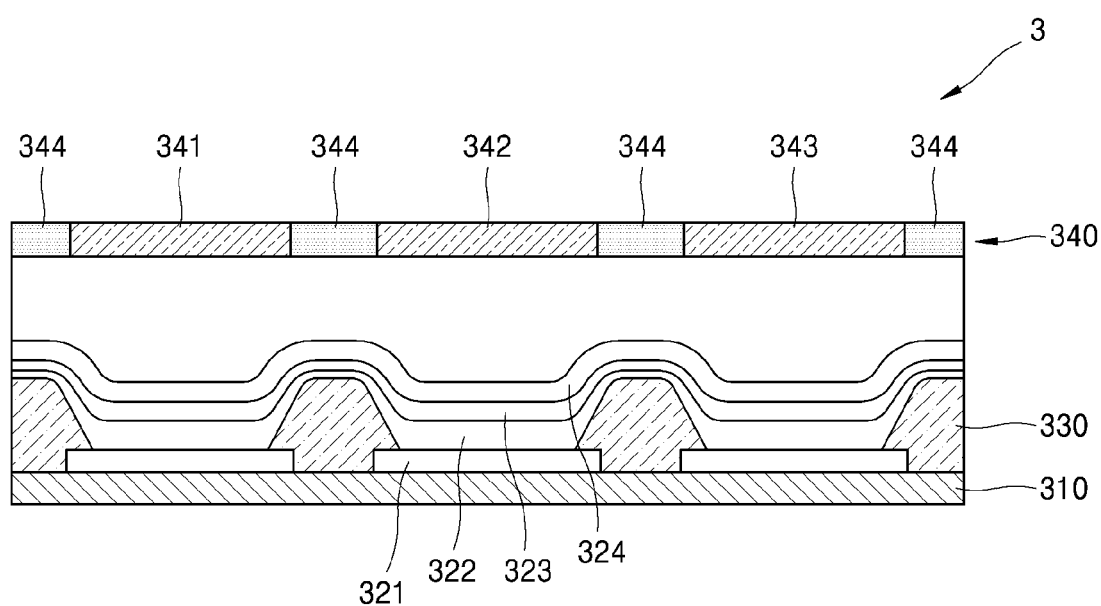
FIG. 5 is a schematic cross-sectional view illustrating an emission apparatus according to an embodiment.

Referring to FIG. 5, an emission apparatus 3 according to an embodiment will be described. In the emission apparatus 3, a color filter 340 may be disposed on at least one traveling direction of light emitted from the light-emitting device 1.

In some embodiments, the color filter 340 may be directly bonded to the light-emitting device via a bonding layer or the like. In some embodiments, the color filter 340 may be spaced apart from the light-emitting device. For example, a charging layer including an insulating layer including a transparent material having a transparent property or an air layer may be between the color filter 340 and the light-emitting device.

For example, the emission apparatus 3 may include a first electrode 321, a first emission unit 322, a first charge generating unit (not illustrated), a second emission unit 323, and a second electrode 324. In some embodiments, the first emission unit 322 and the second emission unit 323 may each emit blue light, but embodiments are not limited thereto.

A first substrate 310 of the emission apparatus 3 may include a plurality of sub-pixel areas, and the color filter 340 may include a plurality of color filter areas 341, 342, and 343 respectively corresponding to the plurality of sub-pixel areas. A pixel-defining film 330 may be disposed between the plurality of sub-pixel areas to define each sub-pixel area. The color filter 340 may include light blocking patterns 344 between the plurality of color filter areas 341, 342, and 343.

The plurality of color filter areas 341, 342, and 343 may include a first color filter area 341 emitting first color light; a second color filter area 342 emitting second color light; and a third color filter area 343 emitting a third color light, and the first color light, the second color light, and the third color light may have different maximum emission wavelengths. In some embodiments, the first color light may be red light, the second color light may be green light, and the third color light may be blue light, but embodiments are not limited thereto.

In some embodiments, the plurality of color filter areas 341, 342, and 343 may each include a quantum dot, but embodiments are not limited thereto. In some embodiments, the first color filter area 341 may include a red quantum dot, the second color filter area 342 may include a green quantum dot, and the third color filter area 343 may not include a quantum dot.

The quantum dot may be understood by referring to the description of the quantum dot provided herein.

The first color filter area 341, the second color filter area 342, and the third color filter area 343 may each further include a scatterer, but embodiments are not limited thereto.

In some embodiments, the light-emitting device may emit first light, the first color filter area 341 may absorb the first light to emit a 1-1 color light, the second color filter area 342 may absorb the first light to emit a 2-1 color light, and the third color filter area 343 may absorb the first light to emit a 3-1 color light. In this embodiment, the 1-1 color light, the 2-1 color light, and the 3-1 color light may each have a different maximum emission wavelength. In some embodiments, the first light may be blue light, the 1-1 color light may be red light, the 2-1 color light may be green light, and the 3-1 color light may be blue light, but embodiments are not limited thereto.

The emission apparatus may further include a thin-film transistor, in addition to the light-emitting device. The thin-film transistor may include a source electrode, a drain electrode, and an activation layer, wherein one of the source electrode and the drain electrode may be electrically connected to one of the first electrode and the second electrode of the light-emitting device.

The thin-film transistor may further include a gate electrode, a gate insulating film, or the like. The activation layer may include a crystalline silicon, an amorphous silicon, an organic semiconductor, and an oxide semiconductor, but embodiments are not limited thereto.

The emission apparatus may further include a sealing portion configured to seal the light-emitting device. The sealing portion may be disposed between the color filter and the light-emitting device. The sealing part may allow an image from the light-emitting device to be realized and may block air from the outside and moisture from penetrating into the light-emitting device. The sealing portion may be a sealing substrate including a transparent glass or a plastic substrate. The sealing portion may be a thin film encapsulating layer including a plurality of organic layers and/or a plurality of inorganic layers. When the sealing portion is a thin film encapsulating layer, the emission apparatus as a whole may be flexible.

The emission apparatus may be used in various displays, light sources, or the like.

Embodiments include an authentication apparatus as described herein.

The authentication apparatus may be, for example, a biometric authentication apparatus that identifies an individual according to biometric information (e.g., a fingertip, a pupil, or the like). The authentication apparatus may further include a biometric information collecting unit, in addition to the light-emitting device described above.

Embodiments include an electronic apparatus as described herein. The electronic apparatus may be applicable to a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiogramarder, an ultrasonic diagnosis device, an endoscope display device), a fish finder, various measurement devices, gauges (e.g., gauges of an automobile, an airplane, a ship), a projector, but embodiments are not limited thereto.

Embodiments include a manufacturing method as described herein. Each layer included in the emission units and each layer included in the charge-generating units may be formed in a certain region by using one or more suitable methods selected from vacuum deposition, spin coating, casting, Langmuir-blodgett (LB) deposition, ink-jet printing, laser-printing, and laser-induced thermal imaging.

When each layer included in the emission units and each layer included in the charge-generating units are formed by vacuum deposition, the vacuum deposition may be performed at a deposition temperature in a range of about 100° C. to about 500° C., at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

When each layer included in the emission units and each layer included in the charge-generating units are formed by spin coating, the spin coating may be performed at a coating rate of about 2,000 revolutions per minute (rpm) to about 5,000 rpm and at a heat treatment temperature of about 80° C. to about 200° C., depending on the material to be included in each layer and the structure of each layer to be formed.

General definitions of substituents may include terms described herein.

The term "$C_1$-$C_{60}$ alkyl group" as used herein refers to a linear or branched aliphatic hydrocarbon monovalent group having 1 to 60 carbon atoms. Examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group including at least one heteroatom selected from N, O, Si, P, and S as a ring-forming atom and 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group including at least one heteroatom selected from N, O, Si, P, and S as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 6 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system having at least one heteroatom selected from N, O, Si, P, and S as a ring-forming atom and 1 to 60 carbon atoms. The term "$C_1$-$C_{60}$ heteroarylene group" as used herein refers to a divalent group having a heterocyclic aromatic system having at least one heteroatom selected from N, O, Si, P, and S as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include two or more rings, the respective rings may be fused.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group).

The term "$C_1$-$C_{60}$ heteroaryloxy group" as used herein indicates –$OA_{104}$ (wherein $A_{104}$ is a $C_1$-$C_{60}$ heteroaryl group). The term "$C_1$-$C_{60}$ heteroarylthio group" as used herein indicates —$SA_{105}$ (wherein $A_{tos}$ is a $C_1$-$C_{60}$ heteroaryl group).

The term "monovalent non-aromatic condensed polycyclic group" as used herein refers to a monovalent group that has two or more rings condensed and only carbon atoms as ring forming atoms (e.g., 8 to 60 carbon atoms), wherein the entire molecular structure is non-aromatic. Examples of the monovalent non-aromatic condensed polycyclic group may include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom selected from N, O, Si, P, and S, in addition to carbon atoms (e.g., 1 to 60 carbon atoms), as a ring-forming atom, wherein the entire molecular structure is non-aromatic. Examples of the monovalent non-aromatic condensed heteropolycyclic group may include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{60}$ carbocyclic group" as used herein refers to a monocyclic or polycyclic group having 5 to 60 carbon atoms only as ring-forming atoms. The $C_5$-$C_{60}$ carbocyclic group may be an aromatic carbocyclic group or a non-aromatic carbocyclic group. The term "$C_5$-$C_{60}$ carbocyclic group" as used herein refers to a ring (e.g., a benzene group), a monovalent group (e.g., a phenyl group), or a divalent group (e.g., a phenylene group). Also, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having substantially the same structure as the $C_5$-$C_{60}$ carbocyclic group, except that at least one heteroatom selected from N, O, Si, P, and S is used as a ring-forming atom, in addition to carbon atoms (e.g., 1 to 60 carbon atoms).

In the present specification, at least one substituent of the substituted $C_5$-$C_{60}$ carbocyclic group, the substituted $C_1$-$C_{60}$ heterocyclic group, the substituted $C_1$-$C_{20}$ alkylene group, the substituted $C_2$-$C_{20}$ alkenylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be selected from:

deuterium (—D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

The term "Ph" as used herein refers to a phenyl group. The term "Me" as used herein refers to a methyl group. The term "Et" as used herein refers to an ethyl group. The term "tert-Bu" or "But" as used herein refers to a tert-butyl group. The term "OMe" as used herein refers to a methoxy group.

The term "biphenyl group" as used herein refers to a phenyl group substituted with a phenyl group. The "biphenyl group" may be a substituted phenyl group having a $C_6$-$C_{60}$ aryl group as a substituent.

The term "terphenyl group" as used herein refers to a phenyl group substituted with a biphenyl group. The "terphenyl group" may be a substituted phenyl group having a $C_6$-$C_{60}$ aryl group substituted with a $C_6$-$C_{60}$ aryl group as a substituent.

The symbols * and *' as used herein, unless defined otherwise, refer to a binding site to an adjacent atom in a corresponding formula.

Hereinafter, a light-emitting device according to one or more embodiments will be described in more detail with reference to Examples.

EXAMPLES

Example 1

A 15 Ohms per square centimeter ($\Omega/cm^2$) (1,200 Å) ITO/Ag/ITO glass substrate (available from Corning Co., Ltd) was cut to a size of 50 millimeters (mm)×50 mm×0.7 mm, sonicated in isopropyl alcohol and pure water for 5 minutes in each solvent, cleaned with ultraviolet rays for 30 minutes, and then ozone, and was mounted on a vacuum deposition apparatus.

HT3 was deposited on the ITO/Ag/ITO anode of the glass substrate to a thickness of 1.7 nm, HT3 and CuI were co-deposited thereon at a volume ratio of 97:3 to form a hole injection layer to a thickness of 8 nm, HT3 was deposited on the hole injection layer to form a first hole transport layer to a thickness of 24 nm, TCTA was deposited on the first hole transport layer to form a second hole transport layer to a thickness of 5 nm, H18 and FD23 were co-deposited at a volume ratio of 98:2 on the second hole transport layer to form an emission layer to a thickness of 17 nm, T2T was deposited on the emission layer to form a first electron transport layer to a thickness of 5 nm, and TPM-TAZ and LiQ were co-deposited at a volume ratio of 1:1 on the first electron transport layer to form a second electron transport layer to a thickness of 25 nm, thereby forming a first emission unit.

Compound N1 and Li were co-deposited on the first emission unit at a volume ratio of 99:1 to form an n-type charge generating layer to a thickness of 5 nm, and HT3 and Bi$_2$Te$_3$ were co-deposited on the n-type charge generating layer at a volume ratio of 90:10 to form a p-type charge generating layer to a thickness of 5 nm. HT3 and CuI were co-deposited on the p-type charge generating layer to a volume ratio of 90:10 to form a p-type hole injection layer to a thickness of 10 nm, thereby forming a first charge generating unit.

HT3 was deposited on the first charge generating unit to form a first hole transport layer to a thickness of 54 nm, TCTA was deposited on the first hole transport layer to form a second hole transport layer to a thickness of 5 nm, H18 and FD23 were co-deposited at a volume ratio of 98:2 on the second hole transport layer to form an emission layer to a thickness of 17 nm, T2T was deposited on the emission layer to form a first electron transport layer to a thickness of 5 nm, and TPM-TAZ and LiQ were co-deposited at a volume ratio of 1:1 on the first electron transport layer to form a second electron transport layer to a thickness of 25 nm, thereby forming a second emission unit.

Compound N1 and Li were co-deposited on the second emission unit at a volume ratio of 99:1 to form an n-type charge generating layer to a thickness of 5 nm, and HT3 and Bi$_2$Te$_3$ were co-deposited on the n-type charge generating layer at a volume ratio of 90:10 to form a p-type charge generating layer to a thickness of 5 nm. HT3 and CuI were co-deposited on the p-type charge generating layer to a volume ratio of 90:10 to form a p-type hole injection layer to a thickness of 10 nm, thereby forming a second charge generating unit.

HT3 was deposited on the second charge generating unit to form a first hole transport layer to a thickness of 44.5 nm, TCTA was deposited on the first hole transport layer to form a second hole transport layer to a thickness of 5 nm, H18 and FD23 were co-deposited at a volume ratio of 98:2 on the second hole transport layer to form an emission layer to a thickness of 17 nm, T2T was deposited on the emission layer to form a first electron transport layer to a thickness of 5 nm, TPM-TAZ and LiQ were co-deposited at a volume ratio of 1:1 on the first electron transport layer to form a second electron transport layer to a thickness of 35 nm, KI and Yb were co-deposited on the second electron transport layer at a volume ratio of 95:5 to form an electron injection layer to a thickness of 1.1 nm, thereby forming a third emission unit.

Ag and Mg were co-deposited on the third emission unit to a volume ratio of 9:1 to form a cathode to a thickness of 12 nm, thereby completing the manufacture of a tandem light-emitting device.

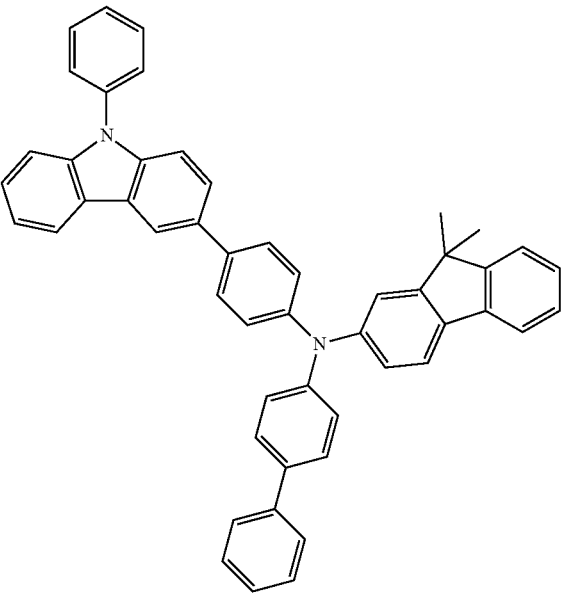

HT3

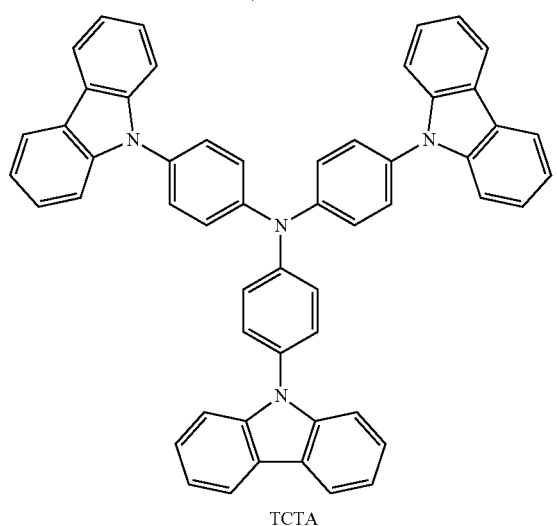

TCTA

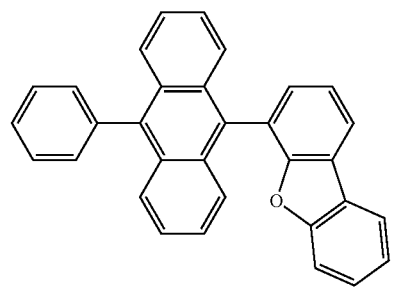

H18

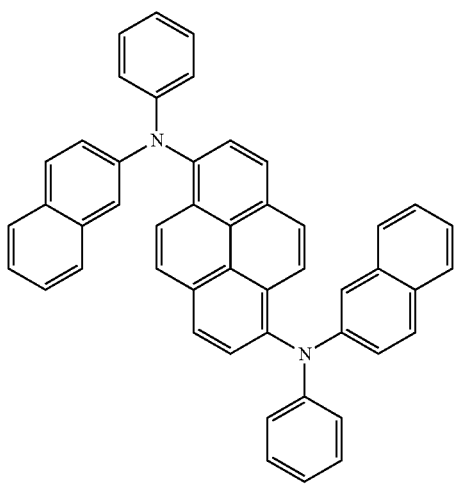

FD23

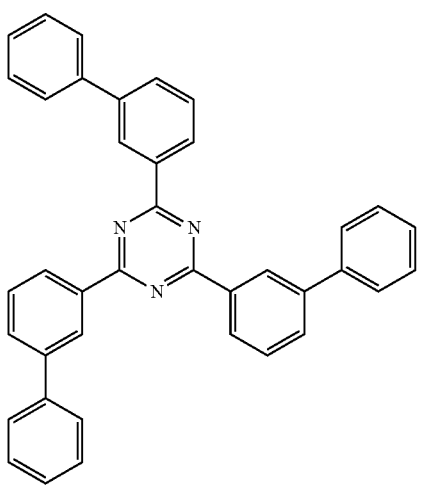

T2T

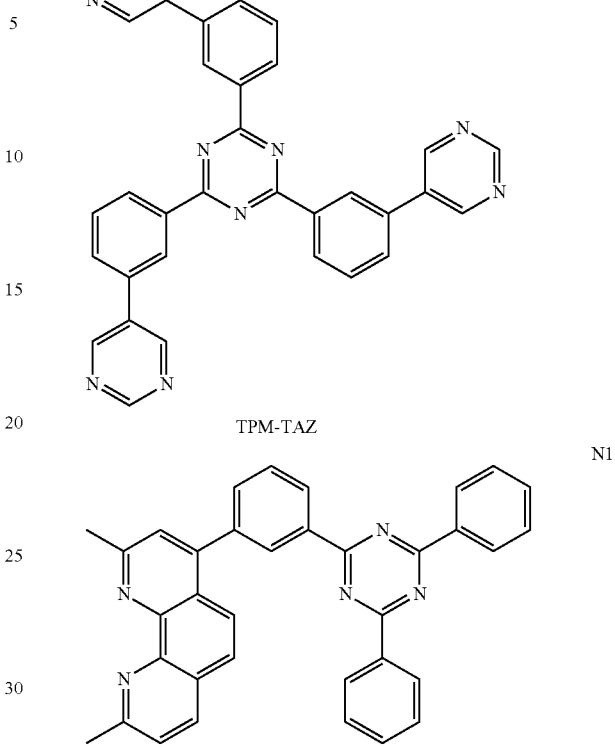

TPM-TAZ

N1

Examples 2 to 5 and Comparative Examples 1 TO 7

Light-emitting device were manufactured in substantially the same manner as in Example 1, except that materials illustrated in Tables 1A and 1B were used.

Evaluation Example may include various features described herein.

The driving voltage, driving voltage change, efficiency, lifespan, and CIE color-coordinate of the light-emitting devices manufactured in Examples 1 to 5 and Comparative Examples 1 to 7 were measured using Keithley source-measure unit (SMU) 236 and a luminance meter PR650. The results thereof are illustrated in Tables 1A and 1B. The lifespan ($T_{97}$) refers to a period of time required for the initial luminance (100%) of 400 nit of the light-emitting device to reduce by 97%. The driving voltage change refers to the difference between the initial driving voltage and the driving voltage measured 500 hours after the driving of the light-emitting device.

TABLE 1A

| | HOLE INJECTION LAYER | CHARGE-GENERATING UNIT PHIL | | | n-TYPE ELECTRON INJECTION LAYER |
|---|---|---|---|---|---|
| | | pHIL | PCGL | nCGL | |
| EXAMPLE 1 | HT3 + CuI | HT3 + CuI | HT3 + $Bi_2Te_3$ | N1 + Li | KI + Yb |
| EXAMPLE 2 | HT3 + CuI | HT3 + CuI | HT3 + $BiI_3$ | N1 + Li | KI + Yb |
| EXAMPLE 3 | HT3 + CuI | HT3 + CuI | HT3 + Bi | N1 + Li | KI + Yb |
| EXAMPLE 4 | HT3 + CuI | HT3 + CuI | HT3 + $Bi_2Te_3$ | N1 + Yb | KI + Yb |
| EXAMPLE 5 | HT3 + CuI | HT3 + ZnTe | HT3 + $Bi_2Te_3$ | N1 + Li | KI + Yb |
| COMPARATIVE EXAMPLE 1 | — | HT3 + CuI | HT3 + $Bi_2Te_3$ | N1 + Li | KI + Yb |

TABLE 1A-continued

| | HOLE INJECTION LAYER | CHARGE-GENERATING UNIT PHIL | | | n-TYPE ELECTRON INJECTION LAYER |
|---|---|---|---|---|---|
| | | pHIL | PCGL | nCGL | |
| COMPARATIVE EXAMPLE 2 | m-TDATA + BiF3 (40%) | HT3 + CuI | HT3 + $Bi_2Te_3$ | N1 + Li | — |
| COMPARATIVE EXAMPLE 3 | HT3 + CuI | HT3 + CuI | HT3 + $Bi_2Te_3$ | N1 + Li | — |
| COMPARATIVE EXAMPLE 4 | HT3 + CuI | HT3 + CuI | HT3 + $Bi_2Te_3$ | Bphen + Li (2%) | KI + Yb |
| COMPARATIVE EXAMPLE 5 | HT3 + CuI | HT3 + CuI | HT3 + $Bi_2Te_3$ | COMPOUND A + $BiI_3$ (1:1) | KI + Yb |
| COMPARATIVE EXAMPLE 6 | HT3 + CuI | — | HT3 + $Bi_2Te_3$ | N1 + Li | KI + Yb |
| COMPARATIVE EXAMPLE 7 | HT3 + CuI | m-TDATA + BiF3 (40%) | HT3 + $Bi_2Te_3$ | N1 + Li | KI + Yb |

TABLE 1B

| | DRIVING VOLTAGE (V) | DRIVING VOLTAGE CHANGE @T97 (V) | EFFICIENCY (cd/A) | LIFESPAN @T97 (HOURS) | COLOR-COORDINATE (B y) |
|---|---|---|---|---|---|
| EXAMPLE 1 | 10 | 0.5 | 28.7 | 870 | 0.13 |
| EXAMPLE 2 | 10.2 | 1 | 27.5 | 770 | 0.123 |
| EXAMPLE 3 | 10.1 | 0.8 | 28.2 | 830 | 0.133 |
| EXAMPLE 4 | 10.2 | 0.7 | 28.4 | 810 | 0.128 |
| EXAMPLE 5 | 10.5 | 1.2 | 27.7 | 750 | 0.122 |
| COMPARATIVE EXAMPLE 1 | 12.2 | 4.2 | 25 | 250 | 0.126 |
| COMPARATIVE EXAMPLE 2 | 12.6 | 5.1 | 17 | 10 | 0.112 |
| COMPARATIVE EXAMPLE 3 | 10.8 | 1.2 | 26 | 640 | 0.134 |
| COMPARATIVE EXAMPLE 4 | 10.3 | 1.5 | 25.6 | 450 | 0.122 |
| COMPARATIVE EXAMPLE 5 | | | DEVICE NOT OPERATIVE | | |
| COMPARATIVE EXAMPLE 6 | 15.3 | 5.6 | 11 | 5 | 0.127 |
| COMPARATIVE EXAMPLE 7 | 14.8 | 6.1 | 12.1 | 7 | 0.133 |

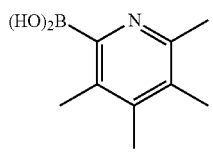

Compound A

As illustrated in Tables 1A and 1B, the light-emitting devices of Examples 1 to 5 were found to have low driving voltage increases, improved efficiency and lifespan, and in particular, improved lifespan, as compared with the light-emitting devices of Comparative Examples 1 to 7.

As apparent from the foregoing description, in the light-emitting device, a charge generating unit may have a structure including an n-type charge generating layer, and a p-type charge generating layer, and a p-type hole injection layer, balance of holes and electrons are improved, thus realizing a low driving voltage and excellent efficiency and lifespan characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light-emitting device comprising:
   a first electrode;
   a second electrode facing the first electrode; and
   an organic layer between the first electrode and the second electrode,
   wherein the organic layer includes a first emission layer, a second emission layer, and a charge generating unit between the first emission layer and the second emission layer,
   the charge generating unit includes an n-type charge generating layer, a p-type charge generating layer, and a p-type hole injection layer,
   wherein the n-type charge generating layer includes an n-type organic compound and a metal material,
   the n-type organic compound includes a phenanthrene-based compound, a phosphine oxide-based compound and/or a phenanthroline-based compound, the metal material includes at least one metal selected from an alkali metal, an alloy of an alkali metal, an alkaline earth metal, an alloy of an alkaline earth metal, a lanthanide metal, and an alloy of a lanthanide metal, the p-type charge generating layer and the p-type hole injection layer each independently include an inorganic semiconductor material, the inorganic semiconductor material included in the p-type charge generating layer and the inorganic semiconductor material included in the p-type hole injection layer each independently include a halide of a transition metal, a halide of a post-transition metal, bismuth, tellurium, a halide of bismuth, a sulfide of bismuth, a selenide of bismuth, a telluride of bismuth, a telluride of a transition metal, a telluride of a post-transition metal, a sulfide of a transition metal, a sulfide of a post-transition metal, a selenide of a transition metal, a selenide of a post-transition metal, or any combination thereof, and the inorganic semiconductor material included in the p-type charge generating layer is substantially identical to or different from the inorganic semiconductor material included in the p-type hole injection layer.

2. The light-emitting device of claim 1, wherein the metal material included in the n-type charge generating layer has at least one component selected from lithium (Li), sodium (Na), a Bi—Li alloy, a Bi—Na alloy, ytterbium (Yb), samarium (Sm), europium (Eu), terbium (Tb), holmium (Ho), and dysprosium (Dy).

3. The light-emitting device of claim 1, wherein a binding energy between the n-type organic compound and the metal material included in the n-type charge generating layer is 1.25 electron volts (eV) or higher.

4. The light-emitting device of claim 1, wherein a volume ratio of the n-type organic compound to the metal material included in the n-type charge generating layer is in a range of about 99.9:0.1 to about 80:20.

5. The light-emitting device of claim 1, wherein the p-type charge generating layer and the p-type hole injection layer each independently further include a hole transporting organic compound.

6. The light-emitting device of claim 5, wherein the hole transporting organic compound included in the p-type charge generating layer and the hole transporting organic compound included in the p-type hole injection layer each independently have at least one selected from a compound represented by Formula 201 and a compound represented by Formula 202:

Formula 201

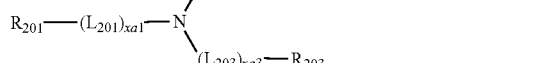

Formula 202

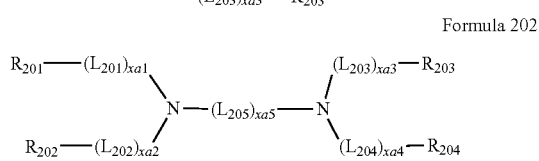

wherein, in Formulae 201 and 202, $L_{201}$ to $L_{204}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ is selected from *—O—*', *—S—*',*—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 are each independently an integer from 0 to 3, xa5 is an integer from 1 to 10, and $R_{201}$ to $R_{204}$ and $Q_{201}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

7. The light-emitting device of claim 5, wherein a volume ratio of the hole transporting organic compound to the inorganic semiconductor material in the p-type charge generating layer and a volume ratio of the hole transporting organic compound to the inorganic semiconductor material in the p-type hole injection layer are each independently in a range of about 99.9:0.1 to about 80:20.

8. The light-emitting device of claim 1, wherein the organic layer further includes a hole transport region and an electron transport region, and the electron transport region includes an inorganic insulating material.

9. The light-emitting device of claim 8, wherein the electron transport region includes an n-type electron injection layer, and the n-type electron injection layer includes the inorganic insulating material.

10. The light-emitting device of claim 9, wherein the n-type electron injection layer is in direct contact with the second electrode.

11. The light-emitting device of claim 8, wherein the inorganic insulating material includes a halide of an alkali metal, a halide of an alkaline earth metal, a halide of a lanthanide metal, or any combination thereof.

12. The light-emitting device of claim 9, wherein the n-type electron injection layer consists of the inorganic insulating material.

13. The light-emitting device of claim 9, wherein the n-type electron injection layer further includes a metal dopant, and the metal dopant includes at least one selected from an alkali metal, an alloy of an alkali metal, an alkaline earth metal, an alloy of an alkaline earth metal, a lanthanide metal, and an alloy of a lanthanide metal.

14. The light-emitting device of claim 13, wherein the metal dopant is selected from ytterbium (Yb), samarium (Sm), lithium (Li), and magnesium (Mg).

15. The light-emitting device of claim 13, wherein a volume ratio of the inorganic insulating material to the metal dopant is in a range of about 100:0 to about 70:30.

16. An apparatus comprising:
a thin-film transistor including a source electrode, a drain electrode, and an active layer; and a light-emitting device according to claim 1,
wherein the first electrode of the light-emitting device is electrically connected to one of the source electrode and the drain electrode of the thin-film transistor.

17. The apparatus of claim 16, further comprising:
a color filter, wherein the color filter is on a pathway of light emitted from the light-emitting device.

* * * * *